United States Patent
Hung et al.

(10) Patent No.: US 12,272,612 B2
(45) Date of Patent: Apr. 8, 2025

(54) SEMICONDUCTOR PACKAGE MODULE AND MANUFACTURING METHODS THEREOF

(71) Applicant: Taiwan Semiconductor Manufacturing Company, Ltd., Hsinchu (TW)

(72) Inventors: Wensen Hung, Hsinchu County (TW); Tsung-Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 289 days.

(21) Appl. No.: 17/697,959

(22) Filed: Mar. 18, 2022

(65) Prior Publication Data

US 2023/0071418 A1 Mar. 9, 2023

Related U.S. Application Data

(60) Provisional application No. 63/242,048, filed on Sep. 9, 2021.

(51) Int. Cl.
| | |
|---|---|
| *H01L 23/367* | (2006.01) |
| *H01L 23/29* | (2006.01) |
| *H01L 23/528* | (2006.01) |
| *H01L 23/00* | (2006.01) |
| *H01L 25/065* | (2023.01) |

(52) U.S. Cl.
CPC ............ *H01L 23/367* (2013.01); *H01L 23/29* (2013.01); *H01L 23/528* (2013.01); *H01L 24/19* (2013.01); *H01L 25/0652* (2013.01)

(58) Field of Classification Search
CPC ..... H01L 23/367; H01L 23/29; H01L 23/528; H01L 23/3135; H01L 25/0652; H01L 23/3672; H01L 23/427; H01L 23/562; H01L 25/18; H01L 23/44; H01L 21/4871; H01L 23/5384; H01L 24/19
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,613,931 B2 * | 4/2017 | Lin | H01L 25/0652 |
| 9,666,502 B2 | 5/2017 | Chen et al. | |
| 9,735,131 B2 | 8/2017 | Su et al. | |
| 2018/0269188 A1 * | 9/2018 | Yu | H01L 23/3128 |
| 2021/0102294 A1 * | 4/2021 | Miljkovic | C23C 14/5853 |

* cited by examiner

*Primary Examiner* — Patricia D Valenzuela
(74) *Attorney, Agent, or Firm* — JCIPRNET

(57) ABSTRACT

A semiconductor package module includes a package, a conductive layer, and a heat dissipating module. The package includes a semiconductor die. The conductive layer is disposed over the package. The heat dissipating module is disposed over the conductive layer, and the package and the heat dissipating module prop against two opposite sides of the conductive layer, where the heat dissipating module is thermally coupled to and electrically isolated from the package through the conductive layer.

20 Claims, 61 Drawing Sheets

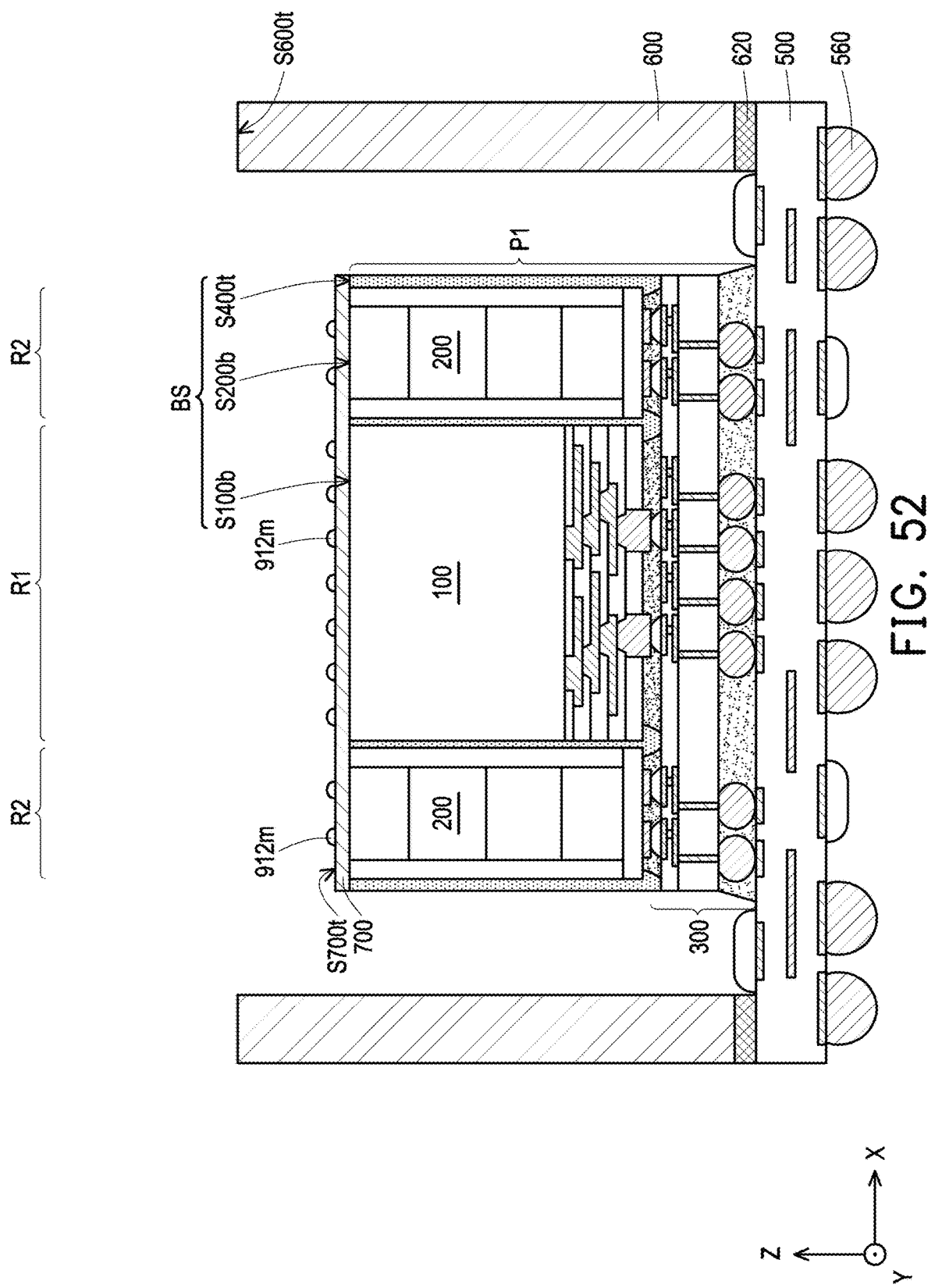

SEMICONDUCTOR PACKAGE MODULE AND MANUFACTURING METHODS THEREOF

CROSS-REFERENCE TO RELATED APPLICATION

This application claims the priority benefit of U.S. provisional application Ser. No. 63/242,048, filed on Sep. 9, 2021. The entirety of the above-mentioned patent application is hereby incorporated by reference herein and made a part of this specification.

BACKGROUND

As the need for electronic devices to process larger amount of data at high speed grows, significant challenges are posed in design and packaging of these devices. In particular, power consumption of those electronic devices with high computational ability is immense, and the electrical power provided to these electronic devices may turn into a great amount of thermal energy. In order to prevent malfunction of the electronic devices resulted from overheating, an effective manner for dissipating heat from these electronic devices is important in the industry.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 51 through FIG. 52 are schematic cross-sectional views showing a method of manufacturing a semiconductor package module in accordance with some embodiments of the disclosure.

DETAILED DESCRIPTION

Figure 2:
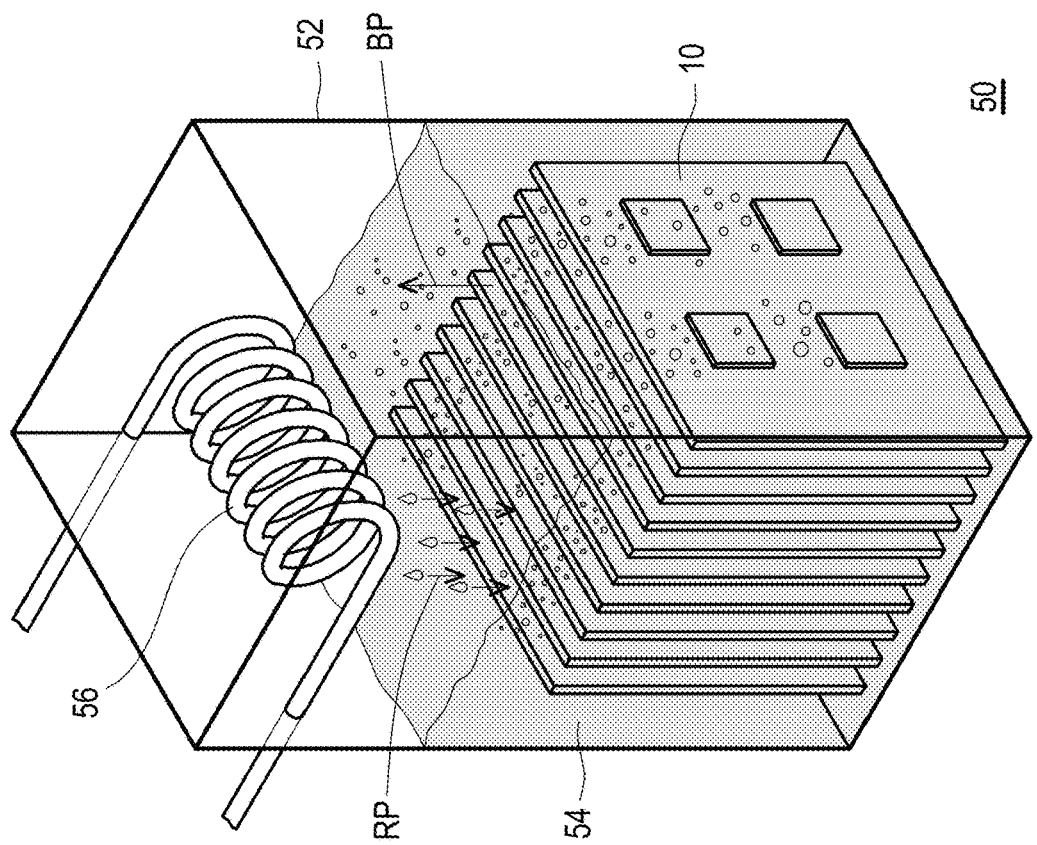
FIG. 2 is a schematic three-dimensional side-view illustrating a plurality of electronic systems being placed in an immersion cooling apparatus in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

It should be appreciated that the following embodiment(s) of the disclosure provides applicable concepts that can be embodied in a wide variety of specific contexts. The specific embodiment(s) discussed herein is merely illustrative and is related to a semiconductor package module including a semiconductor package and a heat dissipating element (or structure) disposed thereon for efficient heat dissipation, and is not intended to limit the scope of the disclosure. In accordance with some embodiments, the heat dissipating element (or structure) is disposed on a non-active side of the semiconductor package, where the heat dissipating element (or structure) is thermally coupled to the semiconductor package to facilitate heat dissipating during the operation of the semiconductor package, thereby improving the performance of the semiconductor package and thus ensuring the reliability of the semiconductor package module. In the case, the heat dissipating element (or structure) may include a microstructure in form of a column with a cross-section in a top view having circle or ellipse-like shape, a planar or curved wall-like shape, a semi-annulus-like shape, a fin-like shape, or combinations thereof; a microstructure having a plurality of above microstructures stacked together; a microstructure having a stacking structure with a plurality of branches; a three-dimensional (3D) structure with a plurality of trenches/openings vertically and/or horizontally therethrough; or combinations thereof. In addition, a configuration (such as a placing arrangement, a pattern density, a pitch, a material, a vertical size (e.g. a height or a thickness), a horizontal size (e.g. a width or a diameter), or combinations thereof) to the heat dissipating element (or structure) is adjustable to control the heat dissipating ability of the heat dissipating element (or structure) for further improving the performance of the semiconductor package and thus further ensuring the reliability of the semiconductor package module. In accordance with some alternative embodiments, an additional coating layer, e.g., a boiling enhancement coating (BEC) layer and/or a surface treatment layer, is disposed on a surface of the heat dissipating element (or structure) to facilitate heat dissipating.

Figure 1:
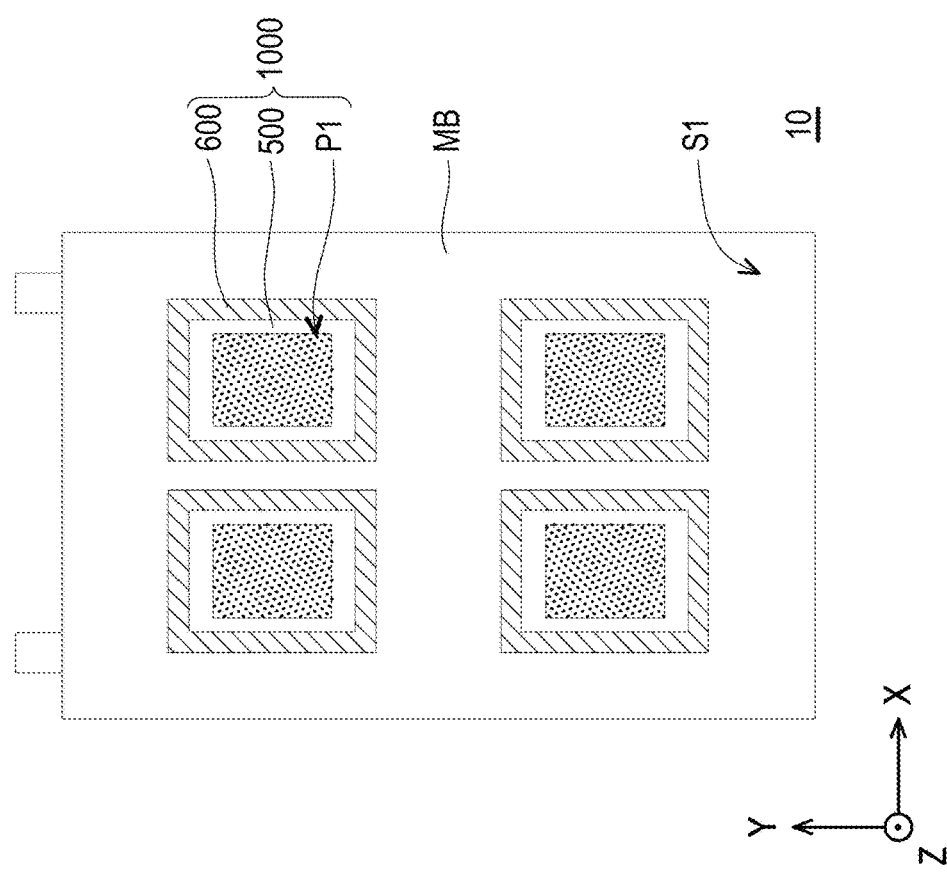
FIG. 1 is a schematic plane view illustrating an electronic system in accordance with some embodiments of the disclosure.
Figure 3:
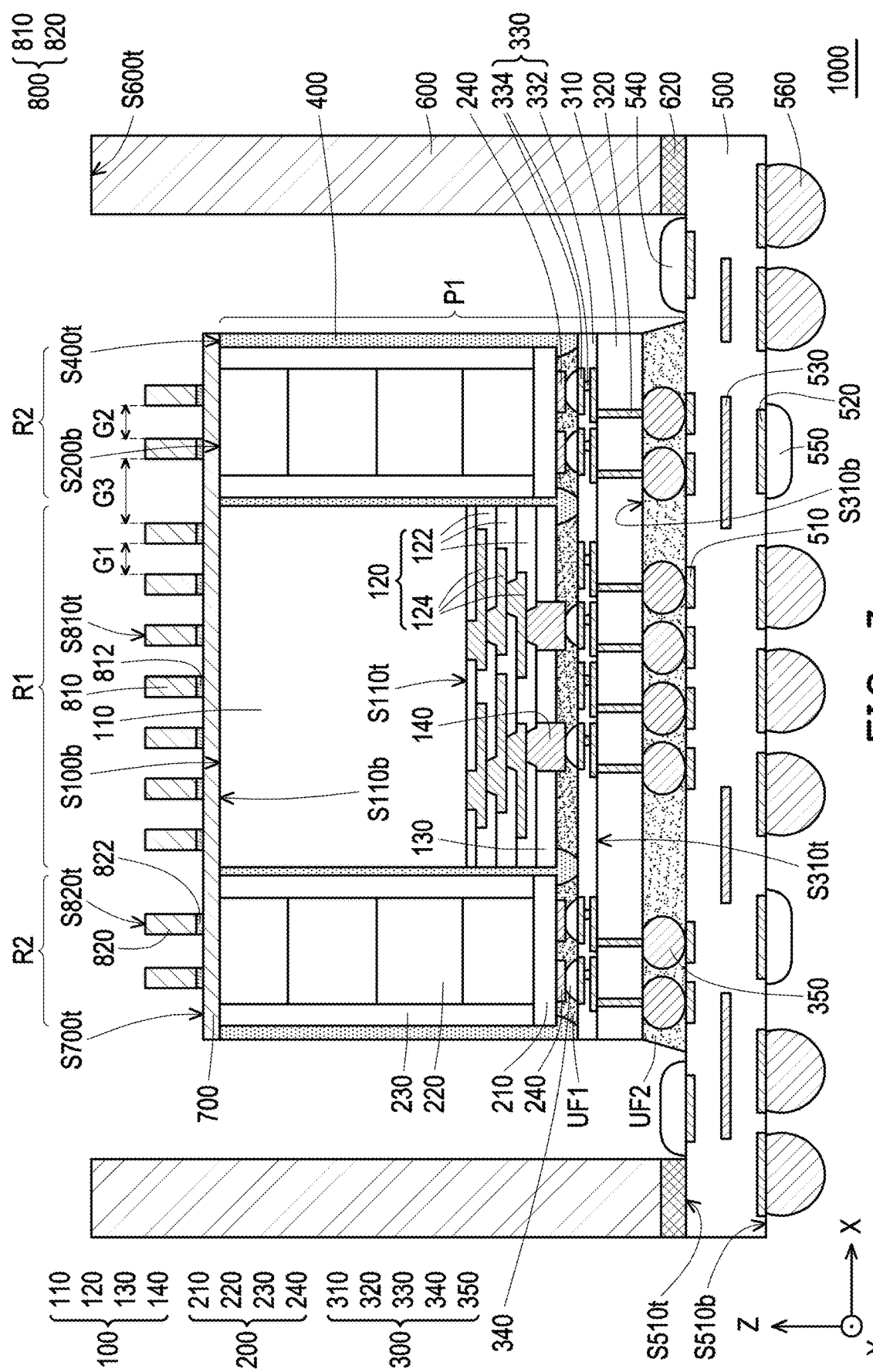
FIG. 3 is a schematic cross-sectional view illustrating a semiconductor package module mounted on an electronic system in accordance with some embodiments of the disclosure.

FIG. 1 is a schematic plane view illustrating an electronic system 10 in accordance with some embodiments of the disclosure. FIG. 2 is a schematic three-dimensional side-view illustrating a plurality of the electronic systems 10 depicted in FIG. 1 being placed in an immersion cooling apparatus 50 in accordance with some embodiments of the disclosure. FIG. 3 is a schematic cross-sectional view illustrating the semiconductor package module 1000 depicted in FIG. 1 mounted on the electronic system depicted in FIG. 1 in accordance with some embodiments of the disclosure. FIG. 4 through FIG. 7 are schematic cross-sectional views showing a method of manufacturing the semiconductor package module 1000 depicted in FIG. 3. FIG. 8A is a schematic plane view illustrating a relative position of a semiconductor die (e.g. 100 and 200 in FIG. 3) and a thermal dissipating element (e.g. 810 and 820 in FIG. 3) in the semiconductor package module 1000 in accordance with some embodiments of the disclosure, where FIG. 3 through FIG. 7 are the schematic cross-sectional views taken alone a cross-sectional line A-A depicted in FIG. 8A. In addition, FIG. 8B through FIG. 8D are schematic plane views illustrating various relative positions of a semiconductor die (e.g. 100 and 200 in FIG. 3) and a thermal dissipating element (e.g. 810 and 820 in FIG. 3) in the semiconductor package module 1000 in accordance with some alternative embodiments of the disclosure. In FIG. 8A through FIG. 8D, certain structural features shown in the respective cross-section view of FIG. 3 are omitted for easy illustration. In the disclosure, it should be appreciated that the illustration of components throughout all figures is schematic and is not in scale.

Referring to FIG. 1, in some embodiments, the electronic system 10 includes a printed circuit board MB and one or more than one semiconductor package module 1000. The one or more than one semiconductor package module 1000 may include a plurality of semiconductor package modules 1000, as shown in FIG. 1. For example, these semiconductor package modules 1000 are attached to and electrically coupled to the printed circuit board MB. In the case, the semiconductor package modules 1000 are electrically coupled to and electrically communicated to each other through the printed circuit board MB. Although not shown, the printed circuit board MB may be further attached with and electrically coupled with other electronic component(s) which may or may not electrically coupled to at least some of the semiconductor package modules 1000. In some embodiments, the electronic system 10 is a data server. In these embodiments, each semiconductor package module 1000 in the electronic system 10 may include a processing die and one or more memory device(s).

Further, a number of the semiconductor package modules 1000 included in the electronic system 10 can be varied. Although only four semiconductor package modules 1000 are shown in the electronic system 10 in FIG. 1 for illustrative purposes, the number of the semiconductor package modules 1000 included in one electronic system 10 can be less than or more than four; the disclosure is not limited thereto. The number of the semiconductor package modules 1000 included in one electronic system 10 can be selected and designated, based on the demand and design requirements.

In some alternative embodiments, an additional printed circuit board (not shown) may be adopted and interposed between one semiconductor package module 1000 and the printed circuit board MB for providing further routing function. In the case, the additional printed circuit board is electrically coupled to and electrically communicates the semiconductor package module 1000 and the printed circuit board MB. In the plane view of FIG. 1, an occupying area of the additional printed circuit board may be less than or substantially equal to an occupying area of the printed circuit board MB, and may be greater than or substantially equal to an occupying area of the semiconductor package module 1000.

Referring to FIG. 1 and FIG. 2 together, in some embodiments, the immersion cooling apparatus 50 includes a tank 52, a dielectric coolant 54 and a condenser 56, where multiple electronic systems 10 are accommodated in the tank 52 and immersed in the dielectric coolant 54. Although not shown, the electronic systems 10 may be respectively inserted into a slot at a bottom surface of the tank 52, such that the electronic systems 10 may stand in parallel with one another in the tank 52. In some embodiments, the tank 52 is filled with the dielectric coolant 54. The electronic systems 10 may be submerged in a bath of the dielectric coolant 54, and thermal energy generated by the electronic systems 10 can be dissipated through the dielectric coolant 54. Since the dielectric coolant 54 is not electrically conductive, shorting between the electronic systems 10 may be avoided.

In some embodiments, the immersion cooling apparatus 50 is a two-phase immersion cooling apparatus. In these embodiments, the dielectric coolant 54 (e.g., a dielectric cooling liquid) is selected as having a low boiling point (e.g., about 50° C.), and the dielectric coolant 54 boils on surfaces of heat generating components (e.g. the semiconductor package modules 1000, the printed circuit board MB, etc.) by which a liquid phase turns into a gas phase (e.g. vapors). The rising vapors (e.g. indicated by a bubble path BP in FIG. 2) transfer heat out of the dielectric coolant 54, thus heat can be removed from the electronic systems 10. In some embodiments, the condenser 56 (e.g., a coil condenser) is disposed over the bath of the dielectric coolant 54 inside the tank 52, and the vapors (e.g. the gas phase of the dielectric coolant 54) are cooled at the condenser 56, then returns to the bath of the dielectric coolant 54 (by which the gas phase returns into the liquid phase (e.g. indicated by an return path RP in FIG. 2)).

In alternative embodiments, the immersion cooling apparatus 50 is a single-phase immersion cooling apparatus. In these alternative embodiments, the dielectric coolant 54 (e.g., a dielectric cooling liquid) may have a higher boiling point or have a very low temperature (e.g., below zero degree Celsius, such as about −60° C. to about −70° C. or lower), and may not undergo a low temperature vaporization process at the surfaces of the heat generating components. Further, the condenser 56 may be omitted, and the dielectric coolant 54 may be directed to a heat exchanging unit (not shown) outside the tank 52. The dielectric coolant 54 being heated in the tank 52 may be cooled down at the heat exchanging unit, then circulated back to the tank 52.

However, the electronic systems 10 is not limited to be equipped with the immersion cooling apparatus 50 as described herein. A suitable cooling apparatus for the electronic systems 10 may be adopted, as long as the heat generated from the electronic systems 10 can be effective removed. In addition to external heat dissipation path, a heat dissipation path in each electronic system 10 significantly affects heat dissipation efficiency of the electronic system 10.

Referring to FIG. 1 and FIG. 3 together, in some embodiments, the semiconductor package modules 1000 includes a semiconductor package P1, a circuit substrate 500, a supporting structure 600, a metallization layer 700, and a heat dissipating element 800. For example, the semiconductor package P1 and the supporting structure 600 are mounted to the circuit substrate 500, and the metallization layer 700 is disposed on the semiconductor package P1, where the semiconductor package P1 is disposed between the circuit substrate 500 and the metallization layer 700 and is surrounded by the supporting structure 600. For example, the semiconductor package P1 is in physical contact with the circuit substrate 500 through a plurality of conductive connectors 350 so to be electrically coupled to the circuit substrate 500. The semiconductor package P1 may be further thermally coupled to the circuit substrate 500.

For example, the supporting structure 600 is in physical contact with the circuit substrate 500 through an adhesive 620 so to be coupled to the circuit substrate 500. The supporting structure 600 may be thermally coupled to, electrically coupled to or thermally and electrically coupled to the circuit substrate 500. For example, the metallization layer 700 (may be referred to as a conductive layer) is in physical contact with the semiconductor package P1 so to be thermally coupled to the semiconductor package P1. In some embodiments, the semiconductor package P1 is electrically isolated from the metallization layer 700. In the case, the semiconductor package P1 is further electrically isolated from the supporting structure 600. Owing to the supporting structure 600, the warpage control of the semiconductor package module 1000 is enhanced. In addition, the heat may further be transferred from the circuit substrate 500 to the supporting structure 600 for dissipating.

For example, as shown in FIG. 3, the heat dissipating element 800 is mounted to the metallization layer 700, where the metallization layer 700 is disposed between the heat dissipating element 800 and the semiconductor package P1. In some embodiments, the heat dissipating element 800 is thermally coupled to and electrically isolated from the semiconductor package P1 through the metallization layer 700. Owing to the heat dissipating element 800, the heat dissipation of the semiconductor package module 1000 in the immersion cooling apparatus 50 is enhanced (without shorting). That is, owing to the heat dissipating element 800, a better thermal control for each semiconductor package module 1000 is achieved, such that the performance of the semiconductor package P1 included in each semiconductor package module 1000 is improved, thereby ensuring the reliability of the semiconductor package module 1000.

Illustrated top surfaces of the heat dissipating element 800 (e.g. S810t and S820t) may be lower than an illustrated top surface S600t of the supporting structure 600, as shown in FIG. 3. The disclosure is not limited thereto; alternatively, the illustrated top surfaces of the heat dissipating element 800 may be higher than the illustrated top surface S600t of the supporting structure 600. Or, the illustrated top surfaces of the heat dissipating element 800 may be at a height-level where the illustrated top surface S600t of the supporting structure 600 located at.

The details (e.g. formations, materials, etc.) of the semiconductor package P1, the circuit substrate 500, the supporting structure 600, the metallization layer 700, and the heat dissipating element 800 in FIG. 3 would be further discussed in conjunction with FIG. 4 through FIG. 7 and FIG. 8A through FIG. 8D.

Figure 4:
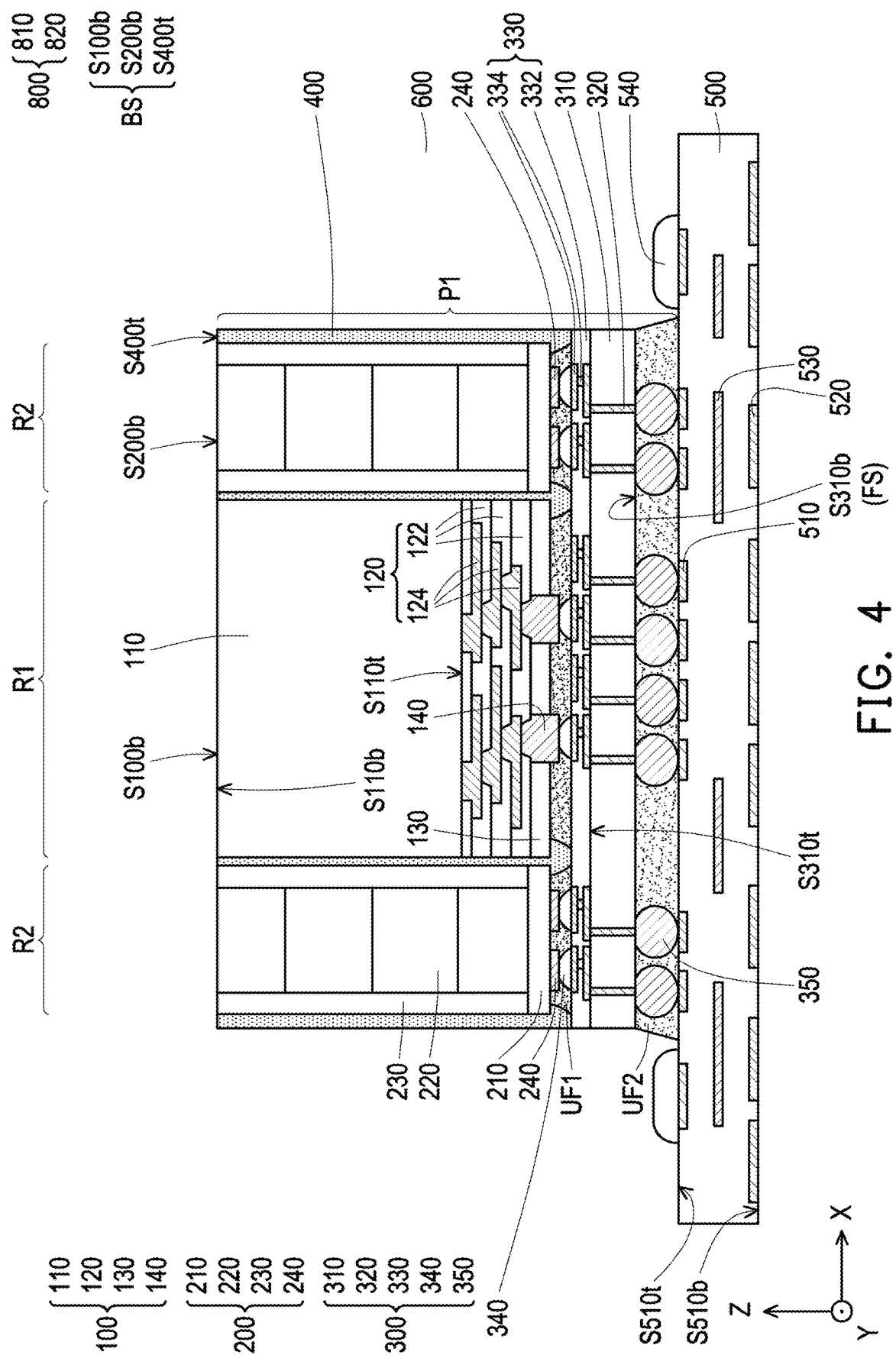
FIG. 4 through FIG. 7 are schematic cross-sectional views showing a method of manufacturing a semiconductor package module in accordance with some embodiments of the disclosure.

Referring to FIG. 4 in conjunction with FIG. 3, in some embodiments, the semiconductor package P1 is provided, where the semiconductor package P1 includes at least one semiconductor die, an interposer 300, and an insulating encapsulation 400. For example, the at least one semiconductor die and the insulating encapsulation 400 are located at a side of the interposer 300. In the case, the at least one semiconductor die may be encapsulated in the insulating encapsulation 400, and a surface of the interposer 300 exposed by the at least one semiconductor die may be covered by the insulating encapsulation 400.

In some embodiments, the at least one semiconductor die includes at least one semiconductor die 100 and at least one semiconductor die 200. For example, only one semiconductor die 100 and four semiconductor dies 200 are depicted in FIG. 8A for illustrative purposes, where the semiconductor dies 200 are grouped into two groups each being arranged in the form of a matrix (such as a N×N array or a N×M array, where N, M>0, N may or may not be equal to M). In the case, each group of the semiconductor dies 200 is disposed in a region R2 arranged next to a region R1 disposed with the semiconductor die 100. For example, each group of the semiconductor dies 200 includes two semiconductor dies 200, where the groups each are arranged into a 1×2 array in the region R2, as shown in FIG. 8A. It is appreciated that only one semiconductor die 100 and two semiconductor dies 200 are shown in FIG. 3 through FIG. 7, as FIG. 3 to FIG. 7 are the cross-sectional views of FIG. 8A along the cross-sectional line A-A.

In some other embodiments of which a plurality of semiconductor dies 100 are included (not shown), the plurality of semiconductor dies 100 are arranged in the form of a matrix, such as a N'×N' array or a N'×M' array (N', M'>0, N' may or may not be equal to M') and/or are grouped into one or more groups. In the case, the plurality of semiconductor dies 100 are disposed in one or more than one region R1.

The disclosure is not limited thereto; alternatively, depending on the demand and design requirement, the number of the semiconductor die 100 may be one or more than one, while the number of the semiconductor dies 200 may be zero, one or more than one. In other words, for a layout of the semiconductor package P1 in the disclosure, a number of the group of the semiconductor die 100 is one or more than one while a number of the group of the semiconductor die 200 is zero, one or more than one. On the other hand, a number of the semiconductor die 100 in one group may be one or more than one, and a number of the semiconductor die 200 in one group (if presented) may be one or more than one, the disclosure is not limited thereto.

As shown in FIG. 4, in some embodiments, the semiconductor die 100 includes a semiconductor substrate 110, an interconnect structure 120 disposed on the semiconductor substrate 110, a passivation layer 130 disposed on the interconnect structure 120, and a plurality of conductive vias 140 penetrating through the passivation layer 130 and disposed on the interconnect structure 120. As shown in FIG. 4, the semiconductor substrate 110 has a frontside surface S110t and a backside surface S110b opposite to the frontside surface S110t, and the interconnect structure 120 is located on the frontside surface S110t of the semiconductor substrate 110, where the interconnect structure 120 is sandwiched between the semiconductor substrate 110 and the passivation layer 130 and sandwiched between the semiconductor substrate 110 and the conductive vias 140, for example.

In some embodiments, the semiconductor substrate 110 is a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components are formed in a front-end-of-line (FEOL) process. In an alternative embodiment, the semiconductor substrate 110 is a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

The semiconductor substrate 110 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used. For example, the semiconductor substrate 110 has an active surface (e.g., the frontside surface S110t), sometimes called a top side, and a non-active surface (e.g., the backside surface S110b), sometimes called a bottom side.

In some embodiments, the interconnect structure 120 includes one or more inter-dielectric layers 122 and one or more patterned conductive layers 124 stacked alternately. For examples, the inter-dielectric layers 122 are silicon oxide layers, silicon nitride layers, silicon oxy-nitride layers, or dielectric layers formed by other suitable dielectric materials, and are formed by deposition or the like. For examples, the patterned conductive layers 124 are patterned copper layers or other suitable patterned metal layers, and are formed by electroplating or deposition. However, the disclosure is not limited thereto. Alternatively, the patterned conductive layers 124 may be formed by dual-damascene method. The number of the inter-dielectric layers 122 and the number of the patterned conductive layers 124 may be less than or more than what is depicted in FIG. 4, and may be designated based on the demand and/or design layout; the disclosure is not specifically limited thereto. In some embodiments, the interconnect structure 120 is formed in a back-end-of-line (BEOL) process. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In certain embodiments, as shown in FIG. 4, the patterned conductive layers 124 are sandwiched between the inter-dielectric layers 122, where a surface of the outermost layer of the patterned conductive layers 124 is at least partially exposed by a plurality of openings (no marked) formed in an outermost layer of the inter-dielectric layers 122 to connect to later formed component(s) for electrical connection (e.g. with the conductive vias 140), and a surface of an innermost layer of the patterned conductive layers 124 is at least partially exposed by a plurality of openings (no marked) formed in an innermost layer of the inter-dielectric layers 122 and electrically connected to the active components and/or passive components included in the semiconductor substrate 110. The shape and number of the openings formed in the outermost layer of the inter-dielectric layers 122 and the shape and number of the openings formed in the innermost layer of the inter-dielectric layers 122 are not limited in the disclosure, and may be designated based on the demand and/or design layout.

In some embodiments, as shown in FIG. 4, the passivation layer 130 is formed on the interconnect structure 120, where parts of the interconnect structure 120 is covered by and in contact with the passivation layer 130, and rest of the interconnect structure 120 is accessibly revealed by the passivation layer 130. As shown in FIG. 4, the passivation layer 130 has a substantially planar surface (e.g. an outermost surface), for example. In certain embodiments, the outermost surface of the passivation layer 130 is leveled and may have a high degree of planarity and flatness, which is beneficial for the later-formed layers/elements (e.g. the conductive vias 140). In some embodiments, the passivation layer 130 includes a polyimide (PI) layer, a polybenzoxazole (PBO) layer, a silicon dioxide based (non-organic) layer or other suitable polymer (or organic) layer, and is formed by deposition or the like. The disclosure is not limited thereto. The disclosure does not specifically limit a thickness of the passivation layer 130 as long as the passivation layer 130 can maintain its high degree of planarity and flatness. In the disclosure, the outermost surface of the passivation layer 130 may be referred to as a front (or active) surface of the semiconductor die 100.

In some embodiments, the conductive vias 140 are formed on the interconnect structure 120 and over the semiconductor substrate 110, and sidewalls of the conductive vias 140 are wrapped around by the passivation layer 130. In some embodiments, as shown in FIG. 4, the conductive vias 140 each penetrate through the passivation layer 130 and extend into the openings formed in the outermost layer of the inter-dielectric layers 122 to physically contact the surface of the outermost layer of the patterned conductive layers 124 exposed by the openings. Through the interconnect structure 120, the conductive vias 140 are electrically connected to the active components and/or passive components included in the semiconductor substrate 110. In some embodiments, the conductive vias 140 in physical contact with the interconnect structure 120 are extended away from the outermost surface of the passivation layer 130. For simplification, only two conductive vias 140 are presented in FIG. 4 in the semiconductor die 100 for illustrative purposes, however it should be noted that more than two conductive vias 140 may be formed; the disclosure is not limited thereto.

In some embodiments, the conductive vias 140 are formed by photolithography, plating, photoresist stripping processes or any other suitable method. The plating process may include an electroplating plating, an electroless plating, or the like. For example, the conductive vias 140 is formed by, but not limited to, forming a mask pattern (not shown) covering the passivation layer 130 with openings (not shown) corresponding to the surface of the outermost layer of the patterned conductive layers 124 exposed by the openings, patterning the passivation layer 130 to form contact openings (not shown) therein for exposing the surface of the outermost layer of the patterned conductive layers 124 exposed by the openings, forming a metallic material filling the openings formed in the mask pattern, the contact openings formed in the passivation layer 130 and the openings to form the conductive vias 140 by electroplating or deposition, and then removing the mask pattern. The passivation layer 130 may be patterned by an etching process, such a dry etching process, a wet etching process, or the combination thereof. It is noted that, for example, the contact openings formed in the passivation layer 130 and a respective one opening underlying thereto are spatially communicated to each other for the formation of the conductive vias 140. The mask pattern may be removed by acceptable ashing process and/or photoresist stripping process, such as using an oxygen plasma or the like. In one embodiment, the material of the conductive vias 140 includes a metal material such as copper or copper alloys, or the like.

In some embodiments, in a vertical projection on the frontside surface S110t of the semiconductor substrate 110 along a (stacking) direction Z of the semiconductor substrate 110, the interconnect structure 120 and the passivation layer 130, the conductive vias 140 may independently be in a circle-shape, an ellipse-shape, a triangle-shape, a rectangle-shape, or the like. The shape of the conductive vias 140 is not limited in the disclosure. The shape and number of the conductive vias 140 may be designated and selected based on the demand, and may be adjusted by changing the shape and number of the contact openings formed in the passivation layer 130.

Alternatively, the conductive vias 140 may be formed by forming a first mask pattern (not shown) covering the passivation layer 130 with openings (not shown) corresponding to the surface of the outermost layer of the patterned conductive layers 124 exposed by the openings, patterning the passivation layer 130 to form the contact openings (not shown) therein for exposing the surface of the outermost layer of the patterned conductive layers 124 exposed by the openings, removing the first mask pattern, conformally forming a metallic seed layer over the passivation layer 130, forming a second mask pattern (not shown) covering the metallic seed layer with openings (not shown) exposing the contact openings formed in the passivation layer 130 and the openings, forming a metallic material filling the openings formed in the second mask pattern, the contact openings formed in the passivation layer 130 and the openings by electroplating or deposition, removing the second mask pattern, and then removing the metallic seed layer not covered by the metallic material to form the conductive vias 140.

In some embodiments, the metallic seed layer is referred to as a metal layer, which includes a single layer or a composite layer comprising a plurality of sub-layers formed of different materials. In some embodiments, the metallic seed layer includes titanium, copper, molybdenum, tungsten, titanium nitride, titanium tungsten, combinations thereof, or the like. For example, the metallic seed layer may include a titanium layer and a copper layer over the titanium layer. The metallic seed layer may be formed using, for example, sputtering, physical vapor deposition (PVD) or the like.

In some embodiments, for the semiconductor die 100, a sidewall of the semiconductor substrate 110, a sidewall of the interconnect structure 120 and a sidewall of the passivation layer 130 are substantially aligned with each other in the direction Z and together constitute a sidewall of the semiconductor die 100. For example, illustrated outermost surface of the conductive vias 140 are protruding away from (e.g. not leveled with) the outermost surface of the passivation layer 130, as shown in FIG. 4. Alternatively, illustrated outermost surface of the conductive vias 140 may be substantially leveled to and substantially coplanar with (e.g. leveled with) the outermost surface of the passivation layer 130.

It is appreciated that, in some embodiments, the semiconductor die 100 described herein may be referred to as a semiconductor chip or an integrated circuit (IC). In some embodiments, the semiconductor die 100 is a logic chip (e.g., a central processing unit (CPU), a graphics processing unit (GPU), a neural network processing unit (NPU), a deep learning processing unit (DPU), a tensor processing unit (TPU), a system-on-a-chip (SoC), an application processor (AP), a system-on-integrated-circuit (SoIC), and a microcontroller); a power management die (e.g., a power management integrated circuit (PMIC) die); a wireless and radio frequency (RF) die; a baseband (BB) die; a sensor die (e.g., a photo/image sensor chip); a micro-electro-mechanical-system (MEMS) die; a signal processing die (e.g., a digital signal processing (DSP) die); a front-end die (e.g., an analog front-end (AFE) die); an application-specific die (e.g., an application-specific integrated circuit (ASIC)); a field-programmable gate array (FPGA); a combination thereof; any suitable logic circuits; or the like. The semiconductor die 100 may include a digital chip, an analog chip or a mixed signal chip. The semiconductor die 100 may be a chip or an IC of combination-type, such as a WiFi chip simultaneously including both of a RF chip and a digital chip.

In alternative embodiments, the semiconductor die 100 is an artificial intelligence (AI) engine such as an AI accelerator; a computing system such as an AI server, a high-performance computing (HPC) system, a high power computing device, a cloud computing system, a networking system, an edge computing system, an immersive memory computing system (ImMC), a SoIC system, etc.; a combination thereof; or the like. In other alternative embodiments, the semiconductor die 100 is an electrical and/or optical input/output (I/O) interface die, an integrated passives die (IPD), a voltage regulator die (VR), a local silicon interconnect die (LSI) with or without deep trench capacitor (DTC) features, a local silicon interconnect die with multi-tier functions such as electrical and/or optical network circuit interfaces, IPD, VR, DTC, or the like. The type of the semiconductor die 100 may be selected and designated based on the demand and design requirement, and thus is not specifically limited in the disclosure.

As shown in FIG. 4, in some embodiments, the semiconductor dies 200 independently include a base die 210, a plurality of stacking dies 220 stacked on the base die 210, an insulating encapsulation 230 covering the stacking dies 220 and the base die 210, and a plurality of conductive vias 240 disposed on the base die 210. The stacking dies 220 are stacked on an illustrated top surface (e.g., a non-active surface or a backside) of the base die 210 along the direction Z, and are electrically coupled to and electrically communicated to the base die 210, for example. The base die 210 and the stacking dies 220 may together constitute an die stack having one base tier and four inner tiers as shown in FIG. 4, where the base die 210 may be referred to as a (carrier) die of the base tier in the die stack, and the stacking dies 220 may be independently referred to as a die of one inner tier in the die stack. The number of the base die 210 in the base tier and the number of the stacking dies 220 in each inner tier may not be limited to the drawings of the disclosure, and may be one or more than one, based on the demand and design requirement.

It is noted that, each of the base die 210 and the stacking dies 220 may independently include a semiconductor substrate (not shown), an interconnect structure (not shown) disposed on the semiconductor substrate, conductive pads (not shown) disposed on and electrically connected to the interconnect structure, a passivation layer (not shown) disposed on the interconnect structure and partially exposing the conductive pads, conductive vias (not shown) disposed on and electrically connected to the conductive pads, and/or a post-passivation layer (not shown) disposed on the passivation layer and laterally wrapping the conductive vias.

The base die 210 described herein may be referred as a semiconductor chip or an integrated circuit (IC). In some embodiments, the base die 210 includes a digital chip, an analog chip or a mixed signal chip. For example, the base die 210 is an ASIC chip, a sensor chip, a wireless and RF chip, a logic chip, or a voltage regulator chip. In some embodiments, each of the stacking dies 220 includes a memory die (e.g., a dynamic random-access memory (DRAM) die, static random-access memory (SRAM) die, a synchronous dynamic random-access memory (SDRAM), a resistive random-access memory (RRAM) die, a magnetoresistive random-access memory (MRAM) die, a NAND flash, a wide I/O memory (WIO) die, a high bandwidth memory (HBM) die, the like, etc.) with or without a controller. For example, the stacking dies 220 included in the die stack of each semiconductor die 200 are memory dies, and the base die 210 included in the die stack of each semiconductor die 200 is a logic die providing control functionality for these memory dies, as shown in FIG. 4. In the case, the semiconductor dies 200 may independently be a hybrid memory cube (HMC) module, a high bandwidth memory (HBM) module, or the like.

The type of the semiconductor die 100 may be different from the type of the semiconductor dies 200. For example, in each semiconductor die 200, the stacking die 220 are HBM modules, and the base die 210 is a logic die providing control functionality for these memory modules, as shown in FIG. 4.

The insulating encapsulation 230 laterally encapsulates the stacking dies 220 and covers the backside (e.g. the illustrated top surface) of the base die 210 exposed by the stacking dies 220 for ensuring the bonding between the base die 210 and the stacking dies 220, for example. In some embodiments, the material of the insulating encapsulation 230 includes a molding compound, a molding underfill, a resin (such as epoxy), or the like. In some alternative embodiments, the material of the insulating encapsulation 230 includes nitride such as silicon nitride, oxide such as silicon oxide, phosphosilicate glass (PSG), borosilicate glass (BSG), boron-doped phosphosilicate glass (BPSG), a combination thereof, or the like. In yet alternative embodiments, the material of each of the insulating encapsulation 230 includes an organic material (e.g., epoxy, PI, PBO, or the like), or the mixture of inorganic and organic materials (e.g., the mixture of silicon oxide and epoxy, or the like). In some embodiments, the insulating encapsulation 230 may be formed by a molding process, such as a compression molding process. In some alternative embodiments, the insulating encapsulation 230 may be formed through suitable fabrication techniques such as chemical vapor deposition (CVD) (e.g., high-density plasma chemical vapor deposition (HDPCVD) or plasma-enhanced chemical vapor deposition (PECVD)). As illustrated in FIG. 4, for each semiconductor die 200, an illustrated top surface of the semiconductor die 200 included in a topmost tier of the die stack may be exposed by the insulating encapsulation 230. For example, the illustrated top surface of the semiconductor die 200 included in the topmost tier of the die stack is substantially leveled with and substantially coplanar to an illustrated top surface of the insulating encapsulation 230. The illustrated top surface of the semiconductor die 200 and the illustrated top surface of the insulating encapsulation 230 being substantially coplanar thereto may be referred to as a backside surface S200b of one semiconductor die 200.

The conductive vias 240 are disposed on an illustrated bottom surface (e.g., an active surface or a frontside surface) of the base die 210 along the direction Z, and are electrically coupled to and electrically communicated to the base die 210, for example. For simplification, only two conductive vias 240 are presented in FIG. 4 in each semiconductor die 200 for illustrative purposes, however it should be noted that more than two conductive vias 240 may be formed; the disclosure is not limited thereto. The formation and material of the conductive vias 240 may be similar to or substantially identical to the formation and material of the conductive vias 140 aforementioned, and thus are not repeated herein.

The semiconductor dies 200 independently may further include an interconnect structure (not shown) disposed between and electrically connecting the base die 210 and the conductive vias 240 for providing further routing function and a passivation layer (not shown) covering the interconnect structure exposed by the conductive vias 240 for providing protection. In one example, the outermost surfaces of the conductive vias 240 may protrude away from an outermost surface of the passivation layer. However, the disclosure is not limited thereto; alternatively, the outermost surfaces of the conductive vias 240 may be substantially leveled with and coplanar to the outermost surface of the passivation layer.

As shown in FIG. 4, in some embodiments, the semiconductor dies 100, 200 are bonded to the interposer 300. For example, the semiconductor dies 100, 200 are picked and placed on the interposer 300, and are bonded to the interposer 300 by flip-chip bonding. In the case, the interposer 300 includes a substrate 310, a plurality of through vias 320 in the substrate 310, a redistribution circuit structure 330 located on the substrate 310 and connected to the through vias 320, a plurality of conductive connectors 340 connected to the redistribution circuit structure 330, and a plurality of conductive connectors 350 connected to the through vias 320.

In some embodiments, the substrate 310 is a wafer, such as a bulk semiconductor substrate, SOI substrate, multi-layered semiconductor substrate, or the like. The semiconductor material of the substrate 310 may be silicon, germanium; a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an alternative embodiment, other substrates, such as multi-layered or gradient substrates, may also be used. The substrate 310 may be doped or undoped and may further include active and/or passive devices, such as transistors, capacitors, resistors, diodes, and the like formed in and/or on a surface S310t of the substrate 310. In some embodiments, the surface S310t is referred to as an frontside surface (or a top side) of the substrate 310. In certain embodiments, as shown in FIG. 4, the substrate 310 are substantially free of active and/or passive devices, the disclosure is not limited thereto.

In some embodiments, the through vias 320 are formed in the substrate 310 to extend from the surface S310t of the substrate 310 to a surface S310b of the substrate 310, where the surface S310b is opposite to the surface S310t along the stacking direction Z. For example, the surface S310b is referred to as a backside surface (or a bottom side) of the substrate 310, and the through vias 320 are sometimes referred to as through-substrate-vias or through-silicon-vias as the substrate 310 is a silicon substrate. The through vias 320 may be formed by forming recesses in the substrate 310 and depositing a conductive material in the recesses. The recesses may be formed by, for example, etching, milling, laser techniques, a combination thereof, and/or the like. The conductive material may be formed by an electro-chemical plating process, CVD, atomic layer deposition (ALD), PVD, a combination thereof, and/or the like. Examples of conductive materials are copper, tungsten, aluminum, silver, gold, a combination thereof, and/or the like.

A thin barrier layer may be conformally formed in the recesses, such as by CVD, ALD, PVD, thermal oxidation, a combination thereof, and/or the like, to separate the substrate 310 and the conductive material for preventing diffusing from the conductive material into the substrate 310. The barrier layer may comprise a nitride or an oxynitride, such as titanium nitride, titanium oxynitride, tantalum nitride, tantalum oxynitride, tungsten nitride, a combination thereof, and/or the like. Excess conductive material and barrier layer are removed from the surface S310t of the substrate 310 by, for example, chemical mechanical polishing (CMP) process. Thus, the through vias 320 may include the conductive material and the thin barrier layer between the conductive material and the substrate 310.

A thin dielectric material, serving as an adhesive layer, may be optionally formed in the recesses, such as by using an oxidation technique, and interposed between the thin barrier layer and the conductive material for enhancing the adhesion therebetween. In the case, the through vias 320 include the conductive material, the thin barrier layer between the conductive material and the substrate 310, and the thin dielectric layer between the conductive material and the thin barrier layer.

In some embodiments, the redistribution circuit structure 330 is formed on the surface S310t of the substrate 310, and is electrically connected to the substrate 310. In certain embodiments, the redistribution circuit structure 330 includes a dielectric structure 332 and one or more metallization layers 334 arranged therein for providing routing function. In some embodiments, the dielectric structure 332 includes one or more dielectric layers, such that the dielectric layers and the metallization layer 334 are alternately formed, and one metallization layer 334 is sandwiched between two dielectric layers. As shown in FIG. 4, portions of a top surface of a topmost layer of the metallization layers 334 are respectively exposed by openings formed in a topmost dielectric layer of the dielectric structure 332, and portions of a bottom surface of a bottommost layer of the metallization layers 334 are respectively exposed by openings formed in a bottommost dielectric layer of the dielectric structure 332. However, the disclosure is not limited thereto. The number of the metallization layers and the number of the dielectric layers included in the redistribution circuit structure 330 are not limited thereto, and may be designated and selected based on the demand and design requirement. The material and formation of the dielectric structure 332 may be the same or similar to the material and formation of the inter-dielectric layers 122, the material and formation of the metallization layers 334 may be the same or similar to the material and formation of the patterned conductive layers 124, and thus may not be repeated herein.

For example, the through vias 320 are connected to the portions of the bottom surface of the bottommost layer of the metallization layers 334 respectively exposed by the openings formed in the bottommost dielectric layer of the dielectric structure 332. In other words, the redistribution circuit structure 330 are electrically connected to the through vias 320. The redistribution circuit structure 330 may further be electrically connected to the active and/or passive devices (if any) embedded in the substrate 310 and/or formed on the surface S310t of the substrate 310. In some embodiments, through the redistribution circuit structure 330, the through vias 320 are electrically coupled to the substrate 310 and/or the active and/or passive devices (if any) embedded in the substrate 310 and/or formed on the surface S310t of the substrate 310.

In some embodiments, the conductive connectors 340 are disposed on the redistribution circuit structure 330. As shown in FIG. 4, for example, the conductive connectors 340 are formed on and connected to the portions of the top surface of the topmost layer of the metallization layers 334 respectively exposed by the openings formed in the topmost dielectric layer of the dielectric structure 332. In other words, the conductive connectors 340 are electrically connected to the redistribution circuit structure 330. In an alternative embodiment, through the redistribution circuit structure 330, some of the conductive connectors 340 may further be electrically connected to the substrate 310 (e.g. the active and/or passive devices embedded therein and/or formed on the surface S310t) and the through vias 320. As illustrated in FIG. 4, the semiconductor die 100 is bonded to the interposer 300 by connecting the conductive vias 140 and some of the conductive connectors 340, and the semiconductor dies 200 are bonded to the interposer 300 by connecting the conductive vias 240 and some of the conductive connectors 340, for example. In some embodiments, the semiconductor die 100 and the semiconductor dies 200 are electrically coupled and electrically communicated to each other through the interposer 300.

In some embodiments, the conductive connectors 340 may include ball grid array (BGA) connectors, solder balls, metal pillars, controlled collapse chip connection (C4) bumps, micro bumps, electroless nickel-electroless palladium-immersion gold technique (ENEPIG) formed bumps, or the like. The material of the conductive connectors 340, for example, may include a conductive material such as solder, copper, aluminum, gold, nickel, silver, palladium, tin, or the like, or a combination thereof. In one embodiment, the material of the conductive connectors 340, for example, may be solder-free. The cross-section of the conductive connectors 340 is not limited to the embodiments, and may has any suitable shape based on the demand.

In some embodiments, the conductive connectors 350 are disposed on the surface S310b of the substrate 310, where the conductive connectors 350 are connected to the through vias 320. As shown in FIG. 4, the conductive connectors 350 are formed on the substrate 310 corresponding to the positioning location of the through vias 320, and thus the conductive connectors 350 are respectively in physical contact with illustrated bottom surfaces of the through vias 320, for example. In some embodiments, through the through vias 320, the redistribution circuit structure 330 and the conductive connectors 340, some of the conductive connectors 350 are electrically connected to the semiconductor die 100. In some embodiments, through the through vias 320, the redistribution circuit structure 330 and the conductive connectors 340, some of the conductive connectors 350 are electrically connected to the semiconductor dies 200. In addition, some of the conductive connectors 350 may further be electrically connected to the active and passive devices embedded in and/or formed on the surface S310t of the substrate 310.

The material and formation of the conductive connectors 350 are the same or similar to the material and formation of the conductive connectors 340, and thus may not be repeated herein. The conductive connectors 350 may be the same as the conductive connectors 340. Alternatively, the conductive connectors 350 may be different from the conductive connectors 340. In the disclosure, the conductive connectors 340 and 350 each are referred to as conductive terminals of the interposer 300 for electrical connection with other components. The surface S310b of the substrate 310 may be referred to as a front side FS (or an active side) of the semiconductor package P1.

However, the disclosure is not limited thereto, alternatively, the interposer 300 may optionally include an additional redistribution circuit structure on the surface S310b of the substrate 310 to electrically connect the through vias 320 and the conductive connectors 350 for providing further routing function. The formation and material of the additional redistribution circuit structure may be similar to or substantially identical to the formation and material of the redistribution circuit structure 330, and thus are not repeated herein.

In some embodiments, an underfill UF1 at least fills the gaps between the semiconductor die 100 and the interposer 300 (e.g. the redistribution circuit structure 330) and between the semiconductor dies 200 and the interposer 300 (e.g. the redistribution circuit structure 330), and wraps sidewalls of the conductive vias 140, the conductive vias 240 and the conductive connectors 340. In one embodiment, the underfill UF1 filled in the gaps between the semiconductor dies 100, 200 and the redistribution circuit structure 330 are not connected to one another, as shown in FIG. 4; the disclosure is not limited thereto. Alternatively, the underfill UF1 filled in the gaps between the semiconductor dies 100, 200 and the redistribution circuit structure 330 may be connected to one another. In one embodiment, a sidewall of the semiconductor die 100 and a sidewall of each of the semiconductor dies 200 is free of the underfill UF1, as shown in FIG. 4; the disclosure is not limited thereto. Alternatively, the sidewall of the semiconductor die 100 and the sidewall of each of the semiconductor dies 200 may be covered by the underfill UF1. The underfill UF1 may be any acceptable material, such as a polymer, epoxy resin, molding underfill, or the like, for example. The underfill UF1 may be formed by underfill dispensing, a capillary flow process, or any other suitable method. Owing to the underfill UF1, the bonding strength between the semiconductor dies 100, 200 and the interposer 300 is enhanced. However, the disclosure is not limited thereto; alternatively, the underfill UF1 may be optionally omitted.

As shown in FIG. 4, in some embodiments, the semiconductor dies 100, 200 are encapsulated in the insulating encapsulation 400, and the interposer 300 (e.g. the redistribution circuit structure 330) exposed by the underfill UF1 is then covered by the insulating encapsulation 400. For example, the insulating encapsulation 400 at least fills up the gaps between the semiconductor dies 100, 200 and between the underfill UF1 respectively underlying the semiconductor dies 100, 200. In some embodiments, the semiconductor dies 100, 200 and the underfill UF1 are surrounded and covered by the insulating encapsulation 400. As shown in FIG. 4, f the backside surface S100b (e.g. a non-active surface) of the semiconductor die 100 and the backside surfaces S200b (e.g. non-active surfaces) of the semiconductor dies 200 may be substantially leveled with and substantially coplanar to an illustrated top surface S400t of the insulating encapsulation 400. The backside surface S100b of the semiconductor die 100, the backside surfaces S200b of the semiconductor dies 200 and the illustrated top surface S400t of the insulating encapsulation 400 may be together referred to as a back side BS (or a non-active side) of the semiconductor package P1. In the case, the semiconductor dies 100, 200 are laterally encapsulated by the insulating encapsulation 400, and the underfill UF1 is embedded in the insulating encapsulation 400.

However, the disclosure is not limited thereto; alternatively, the semiconductor dies 100, 200 and the underfill UF1 are embedded in the insulating encapsulation 400. That is, the backside surface S100b of the semiconductor die 100 and the backside surfaces S200b of the semiconductor dies 200 may be embedded in the insulating encapsulation 400 (e.g. not revealed by the substantially flat and planar illustrated top surface S400t of the insulating encapsulation 400).

In some embodiments, the insulating encapsulation 400 is a molding compound formed by a molding process. In some embodiments, the insulating encapsulation 400 include polymers (such as epoxy resins, phenolic resins, silicon-containing resins, or other suitable resins), dielectric materials, or other suitable materials. In an alternative embodiment, the insulating encapsulation 400 may include an acceptable insulating encapsulation material. The insulating encapsulation 400 may further include inorganic filler or inorganic compound (e.g. silica, clay, and so on) which can be added therein to optimize coefficient of thermal expansion (CTE) of the insulating encapsulation 400, the disclosure is not limited thereto. For example, the insulating encapsulation 400 is formed by, but not limited to, overmolding the semiconductor dies 100, 200 by an insulating encapsulation material, and patterning the insulating encapsulation material to form the insulating encapsulation 400. The insulating encapsulation material may be patterned by a planarizing process until the semiconductor dies 100 and 200 are accessibly exposed by the insulating encapsulation 400. Owing to the insulating encapsulation 400, the bonding strength between the semiconductor dies 100, 200 and the interposer 300 is further enhanced, and the semiconductor dies 100, 200 are protected from the damages caused by the external contacts.

During the planarizing process, the semiconductor dies 100, 200 independently may also be planarized. The planarizing process is performed by mechanical grinding or CMP, for example. After the planarizing process, a cleaning process may be optionally performed to clean and remove the residue generated from the planarizing process. However, the disclosure is not limited thereto, and the planarizing process may be performed through any other suitable method.

In some embodiments, for the semiconductor package P1, a sidewall of the interposer 300 and a sidewall of the insulating encapsulation 400 are substantially aligned with each other in the direction Z, which together constitute a sidewall of semiconductor package P1. In some embodiments, the semiconductor dies 200 are arranged aside of the semiconductor die 100 (e.g. two opposite sides thereof) on a X-Y plane in a direction X, as shown in FIG. 4 and FIG. 8A. However, the disclosure is not limited thereto; alternatively, the semiconductor dies 200 may be arranged aside of the semiconductor die 100 on the X-Y plane in a direction Y or in the directions X and Y. The directions X and Y are different form each other and each are different from the direction Z, in some embodiments. The directions X and Y may be perpendicular to each other and each may be further perpendicular to the direction Z. The direction Z may be referred to as a stacking direction of the components included in the semiconductor package module 1000 and a stacking direction of the components included in the semiconductor package P1. For example, the direction Z is the stacking direction of the interposer 300 and the semiconductor dies 100, 200. The semiconductor package P1 may be referred to as a chip-on-wafer (CoW) package.

Continued on FIG. 4, in some embodiments, the semiconductor package P1 is placed over and mounted to the circuit substrate 500 through the conductive connectors 350. For example, the semiconductor package P1 is bonded to a surface S510t of the circuit substrate 500 by flip-chip bonding. In some embodiments, the surface S510t is referred to as an frontside surface (or a top side) of the circuit substrate 500.

The circuit substrate 500 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. In some alternative embodiments, the circuit substrate 500 is a SOI substrate, where the SOI substrate may include a layer of a semiconductor material such as epitaxial silicon, germanium, silicon germanium, SOI, silicon germanium on insulator (SGOI), or combinations thereof. In further alternative embodiments, the circuit substrate 500 is based on an insulating core, such as a fiberglass reinforced resin core. One example core material is fiberglass resin such as flame-retardant class 4 (FR4). Alternatives for the core material may include bismaleimide triazine (BT) resin, or alternatively, other printed circuit board (PCB) materials or films. In yet further alternative embodiments, the circuit substrate 500 is a build-up film such as Ajinomoto build-up film (ABF) or other suitable laminates.

In one embodiment, the circuit substrate 500 may include active and/or passive devices (not shown), such as transistors, capacitors, resistors, combinations thereof, or the like which may be used to generate the structural and functional requirements of the design for the semiconductor package module 1000. The active and/or passive devices may be formed using any suitable methods. However, the disclosure is not limited thereto; alternatively, the circuit substrate 500 may be substantially free of active and/or passive devices.

In some embodiments, the circuit substrate 500 includes bonding pads 510, bonding pads 520, metallization layers 530, and vias (not shown), where the metallization layers 530 and the vias are interconnected and are further electrically connected to the bonding pads 510, 520. The metallization layers 530 and vias together form a functional circuitry providing routing function for the circuit substrate 500. The metallization layers 530 and vias embedded in the circuit substrate 500 may be formed of alternating layers of dielectric material (e.g., low-k dielectric material) and conductive material (e.g., copper) with vias interconnecting the layers of conductive material, and which may be formed through any suitable process (such as deposition, damascene, dual damascene, or the like). The layers of the conductive material may extend along the X-Y plane, and the vias may extend along the direction Z so to connecting two adjacent layers of the conductive material.

The bonding pads 510, 520 are used to provide electrical connection with external component(s) for the circuit substrate 500. In some embodiments, the bonding pads 510, 520 are located at two opposite sides of the circuit substrate 500 along the direction Z and electrically connected to each other through the metallization layers 530 and vias. As shown in FIG. 4, the bonding pads 510 are disposed at the surface S510t of the circuit substrate 500, and the bonding pads 520 are disposed at a surface S510b of the circuit substrate 500. In some embodiments, the surface S510b is referred to as a backside surface (or a bottom side) of the circuit substrate 500.

For example, the conductive connectors 350 of the semiconductor package P1 are connected to the bonding pads 510 of the circuit substrate 500, respectively. As shown in FIG. 4, in some embodiments, through bonding pads 510 and the conductive connectors 350, the semiconductor package P1 is electrically connected to the circuit substrate 500. In FIG. 4, the structure having the semiconductor package P1 disposed on (or assembled to) the circuit substrate 500 may be referred to as a chip-on-wafer-on-substrate (CoWoS) package. In addition, the circuit substrate 500 is considered as an organic substrate with circuitry structure embedded therein or a PCB.

In some embodiments, an underfill UF2 is formed on the circuit substrate 500. As shown in FIG. 4, for example, the underfill UF2 fills the gap between the semiconductor package P1 and the circuit substrate 500, and wraps sidewalls of the conductive connectors 350. The material and formation of the underfill UF2 may be the same or similar to the material and formation of underfill UF1, and thus are not repeated herein for simplicity. Alternatively, the underfill UF2 may be optional.

One or more surface devices 540 may be connected to the circuit substrate 500. The surface devices 540 are, for example, used to provide additional functionality or programming to the semiconductor package P1. The surface devices 540 may include surface mount devices (SMDs) or integrated passive devices (IPDs) that including passive devices such as resistors, inductors, capacitors, jumpers, combinations of these, or the like, that may be desired to be connected to and utilized in conjunction with the semiconductor package P1. For example, as shown in FIG. 4, the surface devices 540 are placed on and bonded to the surface S510t of the circuit substrate 500 where the semiconductor package P1 disposed thereon. The number of the surface devices 540 is not limited to the embodiments, and may be selected and/or designated based on the demand and design requirement. As shown in FIG. 4, the surface devices 540 are electrically connected to the semiconductor package P1 through the bonding pads 510, the metallization layers 530, the vias, and the conductive connectors 350, for example. Alternatively, the surface devices 540 may be optional.

Figure 5:
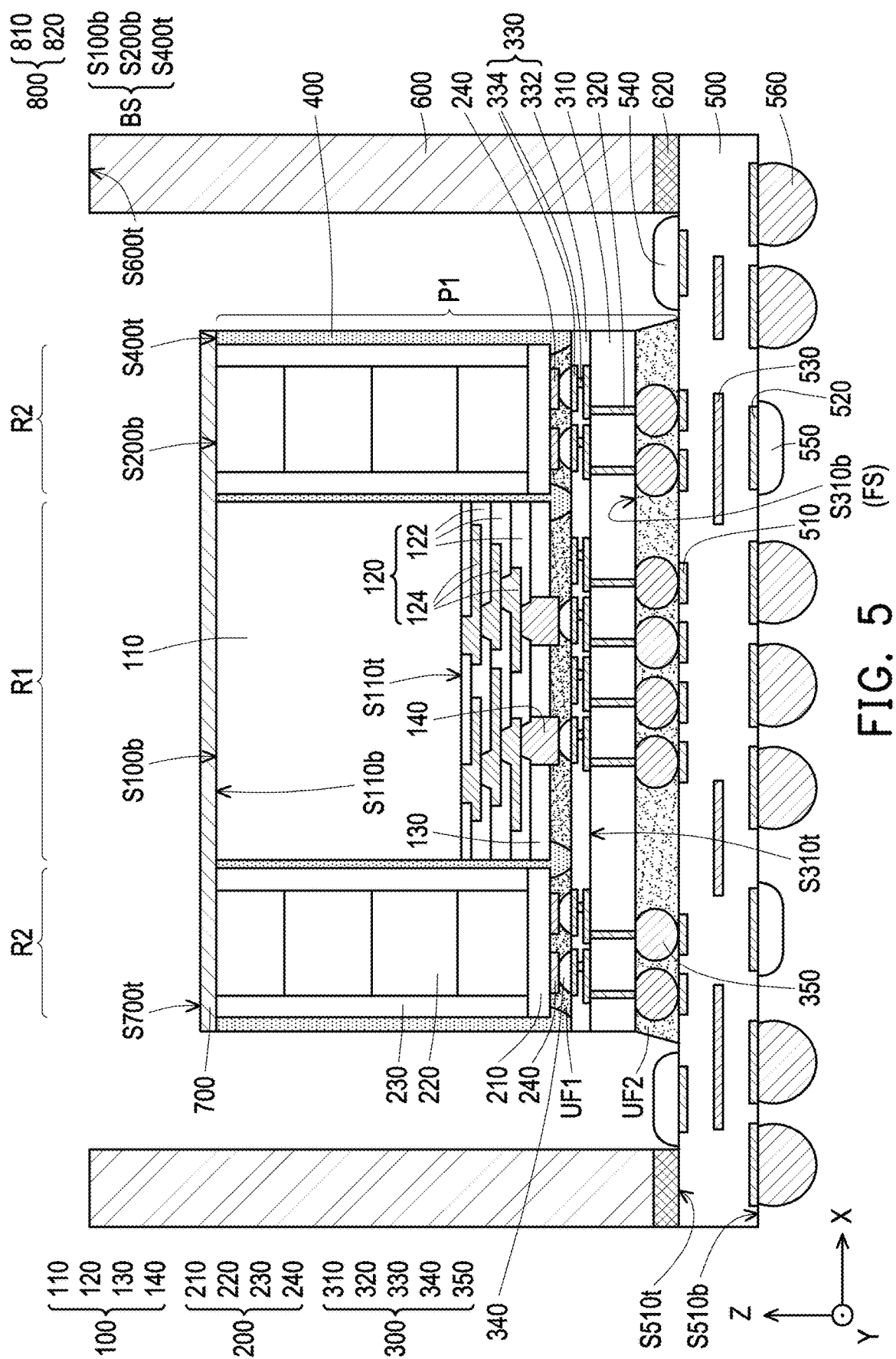

Referring to FIG. 5 and in conjunction with FIG. 3, in some embodiments, after the semiconductor package P1 is disposed on the circuit substrate 500, the supporting structure 600 is provided and disposed on the circuit substrate 500. In some embodiments, the supporting structure 600 is attached to the circuit substrate 500 using a bonding element (e.g. the adhesive 620). For example, a bottom surface (not labeled) of the supporting structure 600 is adhered to an illustrated top surface of the circuit substrate 500 through the adhesive 620, where the supporting structure 600 surrounds the semiconductor package P1. In some embodiments, in the plane view (e.g., the X-Y plane) as shown in FIG. 1 and FIG. 8A, the supporting structure 600 is in a form of a full (continuous) frame annulus having an inner sidewall (not labeled) facing the sidewall of the semiconductor package P1 and an outer sidewall (not labeled) opposite to the inner sidewall. For example, the supporting structure 600 is next to and separated from the semiconductor package P1 by a gap, in the plane view. Owing to the supporting structure 600, the loading effect (e.g., between a central region (disposed with the semiconductor package P1) and a peripherical region surrounding the central region) of the circuit substrate 500 is suppressed, the warpage control of the semiconductor package module 1000 is achieved.

The supporting structure 600 may be referred to as a ring structure. The supporting structure 600 has a closed, full frame shape of rectangular annulus in the plane view of FIG. 8A for illustrative purposes, however the disclosure is not limited thereto. Alternatively, the supporting structure 600 may have a closed, continuous frame shape of circular annulus, elliptical annulus, other suitable polygonal annulus in the plane view. Or alternatively, the supporting structure 600 may have a discontinuous frame shape (e.g. with slits/openings) of rectangular annulus, circular annulus, elliptical annulus, other suitable polygonal annulus in the plane view. In some embodiments, a material of the supporting structure 600 includes an electrically conductive material, a thermally conductive material or an electrically and thermally conductive material. For example, the material of the supporting structure 600 includes metals or metal alloys, such as copper, aluminum, cobalt, copper coated with nickel, stainless steel, tungsten, copper-tungsten, copper-molybdenum, silver diamond, copper diamond, aluminum nitride, aluminum silicon carbide or their alloys, stacking of different material combinations thereof, or the like. For example, the supporting structure 600 is made of a material having high thermal conductivity between about 200 W/(m·K) to about 400 W/(m·K) or more. In the embodiments of which the supporting structure 600 has the high thermal conductivity, the heat dissipation of the semiconductor package module 1000 is further enhanced.

A material of the adhesive 620 is not particularly limited, and may be chosen as a function of a material used for adhering the circuit substrate 500 and the supporting structure 600, where the adhesive 620 has to secure the circuit substrate 500 and the supporting structure 600 together. In some embodiments, the adhesive 620 includes an electrically conductive adhesive, a thermally conductive adhesive, or an electrically and thermally conductive adhesive. For example, a material of the adhesive 620 includes a thermocurable adhesive, photocurable adhesive, thermally conductive adhesive, thermosetting resin, waterproof adhesive, lamination adhesive or a combination thereof. For another example, the adhesive 620 includes a die attach film (DAF). According to the type of material used, the adhesive 620 may be formed by deposition, lamination, printing, plating, or any other suitable technique. The adhesive 620 may further include a filler. For example, the filler includes a metal filler or a metal alloy filler. Through the adhesive 620, the supporting structure 600 is physically connect to the circuit substrate 500, for example.

In certain embodiments, depending on the material of the adhesive 620, the circuit substrate 500 may be thermally and/or electrically coupled to supporting structure 600 through the adhesive 620. Through the adhesive 620, the supporting structure 600 may be thermally connected to the circuit substrate 500. Through the adhesive 620, the supporting structure 600 may be electrically connected to the circuit substrate 500. Through the adhesive 620, the supporting structure 600 may be thermally and electrically connected to the circuit substrate 500. In some embodiments, the shape of the adhesive 620 and the shape of the supporting structure 600 in the plane view (e.g. in FIG. 8A) share the same pattern/profile.

In some embodiments, after the supporting structure 600 is mounted onto the circuit substrate 500, an illustrated top surface (e.g. the back side BS) of the semiconductor package P1 is lower than the illustrated top surface S600*t* of the supporting structure 600 by a non-distance (e.g. being greater than zero). With such, the supporting structure 600 further provides a protection for the semiconductor package P1 from physical damages during transportation, transferring and/or operation. Although not shown, the illustrated top surface (e.g. the back side BS) of the semiconductor package P1 may be higher than the illustrated top surface S600*t* of the supporting structure 600 by a non-distance. Or alternatively, the illustrated top surface (e.g. the back side BS) of the semiconductor package P1 and the illustrated top surface S600*t* of the supporting structure 600 may be located at the substantially same height-level. In some embodiments, the supporting structure 600 is electrically isolated to the semiconductor package P1. In that case, there is no electrical impact (e.g. negative effects such as noises or the like) induced by the supporting structure 600 to the semiconductor package P1.

Continued to FIG. 5 in conjunction with FIG. 3, in some embodiments, the metallization layer 700 is disposed on the semiconductor package P1, where the semiconductor package P1 is located between the circuit substrate 500 and the metallization layer 700. In some embodiments, the metallization layer 700 is formed on the back side BS of the semiconductor package P1. The metallization layer 700 may be a single layer or a composite layer having a plurality of sub-layers formed of different materials made of metal or metal alloy, which may include copper, nickel, titanium, tungsten, alloys thereof or other suitable choice of materials. The metallization layer 700 may be formed through a sputtering process, a PVD process, or the like. In some embodiments, the metallization layer 700 is conformally formed on the back side BS of the semiconductor package P1 to be in direct contact with the backside surface S100*b* of the semiconductor die 100, the backside surfaces S200*b* of the semiconductor dies 200, and the illustrated top surface S400*t* of the insulating encapsulation 400. As shown in FIG. 5, the metallization layer 700 is in physical contact with the semiconductor dies 100 and 200 of the semiconductor package P1, and the metallization layer 700 is thermally coupled to the semiconductor dies 100 and 200 of the semiconductor package P1. In some embodiments, a thickness of the metallization layer 700 is approximately ranging from 50 nm to 1 micron (μm).

In some embodiments, the metallization layer 700 is formed on the semiconductor package P1 prior to disposing the supporting structure 600 on the circuit substrate 500 and after disposing the semiconductor package P1 on the circuit substrate 500. In other embodiments, the metallization layer 700 is formed on the semiconductor package P1 after disposing the supporting structure 600 on the circuit substrate 500 and disposing the semiconductor package P1 on the circuit substrate 500. However, the disclosure is not limited thereto; alternatively, the metallization layer 700 may be formed on the semiconductor package P1 prior to disposing the semiconductor package P1 on the circuit substrate 500 as in FIG. 4.

As shown in FIG. 5, in some embodiments, conductive connectors 560 are disposed on the surface S510*b* of the circuit substrate 500. The conductive connectors 560 may be used to physically and electrically connect the circuit substrate 500 to other devices, packages, connecting components, and the like. For example, through conductive connectors 560, the circuit substrate 500 is mounted to and electrically coupled to the printed circuit board MB depicted in FIG. 1. The conductive connectors 560 may be referred to as conductive terminals of the circuit substrate 500 for providing physical and/or electrical connection to external components, in the disclosure. As shown in FIG. 5, for example, the conductive connectors 560 and the semiconductor package P1 are respectively located on two opposite sides of the circuit substrate 500, where some of the conductive connectors 560 are electrically connected to the semiconductor package P1 through the bonding pads 520, the metallization layers 530 (in addition to the vias), the bonding pads 510, and the conductive connectors 350.

In some embodiments, one or more surface devices 550 may be connected to the circuit substrate 500. The surface devices 550 may be used to provide additional functionality or programming to the semiconductor package P1. The surface devices 550 may include SMDs or IPDs that including passive devices such as resistors, inductors, capacitors, jumpers, combinations of these, or the like, that may be desired to be connected to and utilized in conjunction with the semiconductor package P1. For example, as shown in FIG. 5, the surface devices 550 are placed on and bonded to the surface S510*b* of the circuit substrate 500 where the conductive connectors 560 disposed thereon. The number of the surface devices 550 is not limited to the embodiments, and may be selected and/or designated based on the demand and design requirement. As shown in FIG. 5, the surface devices 550 are electrically connected to the semiconductor package P1 through the bonding pads 510, 520, the metallization layers 530, the vias, and the conductive connectors 350, for example. Alternatively, the surface devices 550 may be optional.

The disclosure is not limited to the drawings of the disclosure. In one embodiment, only surface devices 540 are formed on the circuit substrate 500, where the number of the surface devices 540 may be one or more than one. In an alternative embodiment, only surface devices 550 are formed on the circuit substrate 500, where the number of the surface devices 550 may be one or more than one.

Figure 6:
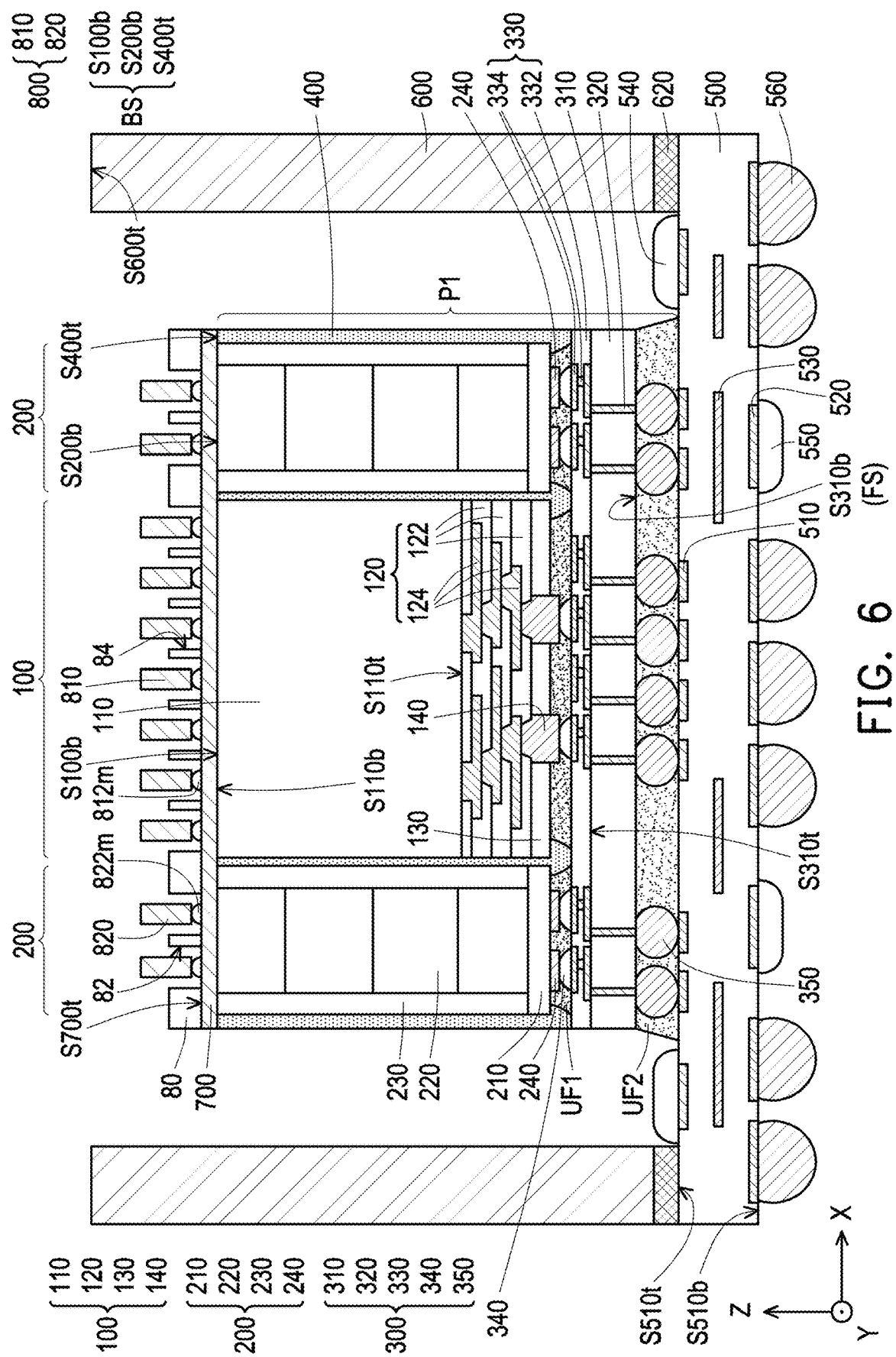

Referring to FIG. 6 in conjunction with FIG. 3, in some embodiments, a flux layer is applied onto the metallization layer 700. For example, as shown in FIG. 6, the flux layer includes a plurality of flux portions 812*m* and a plurality of flux portions 822*m*, where the flux portions 812*m* and 822*m* are formed on a surface S700*t* of the metallization layer 700. The flux portions 812*m* and 822*m* may include a flux with high viscosity, which may be applied onto the surface S700*t* of the metallization layer 700 through, for example, dipping, brushing, syringe dispensing, printing, or spraying. The flux portions 812*m* and 822*m* may be pre-solder pastes. Alternatively, the flux portions 812*m* and 822*m* may be pre-solder blocks. In some embodiments, the material of the flux portions 812*m* and 822*m* may include a lead-free solder material (such as Sn—Ag base or Sn—Ag—Cu base materials) with or without additional impurity (such as Ni, Bi, Sb, Au, or the like).

Moreover, prior forming the flux portions 812*m* and 822*m* on the metallization layer 700, a stencil 80 is provided on the metallization layer 700 over the semiconductor package P1, in some embodiments. For example, as shown in FIG. 6, the stencil 80 has a plurality of apertures 82 over the regions R2 to partially expose the metallization layer 700 in contact with the semiconductor dies 200 and a plurality of apertures 84 over the region R1 to partially expose the metallization layer 700 in contact with the semiconductor die 100. After placing the stencil 80 on the metallization layer 700, the flux portions 812*m* and 822*m* may be formed on the metallization layer 700 by stencil printing, as shown in FIG. 6. For example, widths of the apertures 82 are greater than width of the flux portions 822m, and widths of the apertures 84 are greater than or substantially equal to width of the flux portions 812m. Alternatively, the widths of the apertures 82 are substantially equal to the width of the flux portions 822m, and the widths of the apertures 84 are greater than or substantially equal to width of the flux portions 812m. That is, the stencil 80 may serve as a mask to outline regions in which the flux portions 812m, 822m may be applied thereon. In the case, the flux portions 812m, 822m may be applied onto the metallization layer 700 simultaneously, so as to accelerate the production time while reducing the manufacturing cost.

Continued on FIG. 6, in some embodiments, after the formation of the flux portions 812m and 822m, one or more than one heat dissipating element 800 is disposed on the flux portions 812m and 822m. For example, the one or more than one heat dissipating element 800 includes a plurality of heat dissipating elements 810 and a plurality of the heat dissipating elements 820 as shown in FIG. 6. In the case, the heat dissipating elements 810 and the heat dissipating elements 820 are respectively disposed on the flux portions 812m and the flux portions 822m. The heat dissipating elements 810 and the heat dissipating elements 820 may independently include a material made of metal or metal alloy, which may include copper, nickel, titanium, tungsten, alloys thereof or other suitable choice of materials. The heat dissipating elements 810 and the heat dissipating elements 820 may be considered as thermal conductive elements for dissipating heat generated from the semiconductor dies 100, 200 of the semiconductor package P1. For example, a shape of each of the heat dissipating elements 810 and 820 may have a substantially circular shape (on the plane view depicted in FIG. 8A), however the disclosure is not limited thereto. In other embodiments, the shapes of the heat dissipating elements 810 and 820 may be elliptical, oral, square, rectangular or any suitable polygonal shape.

Although not shown, a dispenser is provided over the stencil 80, where the dispenser includes a dispensing opening, for example. The dispensing opening of the dispenser may be able to dispense the heat dissipating elements 810, 820 from the dispenser. For example, the heat dissipating elements 810 are dispensed from the dispenser to respectively dispose into the apertures 82 of the stencil 80 for being in contact with the flux portions 812m, and the heat dissipating elements 820 are dispensed from the dispenser to respectively dispose into the apertures 84 of the stencil 80 for being in contact with the flux portions 822m, as shown in FIG. 6.

However, the foregoing configuration construes no limitation in the disclosure. In alternative embodiments, the flux portions 812m on the metallization layer 700 over the region R1 (e.g. over the semiconductor die 100) may be separately formed from the flux portions 822m on the metallization layer 700 over the regions R2 (e.g. over the semiconductor dies 200).

In one embodiment, a first stencil (not illustrated) having apertures exposing the metallization layer 700 over the region R1 is placed over the semiconductor package P1. The first stencil shields the metallization layer 700 over the regions R2, and the flux portions 812m are applied onto the metallization layer 700 over the region R1. Thereafter, the first stencil is removed and a second stencil (not illustrated) is placed over the semiconductor package P1. The second stencil covers the metallization layer 700 over the region R1 having the flux portions 812m formed thereon, and apertures of the second stencil expose the metallization layer 700 over the regions R2. The flux portions 822m are applied onto the metallization layer 700 over the regions R2 through the apertures of the second stencil. Subsequently, the second stencil may be removed. Under this scenario, the step of applying the flux portions 822m onto the metallization layer 700 over the regions R2 being performed after applying the flux portions 812m onto the metallization layer 700 over the region R1 is completed. In an alternative embodiment, with the similar steps above (by different orders), it is understood that the step of applying the flux portions 812m onto the metallization layer 700 over the region R1 may be performed after the step of applying the flux portions 822m onto the metallization layer 700 over the regions R2. Then, a third stencil may be optionally adopted to facilitate the placement of the heat dissipating elements 810, 820 through the dispenser.

Figure 7:
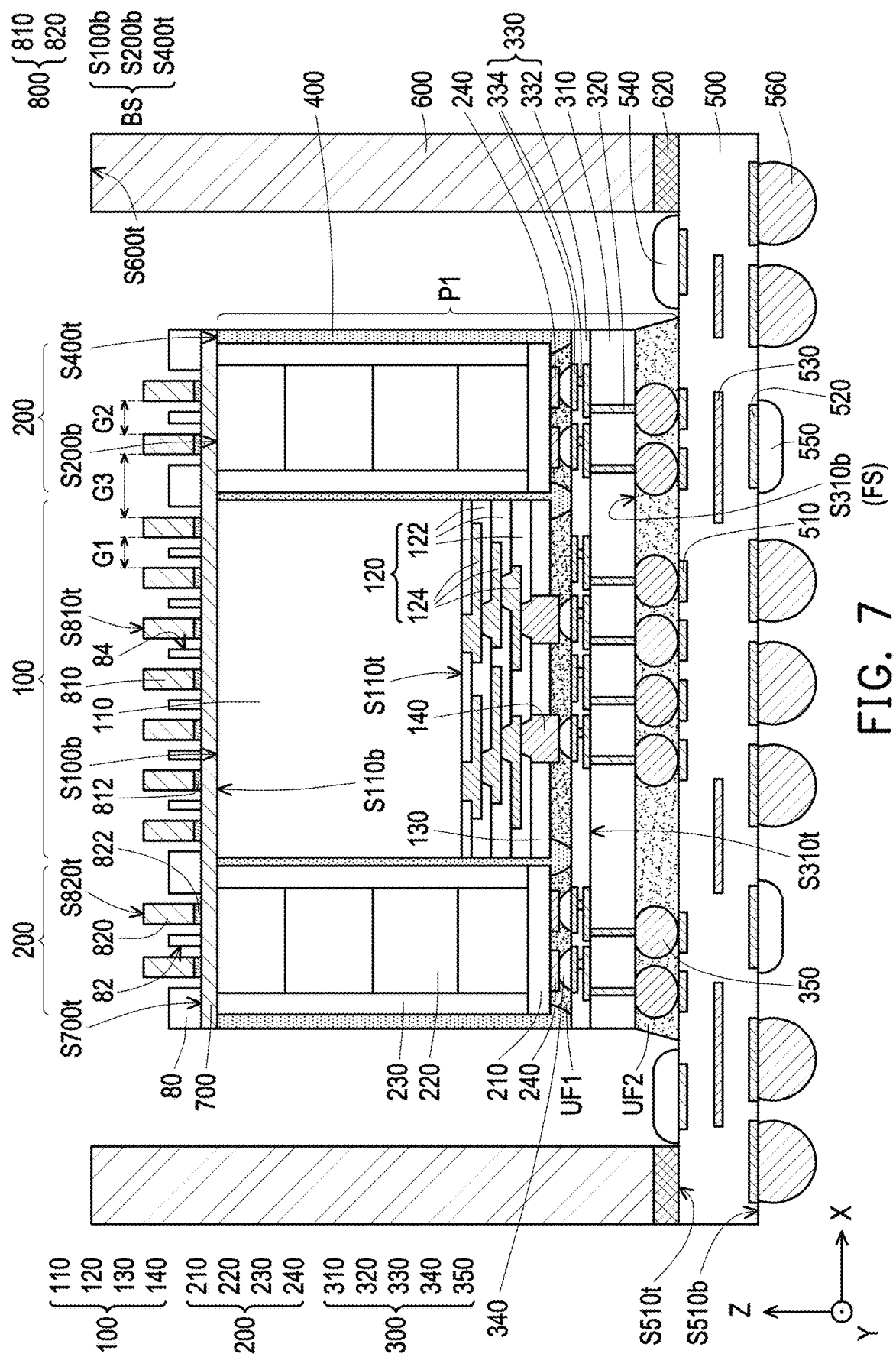
Figure 8A:
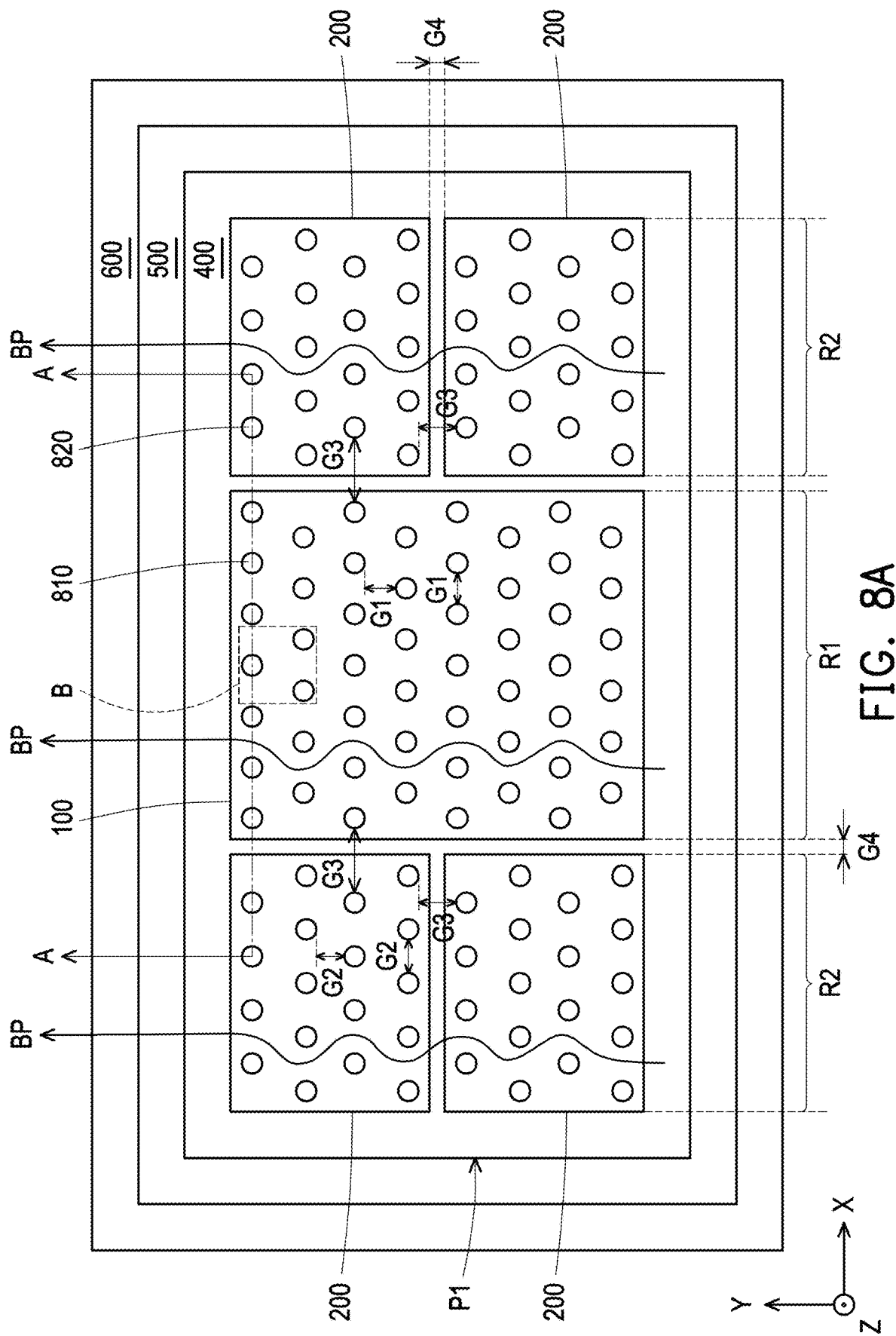
FIG. 8A through FIG. 8D are schematic plane views respectively illustrating a relative position of a semiconductor die and a thermal dissipating element in a semiconductor package module in accordance with some embodiments of the disclosure.
Figure 8B:
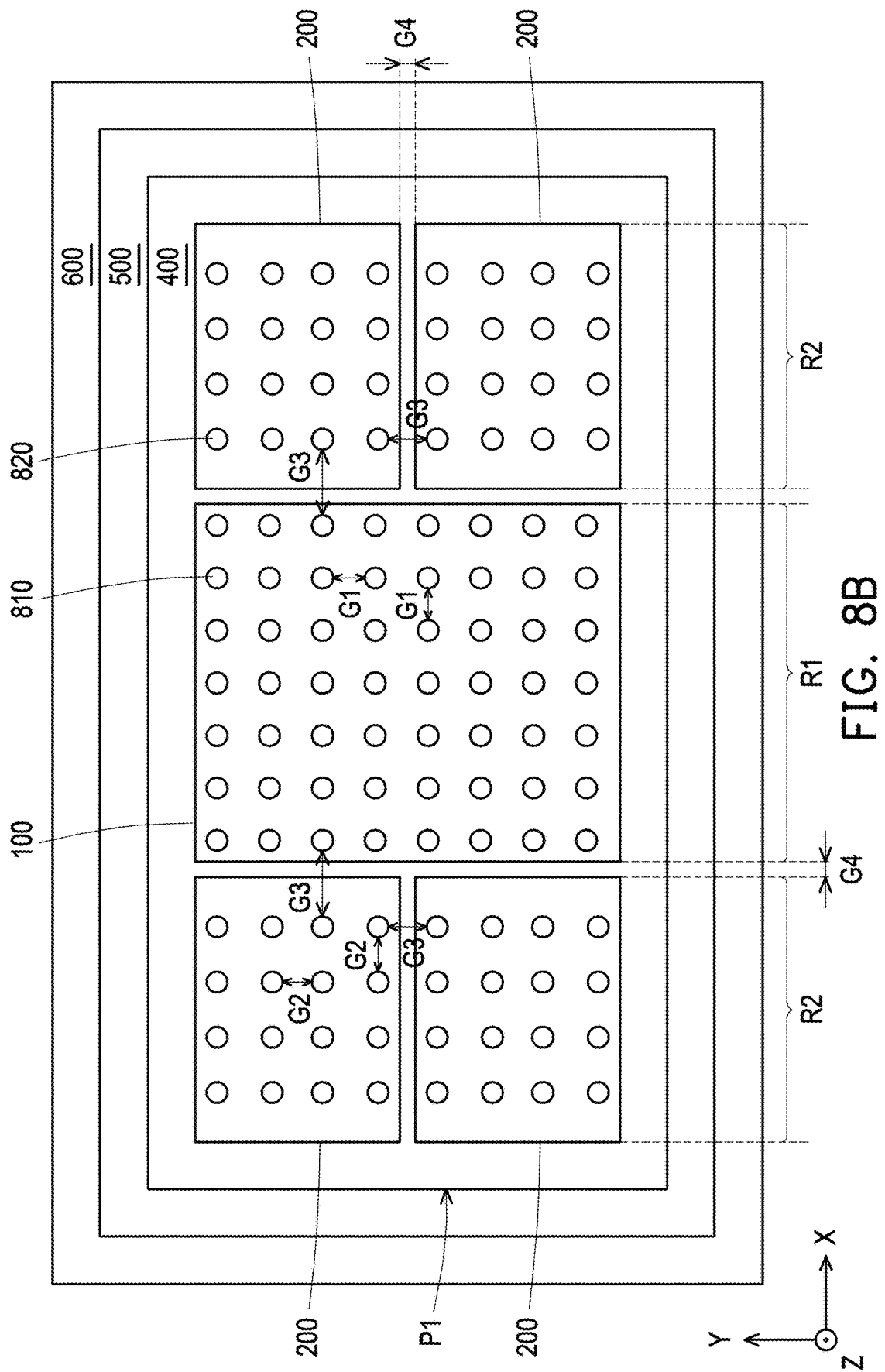
Figure 8C:
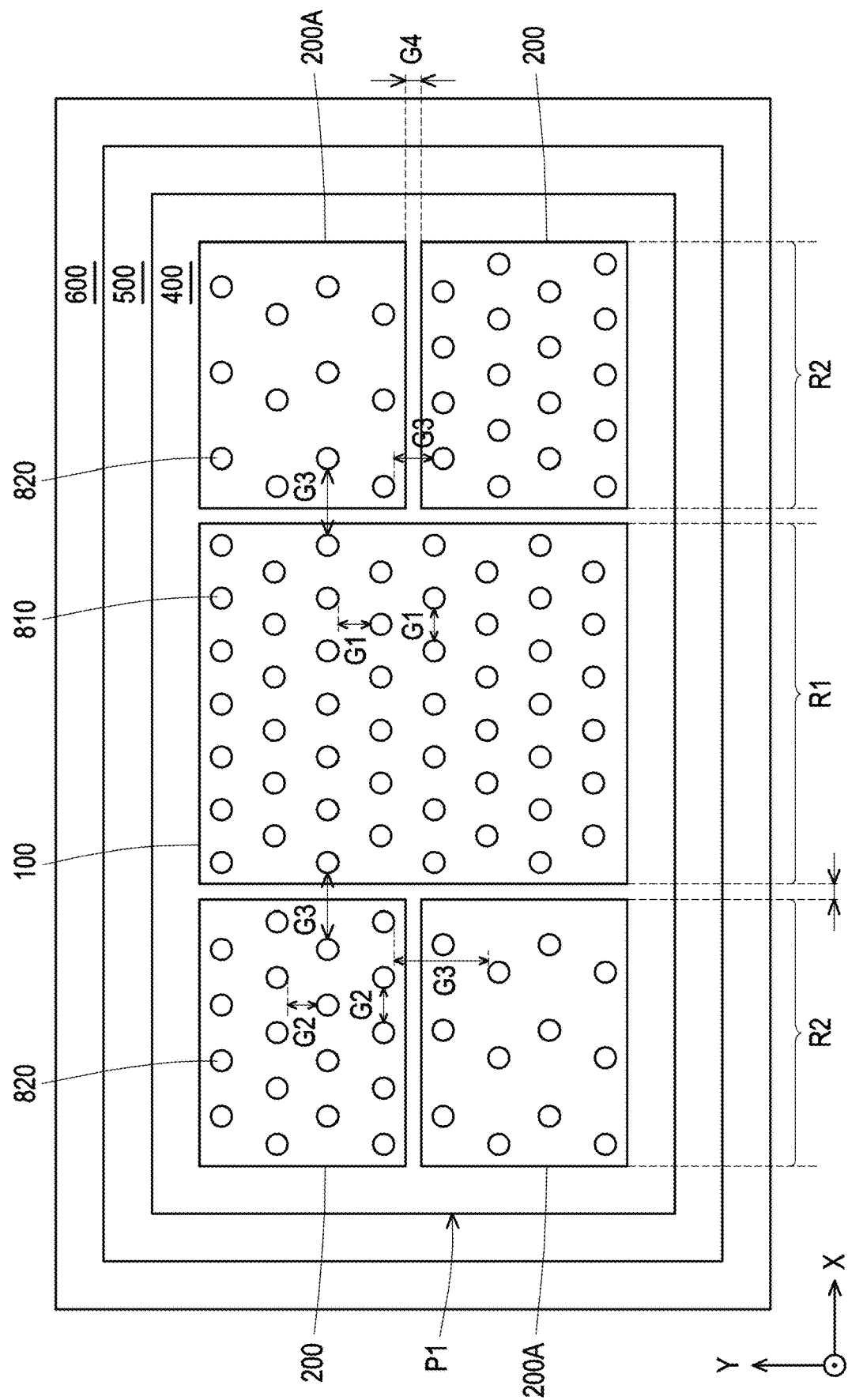
Figure 8D:
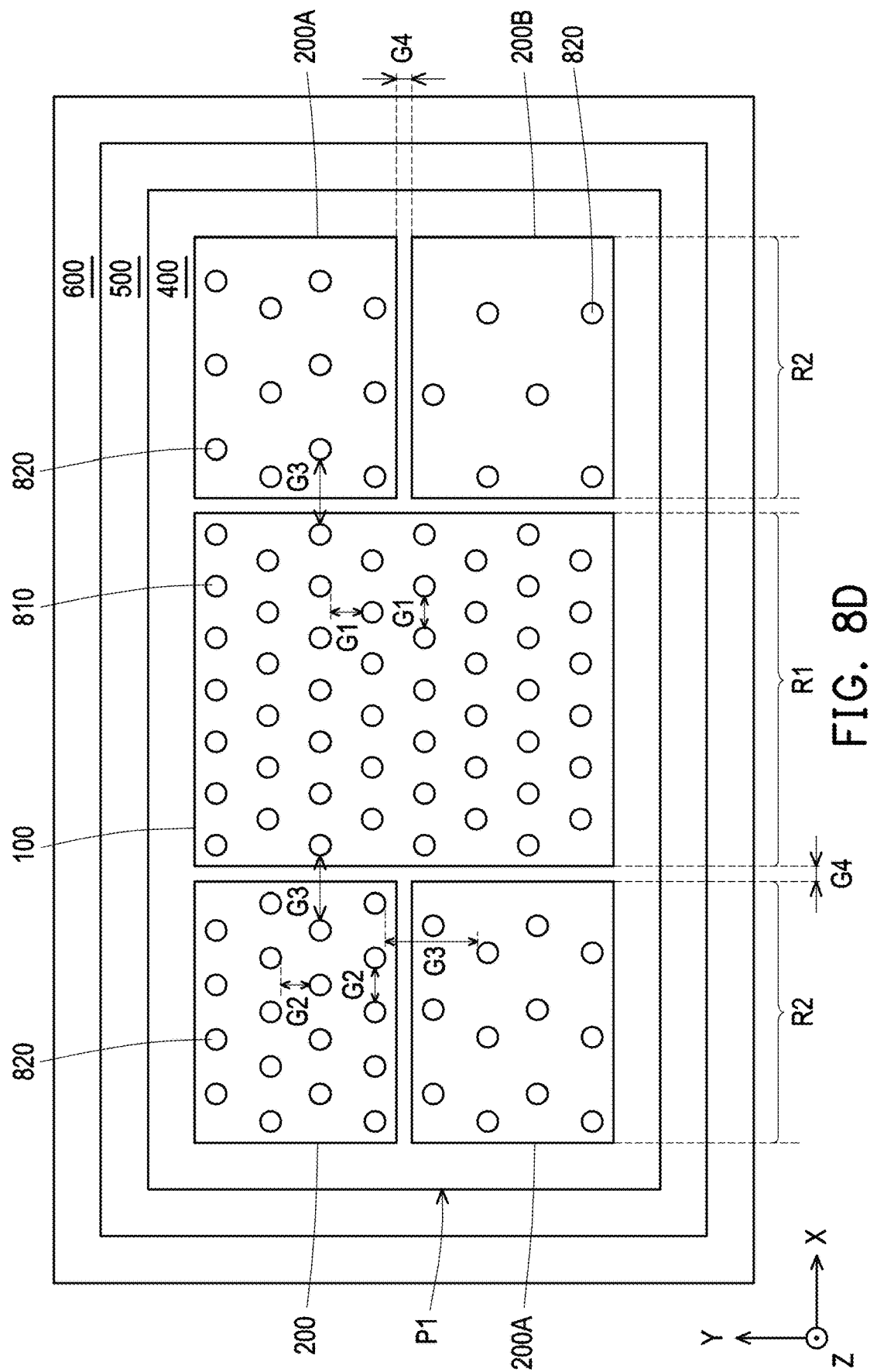

Referring to FIG. 7 in conjunction with FIG. 3, in some embodiments, a reflow process is performed on the flux portions 812m, 822m, such that the heat dissipating elements 810, 820 are connected to the metallization layer 700 through connecting portions 812, 822, respectively. In some embodiments, the heat dissipating elements 810 are thermally coupled to the metallization layer 700 through the connecting portions 812 for thermally coupling to the semiconductor die 100, and the heat dissipating elements 820 are thermally coupled to the metallization layer 700 through the connecting portions 822 for thermally coupling to the semiconductor dies 200, as shown in FIG. 7. The heat dissipating elements 810 may be further electrically coupled to the metallization layer 700 through the connecting portions 812. The heat dissipating elements 820 may be further electrically coupled to the metallization layer 700 through the connecting portions 822. In some embodiments, the metallization layer 700, the connecting portions 812, 822, and the heat dissipating elements 810, 820 are electrically isolated from the semiconductor dies 100, 200 of the semiconductor package P1. Through the metallization layer 700, the heat dissipating elements 810, 820 are thermally coupled to and electrically isolated from the semiconductor dies 100, 200 of the semiconductor package P1 included in the semiconductor package module 1000. The connecting portions 812 and 822 may be independently referred to as a solder joint. In the case, after the reflow process, the stencil 80 is removed from the metallization layer 700. Up to here, the semiconductor package module 1000 of FIG. 3 is manufactured. In some embodiments, the connecting portions 812 and/or 822 are considered as part of the heat dissipating element 800. In the case, the semiconductor package module 1000 is compatible with the current manufacturing process and are designed to be compatible with a two-phase immersion cooling apparatus (e.g., the immersion cooling apparatus 50 as shown in FIG. 2) or a single-phase immersion cooling apparatus (not shown).

The heat dissipating elements 810 and 820 may be referred to as microstructures or array misconstrues disposed on the back side BS of the semiconductor package P1. Due to the heat dissipating elements 810 and 820 are not directly formed from the semiconductor substrate of the semiconductor dies 100, 200 of the semiconductor package P1 and/or not formed of the semiconductor substrate of the semiconductor dies 100, 200 of the semiconductor package P1, a potential die crack near or at the backside surface S100b (e.g. S110b) of the semiconductor die 100 and/or the backside surfaces S200b of the semiconductor dies 200 is suppressed. In addition, due to the heat dissipating elements 810 and 820 are not directly formed from the semiconductor substrate of the semiconductor dies 100, 200 of the semiconductor package P1 and/or not formed of the semiconductor substrate of the semiconductor dies 100, 200 of the semiconductor package P1, the overall die mechanical strength, which overcomes the stress induced from a CTE mismatch during the field operation, can be at least maintained. In other words, for the semiconductor package P1, a reduction in the overall die mechanical strength is avoid.

In some embodiments, each of the heat dissipating elements 810 includes a top surface S810t, a bottom surface (not labeled), and a sidewall SW810 connecting the top surface S810t and the bottom surface, where the bottom surface is opposite to the top surface S810t and in physical contact with a respective one of the connecting portions 812. In some embodiments, as shown in FIG. 3 and FIG. 8A, in a vertical projection on the base side BS of the semiconductor package P1 along the direction Z, a spacing G1 between two adjacent heat dissipating elements 810 in the region R1 (e.g., over the semiconductor die 100) is ranging from about 100 μm to about 5 mm.

In some embodiments, each of the heat dissipating elements 820 includes a top surface S820t, a bottom surface (not labeled), and a sidewall (not labeled) connecting the top surface S820t and the bottom surface, where the bottom surface is opposite to the top surface S820t and in physical contact with a respective one of the connecting portions 822. In some embodiments, as shown in FIG. 3 and FIG. 8A, in the vertical projection on the base side BS of the semiconductor package P1 along the direction Z, a spacing G2 between two adjacent heat dissipating elements 820 in the regions R2 (e.g., over the semiconductor dies 200) is ranging from about 50 μm to about 5 mm.

The spacings G1 and/or G2 adopted for a hot spot (e.g. a heat source generating more heat, such as a logic circuit or the like) may be a first pitch, while the spacings G1 and/or G2 may be adopted for the rest (e.g. a heat source generating less heat, such as a memory circuit, a SerDes circuit, an I/O circuit or the like) may be a second pitch, where the first pitch is less than the second pitch. The first pitch may be referred to as a fine pitch, and the second pitch may be referred to a coarse pitch.

In some embodiments, as shown in FIG. 3 and FIG. 8A, in the vertical projection on the base side BS of the semiconductor package P1 along the direction Z, a spacing G3 between one heat dissipating element 810 in the regions R1 (e.g., over the semiconductor die 100) and one heat dissipating element 820 in the regions R2 (e.g., over one semiconductor die 200) adjacent thereto is ranging from about 50 μm to about 5 mm. As shown in FIG. 3 and FIG. 8A, in the vertical projection on the base side BS of the semiconductor package P1 along the direction Z, the semiconductor dies 100 and 200 may be separated from each other by a distance G4 ranging from about 50 μm to about 5 mm.

As shown in FIG. 8A, the rising vapors described in FIG. 2 may move along the bubble path BP which passing through the spaces of the heat dissipating elements 810, 820, where the heat generated from the semiconductor package P1 is then removed through the heat dissipating elements 810, 820 (in a vertical direction) and the metallization layer 700 (in a horizontal direction), for example. In the case, an interface material (TIM) and a lid disposed on the TIM are omitted from the disclosure, such that the thermal resistance caused by the TIM and/or the lid is eliminated from the semiconductor package module 1000, thereby obtaining a direct heat removal from a heat source (e.g. the semiconductor dies 100, 200 of the semiconductor package P1), with a higher heat flux.

The configuration of the microstructures included in the heat dissipating element disposed in the region R1 may be substantially identical to the configuration of the microstructures included in the heat dissipating element disposed in the regions R2. Alternatively, the configuration of the microstructures included in the heat dissipating element disposed in the region R1 may be different from the configuration of the microstructures included in the heat dissipating element disposed in the regions R2.

It is appreciated that, the thermal dissipation efficiency of the heat dissipating elements 810, 820 may be controlled by a placing arrangement of the heat dissipating elements 810 and/or 820. By adjusting the placing arrangement of the heat dissipating elements 810 and/or 820, the bubble path BP may be established with a proper trajectory of a bubble (e.g. the rising vapors in FIG. 2) flow (or movement), thereby suppressing a potential dry-out near or at the surfaces of the heat dissipating elements 810 and 820.

For example, the heat dissipating elements 810 disposed over the semiconductor die 100 are into a matrix form, where the heat dissipating elements 810 are arranged in a staggered form in the direction X and in the direction Y, as shown in FIG. 8A. For another example, the heat dissipating elements 810 disposed over the semiconductor die 100 are into a matrix form, where the heat dissipating elements 810 are arranged in an alignment form in the direction X and in the direction Y, as shown in FIG. 8B. However, the disclosure is not limited thereto; alternatively, the heat dissipating elements 810 disposed over the semiconductor die 100 may be arranged in a concentric form or a random form.

Similarly, for example, the heat dissipating elements 820 disposed over each semiconductor die 200 are into a matrix form, where the heat dissipating elements 820 are arranged in a staggered form in the direction X and in the direction Y, as shown in FIG. 8A. For another example, the heat dissipating elements 820 disposed over each semiconductor die 200 are into a matrix form, where the heat dissipating elements 820 are arranged in an alignment form in the direction X and in the direction Y, as shown in FIG. 8B. However, the disclosure is not limited thereto; alternatively, the heat dissipating elements 820 disposed over each semiconductor die 200 may be arranged in a concentric form or a random form.

It is appreciated that, the thermal dissipation efficiency of the heat dissipating elements 810, 820 may be controlled by a pattern density (or referred to as a unit density) of the heat dissipating elements 810 and/or 820. By adjusting the pattern density of the heat dissipating elements 810 and/or 820, more heat dissipating area can be provided to a heat source generating more heat while less heat dissipating area can be provided to a heat source generating less heat, thereby obtaining a better efficiency for heat dissipating without damaging the control of manufacturing budget.

For example, the heat dissipating elements 810 disposed over the semiconductor die 100 has a pattern density being substantially identical to that of the heat dissipating elements 820 disposed over each semiconductor die 200, as shown in FIG. 8A and FIG. 8B. However, the disclosure is not limited thereto; alternatively, the heat dissipating elements 810 disposed over the semiconductor die 100 has a pattern density being greater than that of the heat dissipating elements 820 disposed over each semiconductor die 200. In the alternative case, the semiconductor die 100 includes a logic circuit, and the semiconductor die 200 includes a memory circuit.

Alternatively, the heat dissipating elements 810 disposed over the semiconductor die 100 has a pattern density being greater than or substantially identical to that of the heat dissipating elements 820 disposed over each semiconductor die 200 and being greater than that of the heat dissipating elements 820 disposed over each semiconductor die 200A. The semiconductor dies 200A may be similar to or substantially identical to the semiconductor dies 200, and thus are not repeated herein for brevity. For example, the pattern density of heat dissipating elements 810 disposed over the semiconductor die 100 is substantially equal to that of the heat dissipating elements 820 disposed over each semiconductor die 200, and the pattern density of the heat dissipating elements 820 disposed over each semiconductor die 200 is greater than that of the heat dissipating elements 820 disposed over each semiconductor die 200A, as shown in FIG. 8C. In the case, the semiconductor die 100 includes a logic circuit, the semiconductor dies 200 independently includes a memory circuit, and the semiconductor dies 200A independently includes a SerDes circuit.

Or alternatively, the heat dissipating elements 810 disposed over the semiconductor die 100 has a pattern density being greater than or substantially identical to that of the heat dissipating elements 820 disposed over one semiconductor die 200, being greater than that of the heat dissipating elements 820 disposed over each semiconductor die 200A and that of the heat dissipating elements 820 disposed over one semiconductor die 200B. The semiconductor dies 200A, 200B may be similar to or substantially identical to the semiconductor dies 200, and thus are not repeated herein for brevity. For example, the pattern density of heat dissipating elements 810 disposed over the semiconductor die 100 is substantially equal to that of the heat dissipating elements 820 disposed over the semiconductor die 200, the pattern density of the heat dissipating elements 820 disposed over the semiconductor die 200 is greater than that of the heat dissipating elements 820 disposed over each semiconductor die 200A, and the pattern density of the heat dissipating elements 820 disposed over each semiconductor die 200A is greater than that of the heat dissipating elements 820 disposed over the semiconductor die 200B, as shown in FIG. 8D. In the case, the semiconductor die 100 includes a logic circuit, the semiconductor die 200 includes a memory circuit, the semiconductor dies 200A independently include a SerDes circuit, and the semiconductor die 200B includes an I/O circuit.

Referring to FIG. 9 through FIG. 40, certain structural features including a portion of the metallization layer 700, the connecting portions 812 and the heat dissipating elements 810 are stressed for illustration purposes, and only few heat dissipating elements 810 are shown in the drawings for easy illustration. However, it is understood that, in the disclosure, the modifications described in FIG. 9 through FIG. 40 to one or more than one of the heat dissipating elements 810 can also be adopted by one or more than one of the heat dissipating elements 820, and are not repeated herein for brevity.

FIG. 9, FIG. 11, FIG. 13, FIG. 15 and FIG. 17 are schematic three-dimensional side-views respectively illustrating various shapes of a thermal dissipating element in accordance with some embodiments of the disclosure. FIG. 10, FIG. 12, FIG. 14, FIG. 16 and FIG. 18 are schematic top views of the thermal dissipating elements respectively depicted in FIG. 9, FIG. 11, FIG. 13, FIG. 15 and FIG. 17. FIG. 19 through FIG. 23 are schematic three-dimensional side-views respectively illustrating various configurations of a thermal dissipating element with a slit in accordance with some embodiments of the disclosure. It is appreciated that, the thermal dissipation efficiency of the heat dissipating elements 810, 820 may be controlled by a shape of the heat dissipating elements 810 and/or 820. By adjusting the shape of the heat dissipating elements 810 and/or 820, not only provides more heat dissipating area to a heat source generating more heat, but the bubble path BP can also be established with a further proper trajectory of a bubble flow, thereby obtaining a better efficiency for heat dissipating.

Figure 10:
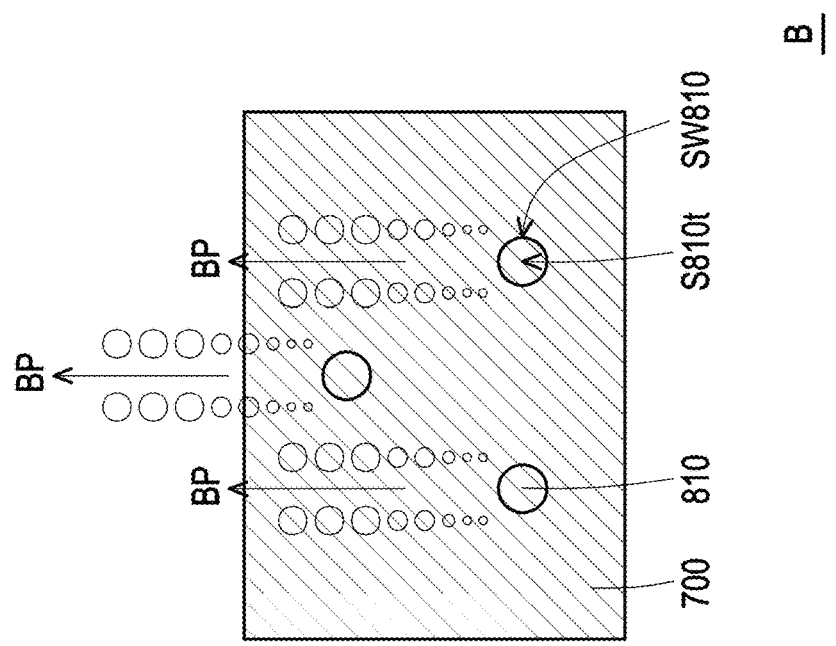
FIG. 10, FIG. 12, FIG. 14, FIG. 16 and FIG. 18 are schematic top views of the thermal dissipating elements respectively depicted in FIG. 9, FIG. 11, FIG. 13, FIG. 15 and FIG. 17.
Figure 9:
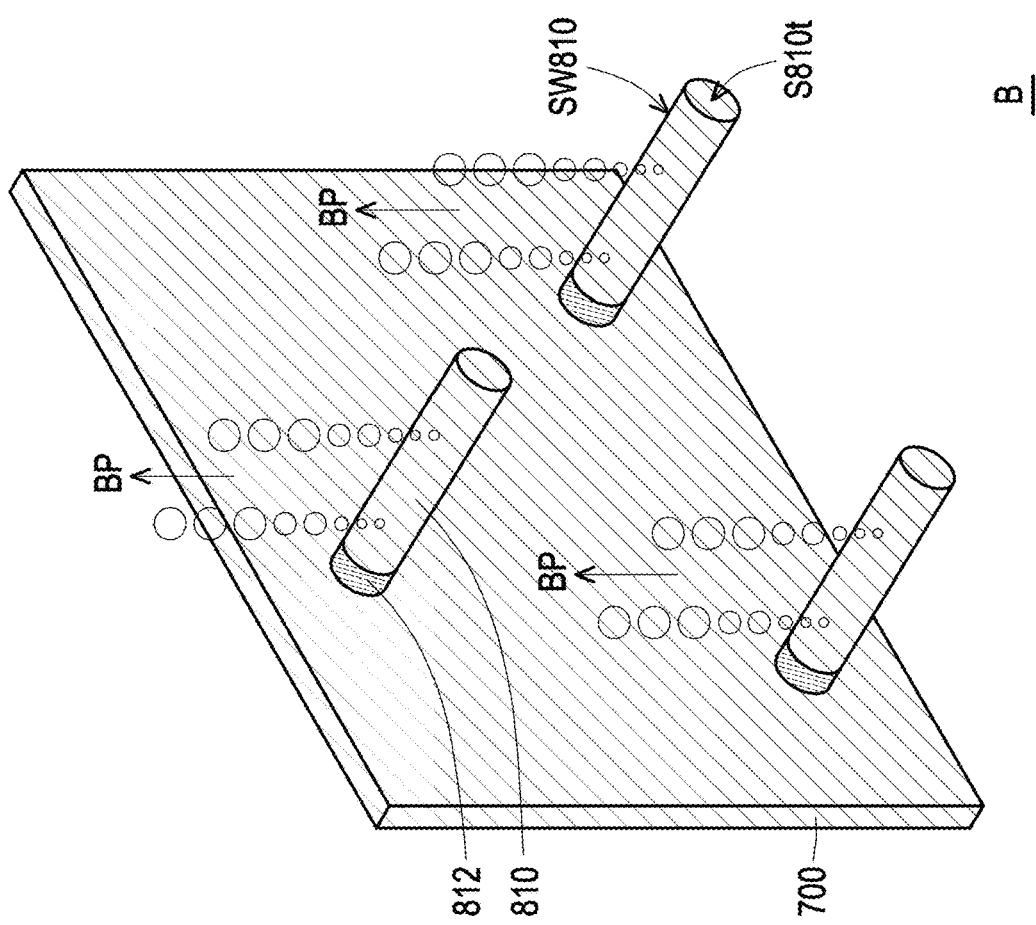
FIG. 9, FIG. 11, FIG. 13, FIG. 15 and FIG. 17 are schematic three-dimensional side-views respectively illustrating various shapes of a thermal dissipating element in accordance with some embodiments of the disclosure.
Figure 19:
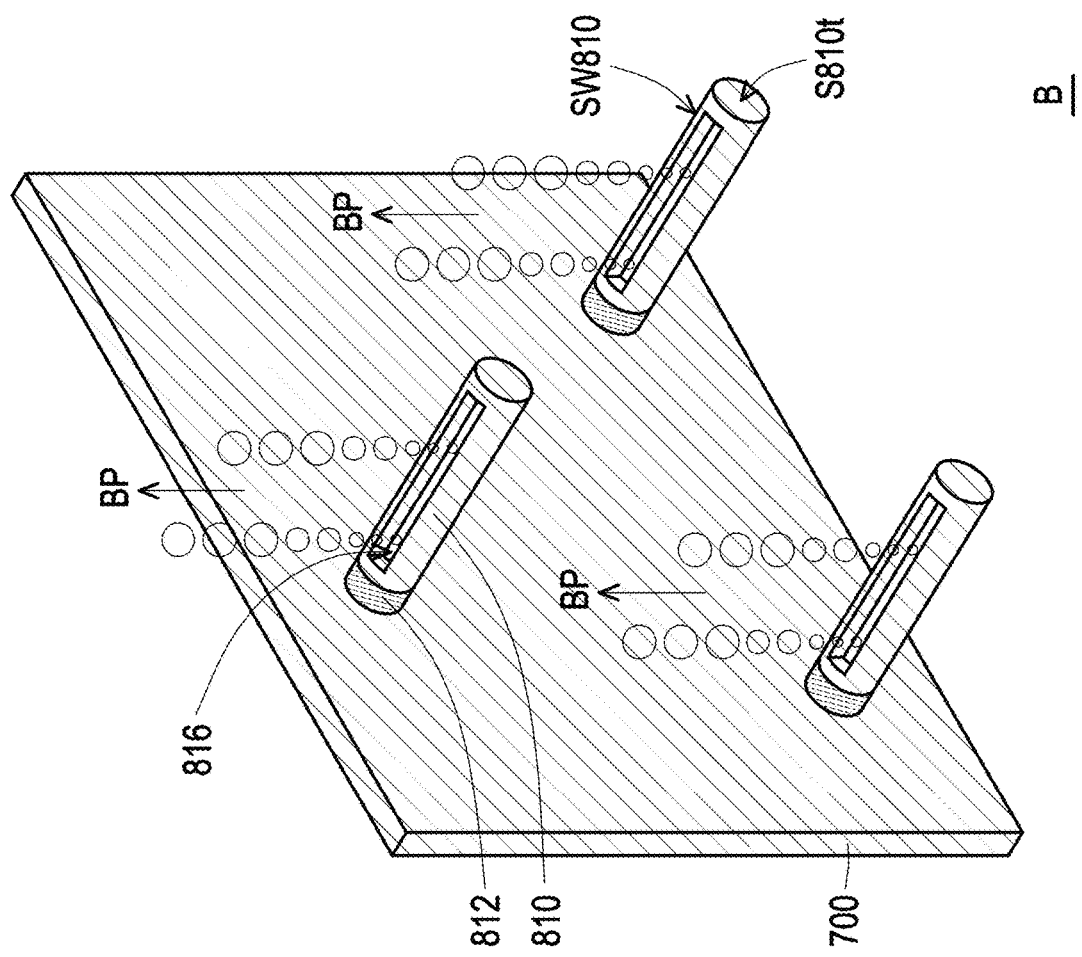
FIG. 19 through FIG. 23 are schematic three-dimensional side-views respectively illustrating various configurations of a thermal dissipating element with a slit in accordance with some embodiments of the disclosure.

As shown in FIG. 9 and FIG. 10, for example, the heat dissipating elements 810 are in a column form, where the cross-section of the heat dissipating elements 810 in the plane view (e.g. the X-Y plane) is a circular shape. Alternatively, the heat dissipating elements 810 may be in a column form having the cross-section (in the plane view) of an elliptical shape or the like. In addition, the heat dissipating elements 810 may include one or more than one slit 186. For example, the heat dissipating elements 810 independently include one slit 186, as shown in FIG. 19. However, the number of the slit 186 presented in one heat dissipating element 810 may be zero, one or more than one, and is not limited to the drawings of the disclosure. In alternative embodiments, the heat dissipating elements 810 independently include multiple slits 186 being parallel to each other. In further alternative embodiments, some of the heat dissipating elements 810 independently include one or more than one slit 186, and rest of the heat dissipating elements 810 independently include no slit 186. For example, as shown in FIG. 8A and FIG. 19, each slit 186 penetrates through a respective one heat dissipating element 810 along one direction extending in the X-Y plane.

Figure 12:
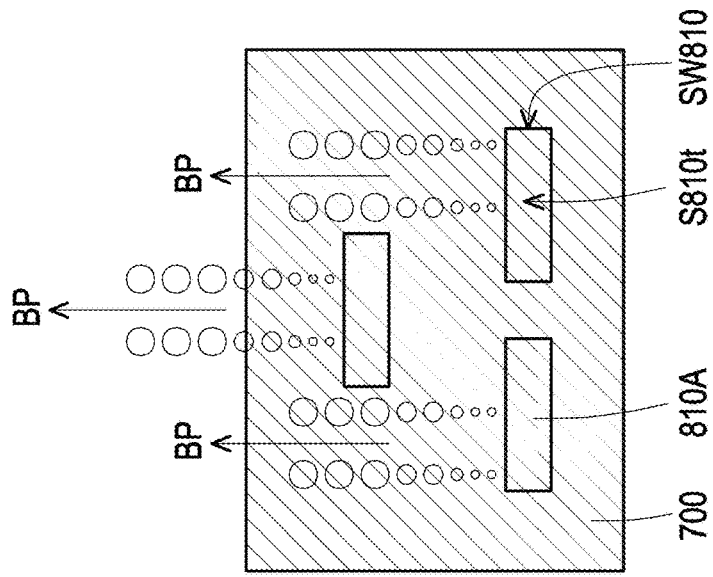
Figure 11:
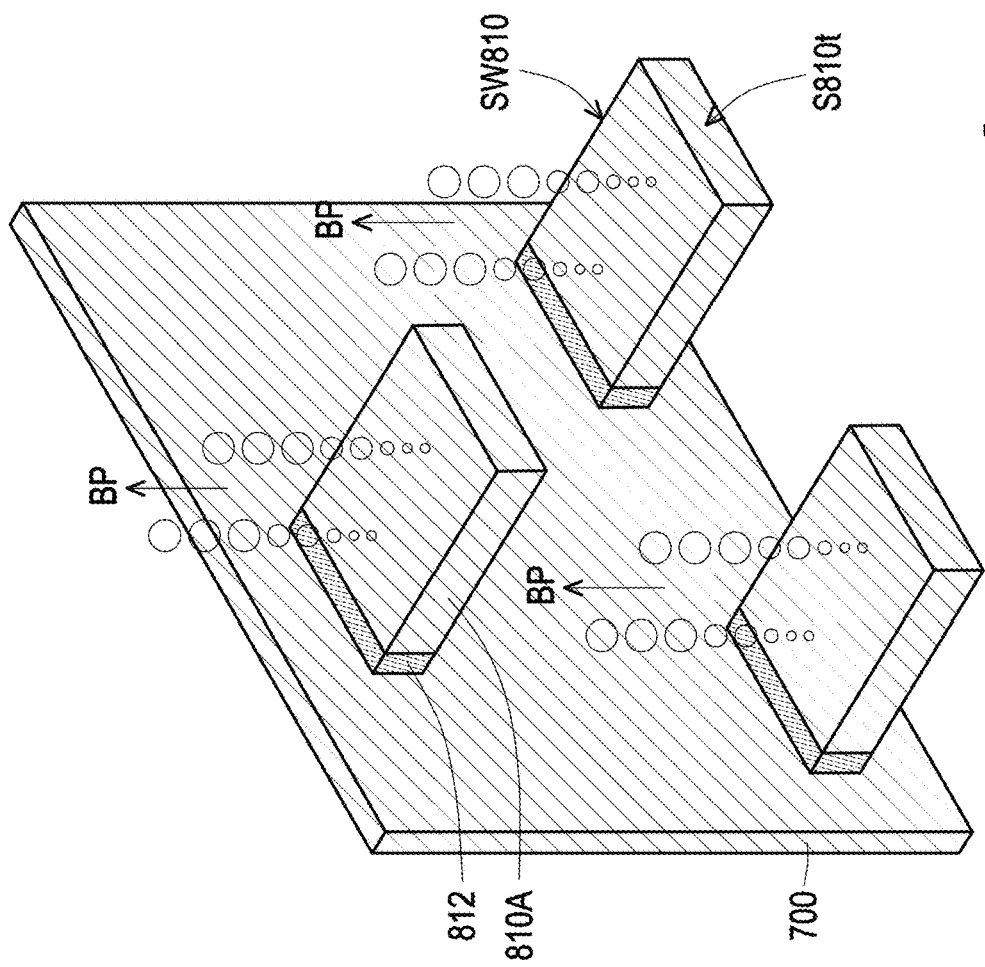
Figure 20:
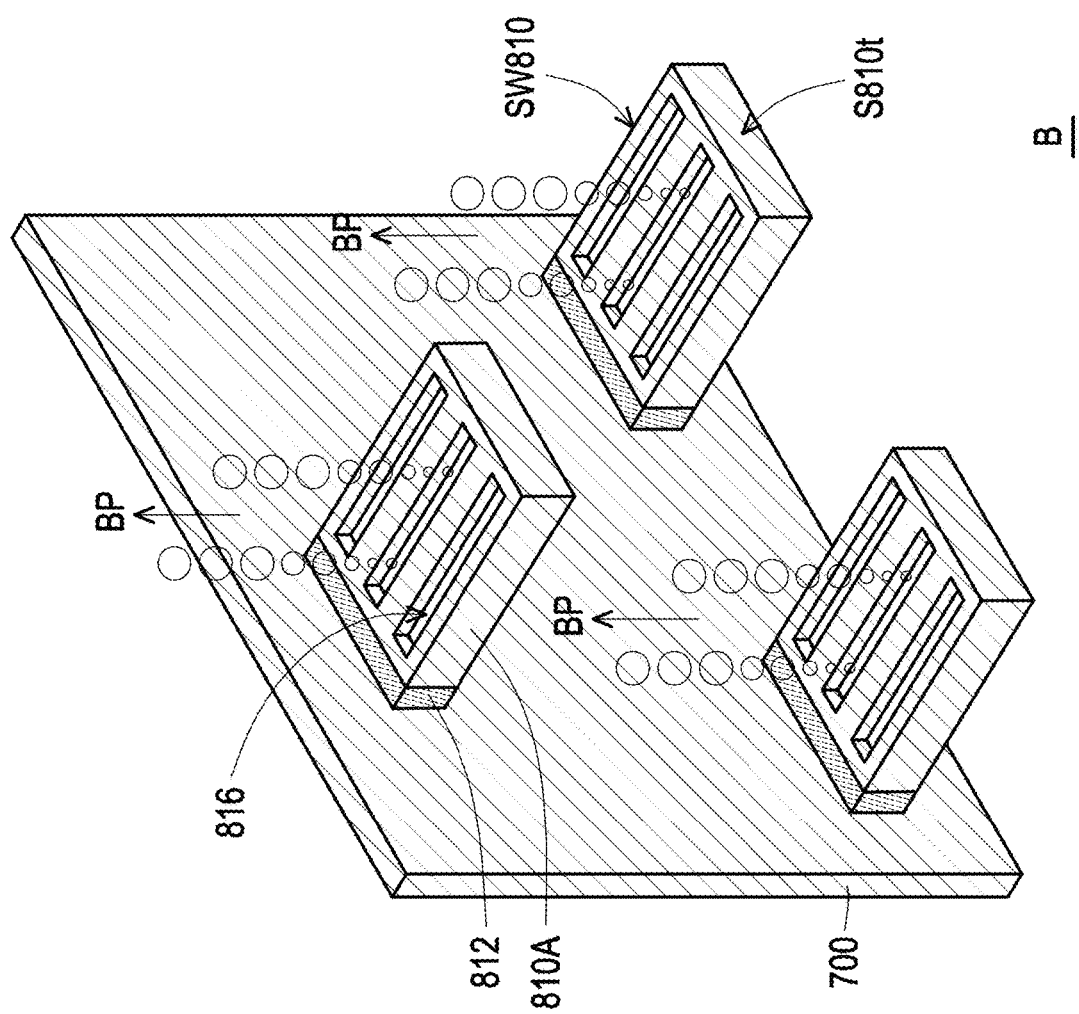

The heat dissipating elements 810 may be substituted by heat dissipating elements 810A, as shown in FIG. 11 and FIG. 12. For example, the heat dissipating elements 810A are in a column form, and the cross-section of the heat dissipating elements 810A in the plane view (e.g. the X-Y plane) is a planar wall-like shape with sharp corners. Alternatively, the heat dissipating elements 810A may be in a column form having the cross-section (in the plane view) of a planar wall-like shape with rounded corners. In addition, the heat dissipating elements 810A may include one or more than one slit 186. For example, the heat dissipating elements 810A independently include multiple slits 186, as shown in FIG. 20. However, the number of the slit 186 presented in one heat dissipating element 810A may be zero, one or more than one, and is not limited to the drawings of the disclosure. In alternative embodiments, the heat dissipating elements 810A independently include one slit 186. In further alternative embodiments, some of the heat dissipating elements 810A independently include one or more than one slit 186, and rest of the heat dissipating elements 810A independently include no slit 186. For example, as shown in FIG. 8A and FIG. 20, each slit 186 penetrates through a respective one heat dissipating element 810A along one direction extending in the X-Y plane.

Figure 14:
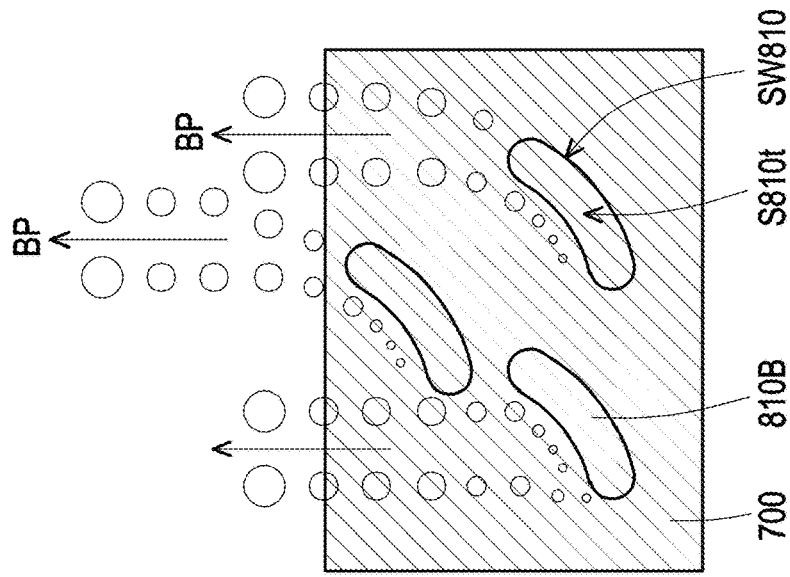
Figure 13:
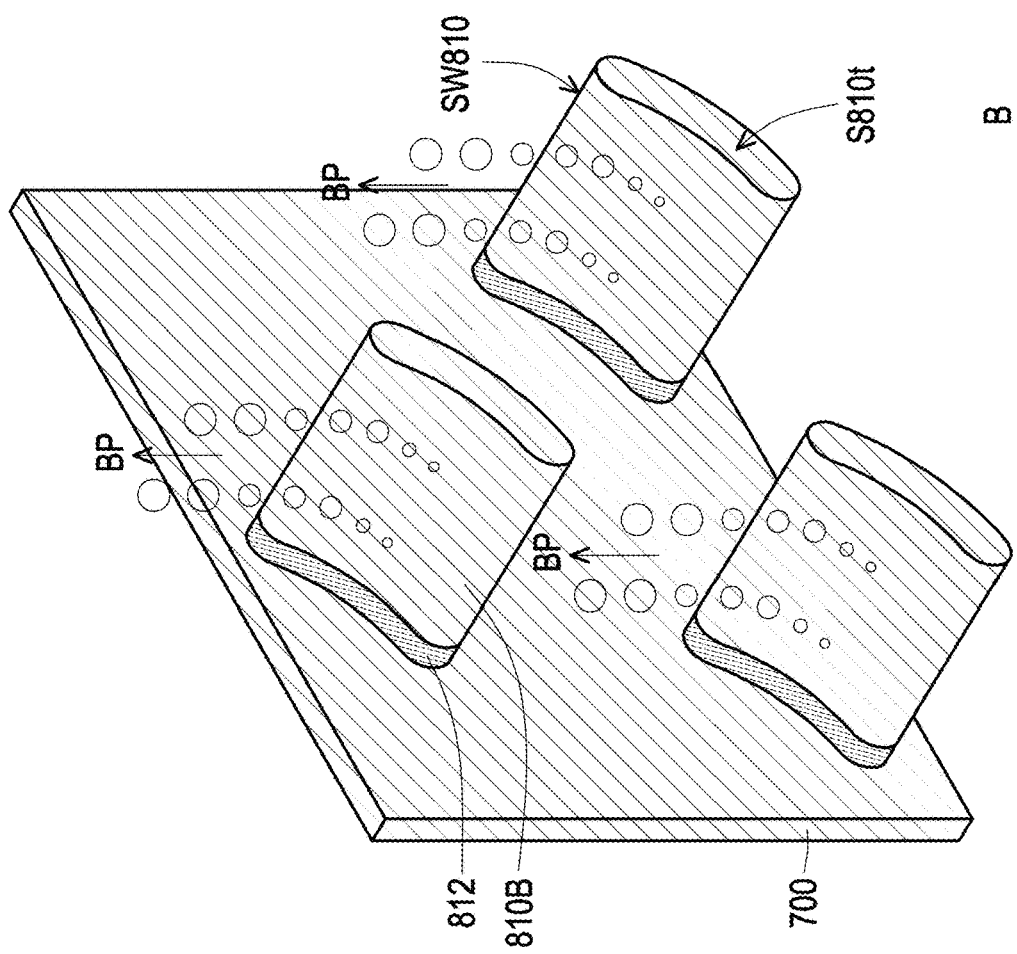
Figure 21:
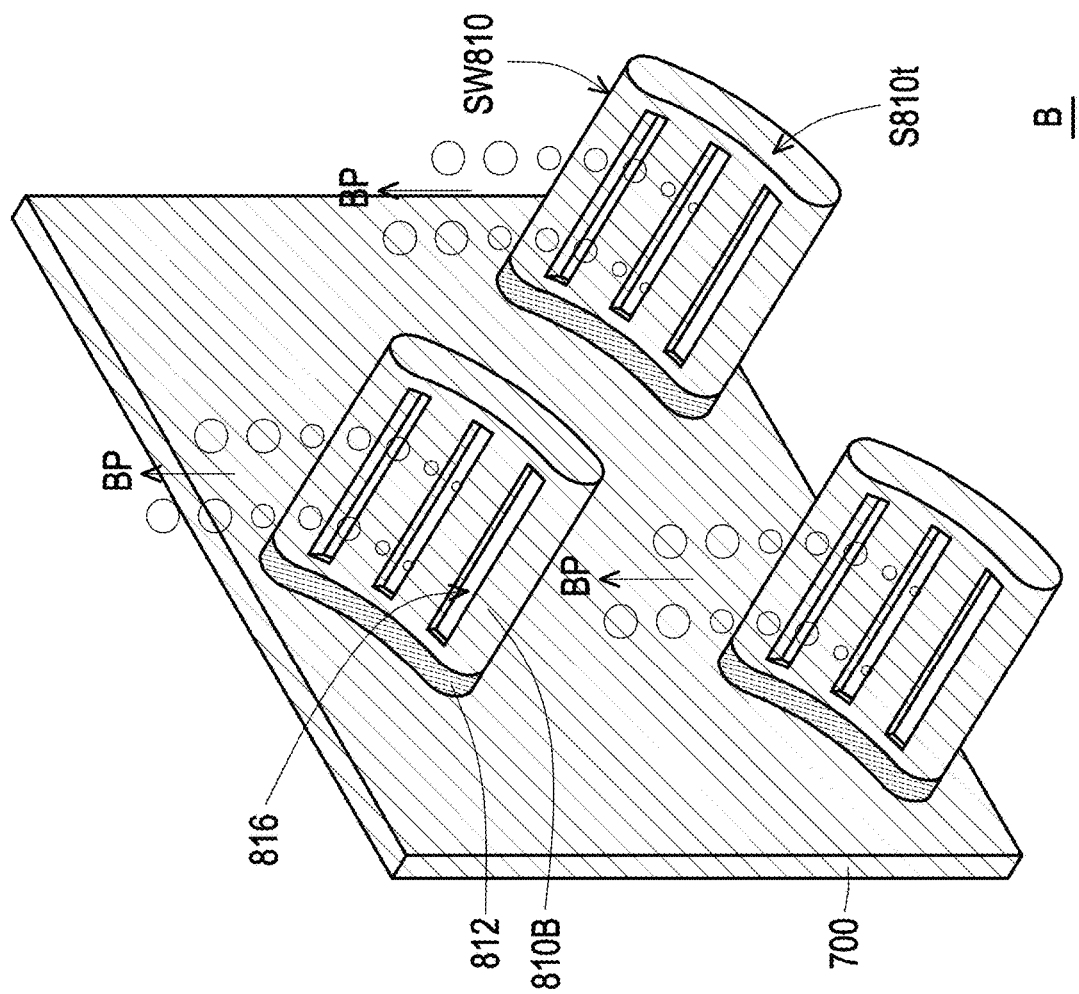

The heat dissipating elements 810 may be substituted by heat dissipating elements 810B, as shown in FIG. 13 and FIG. 14. For example, the heat dissipating elements 810B are in a column form, and the cross-section of the heat dissipating elements 810B in the plane view (e.g. the X-Y plane) is a curved wall-like shape with rounded corners. Alternatively, the heat dissipating elements 810B may be in a column form having the cross-section (in the plane view) of a curved wall-like shape with sharp corners. In addition, the heat dissipating elements 810B may include one or more than one slit 186. For example, the heat dissipating elements 810B independently include multiple slits 186, as shown in FIG. 21. However, the number of the slit 186 presented in one heat dissipating element 810B may be zero, one or more than one, and is not limited to the drawings of the disclosure. In alternative embodiments, the heat dissipating elements 810B independently include one slit 186. In further alternative embodiments, some of the heat dissipating elements 810B independently include one or more than one slit 186, and rest of the heat dissipating elements 810B independently include no slit 186. For example, as shown in FIG. 8A and FIG. 21, each slit 186 penetrates through a respective one heat dissipating element 810B along one direction extending in the X-Y plane.

Figure 16:
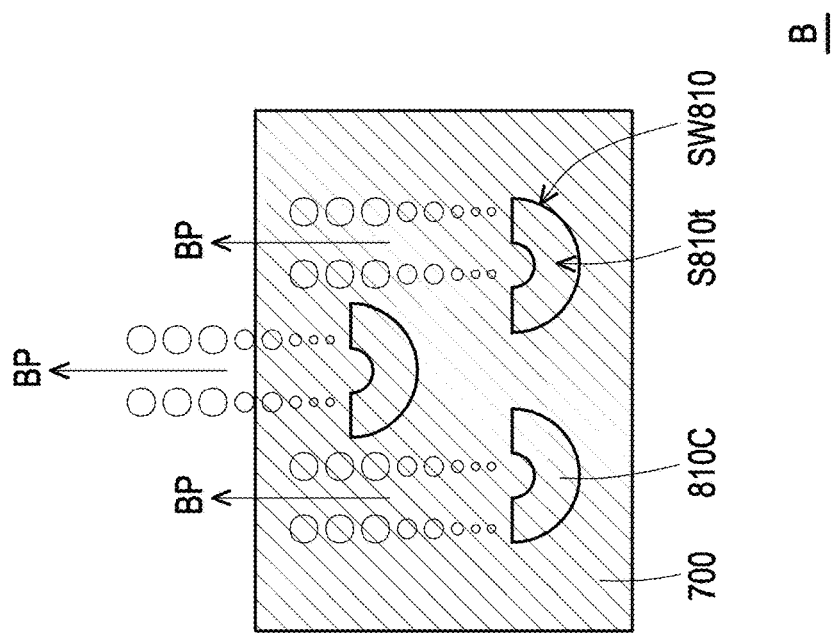
Figure 15:
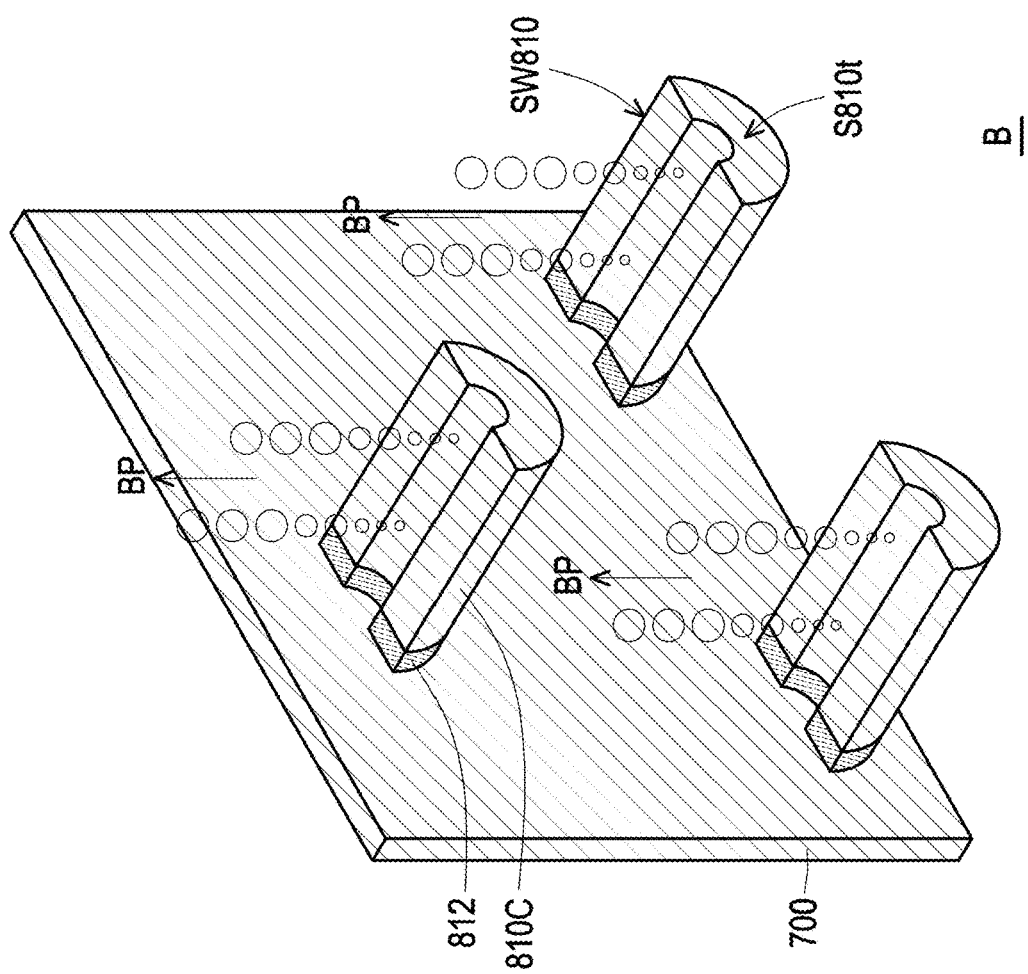
Figure 22:
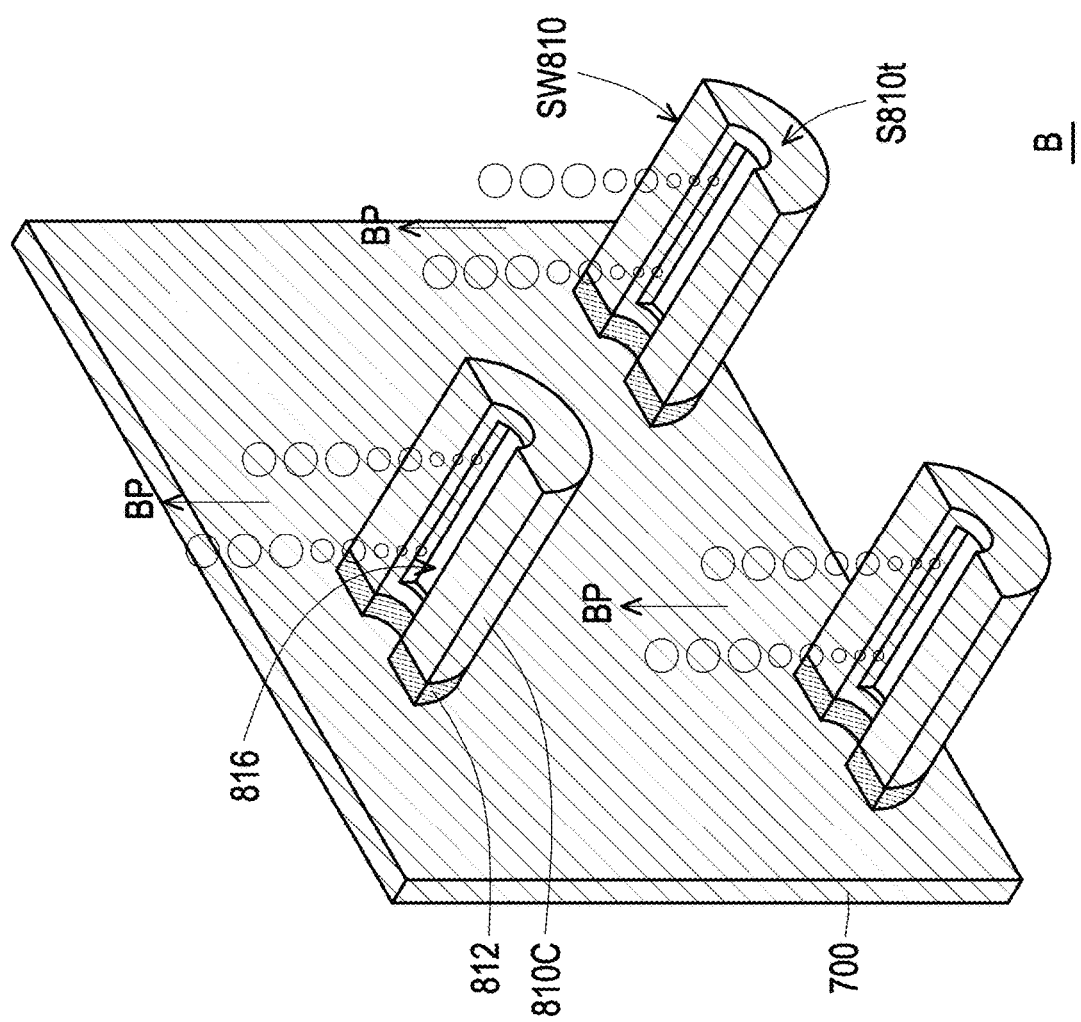

The heat dissipating elements 810 may be substituted by heat dissipating elements 810C, as shown in FIG. 15 and FIG. 16. For example, the heat dissipating elements 810C are in a column form, and the cross-section of the heat dissipating elements 810C in the plane view (e.g. the X-Y plane) is a semi-annulus-like shape with sharp corners. Alternatively, the heat dissipating elements 810C may be in a column form having the cross-section (in the plane view) of a semi-annulus-like shape with rounded corners. In addition, the heat dissipating elements 810C may include one or more than one slit 186. For example, the heat dissipating elements 810C independently include one slit 186, as shown in FIG. 22. However, the number of the slit 186 presented in one heat dissipating element 810C may be zero, one or more than one, and is not limited to the drawings of the disclosure. In alternative embodiments, the heat dissipating elements 810C independently include multiple slits 186 being parallel to each other. In further alternative embodiments, some of the heat dissipating elements 810C independently include one or more than one slit 186, and rest of the heat dissipating elements 810C independently include no slit 186. For example, as shown in FIG. 8A and FIG. 22, each slit 186 penetrates through a respective one heat dissipating element 810C along one direction extending in the X-Y plane.

Figure 18:
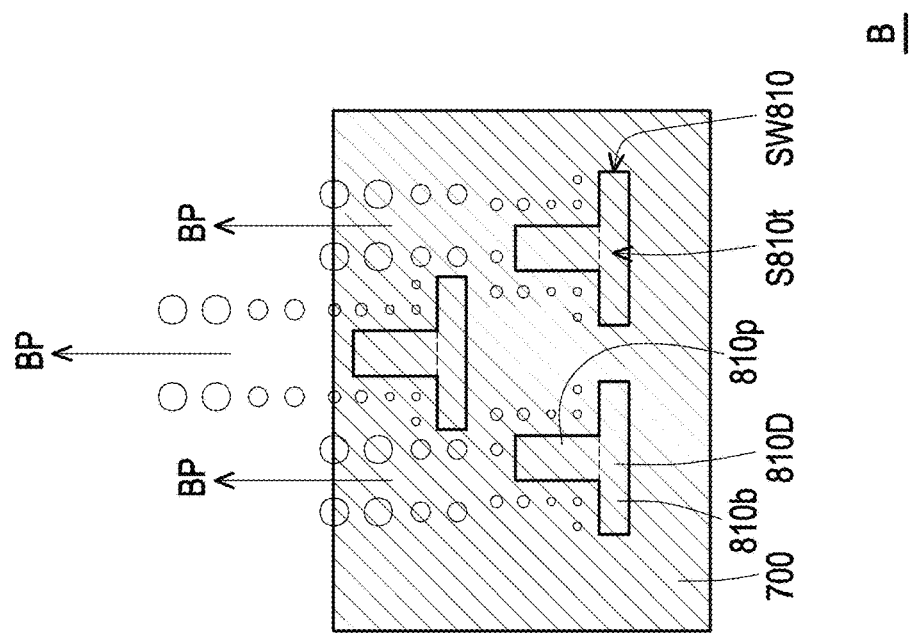
Figure 17:
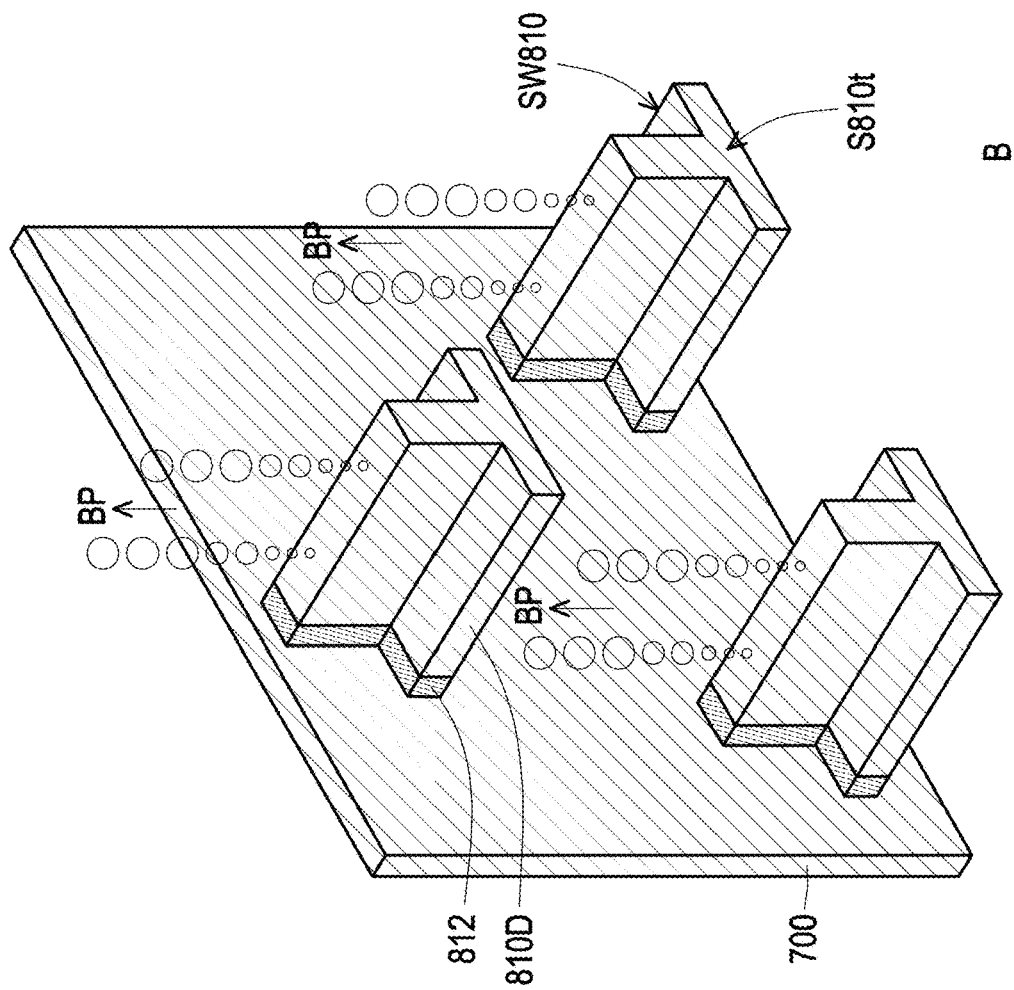
Figure 23:
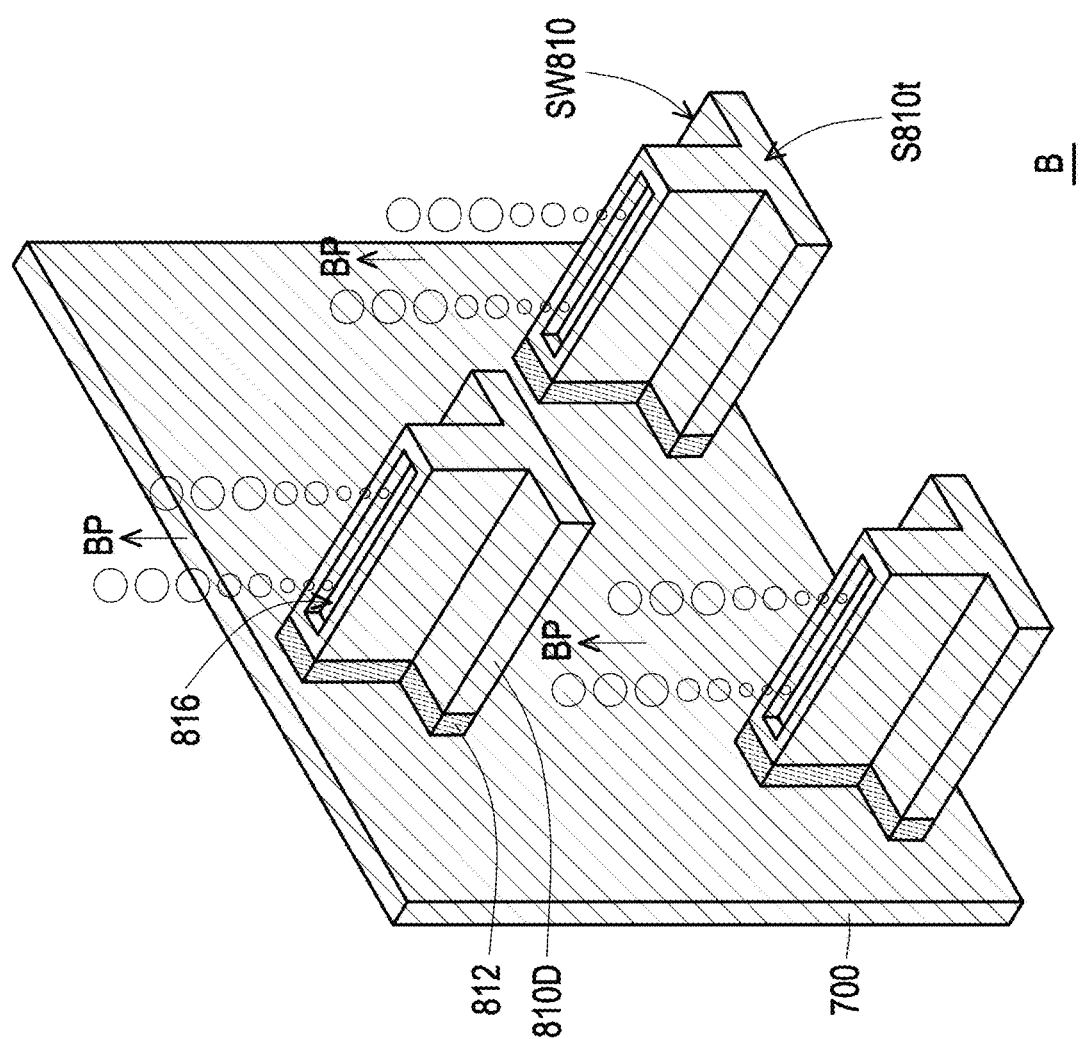

The heat dissipating elements 810 may be substituted by heat dissipating elements 810D, as shown in FIG. 17 and FIG. 18. For example, the heat dissipating elements 810D are in a column form, and the cross-section of the heat dissipating elements 810D in the plane view (e.g. the X-Y plane) is a fin-like shape (for example, a T-shape) with sharp corners. For example, as shown in FIG. 18, the heat dissipating elements 810D each include a base 810b and at least one protrusion 810p standing on the base 810b and protruding away therefrom. The protrusion 810p may be referred to as a fin. Although only one protrusion 810p is shown in FIG. 18 for illustrative purposes, the number of the protrusion 810p may be one or more than on; the disclosure is not limited thereto. Alternatively, the heat dissipating elements 810D may be in a column form having the cross-section (in the plane view) of a fin-like shape with rounded corners. In addition, the heat dissipating elements 810D may include one or more than one slit 186. For example, the heat dissipating elements 810D independently include one slit 186, as shown in FIG. 23. However, the number of the slit 186 presented in one heat dissipating element 810D may be zero, one or more than one, and is not limited to the drawings of the disclosure. In alternative embodiments, the heat dissipating elements 810D independently include multiple slits 186 being parallel to each other. In further alternative embodiments, some of the heat dissipating elements 810D independently include one or more than one slit 186, and rest of the heat dissipating elements 810D independently include no slit 186. For example, as shown in FIG. 8A and FIG. 23, each slit 186 penetrates through a respective one heat dissipating element 810D along one direction extending in the X-Y plane. The slit(s) 186 may pass through the heat dissipating element 810D by penetrating through the base 810b or a combination of the base 810a and the protrusion 810p.

With the presence of one or more slit(s) 186, additional heat dissipating area can be further provided by the heat dissipating elements 810, 810A, 810B, 810C, 810D, thereby further enhancing the heat dissipation efficiency. In the other hands, the bubble path BP may pass through the heat dissipating elements 810, 810A, 810B, 810C, 810D via the slit(s) 186, which may allow more thermal energy being carried away from the heat dissipating elements 810, 810A, 810B, 810C, 810D by the dielectric coolant 54 of the immersion cooling apparatus 50.

FIG. 24 through FIG. 28 are schematic three-dimensional side-views respectively illustrating various configurations of a thermal dissipating element with different materials in accordance with some embodiments of the disclosure. It is appreciated that, the thermal dissipation efficiency of the heat dissipating elements 810, 820 may be controlled by a material of the heat dissipating elements 810 and/or 820. By adjusting the material of the heat dissipating elements 810 and/or 820, a heat removal with higher flux for a certain hot spot (e.g. a heat source generating more heat, such as a logic circuit or the like) can be achieved.

Figure 24:
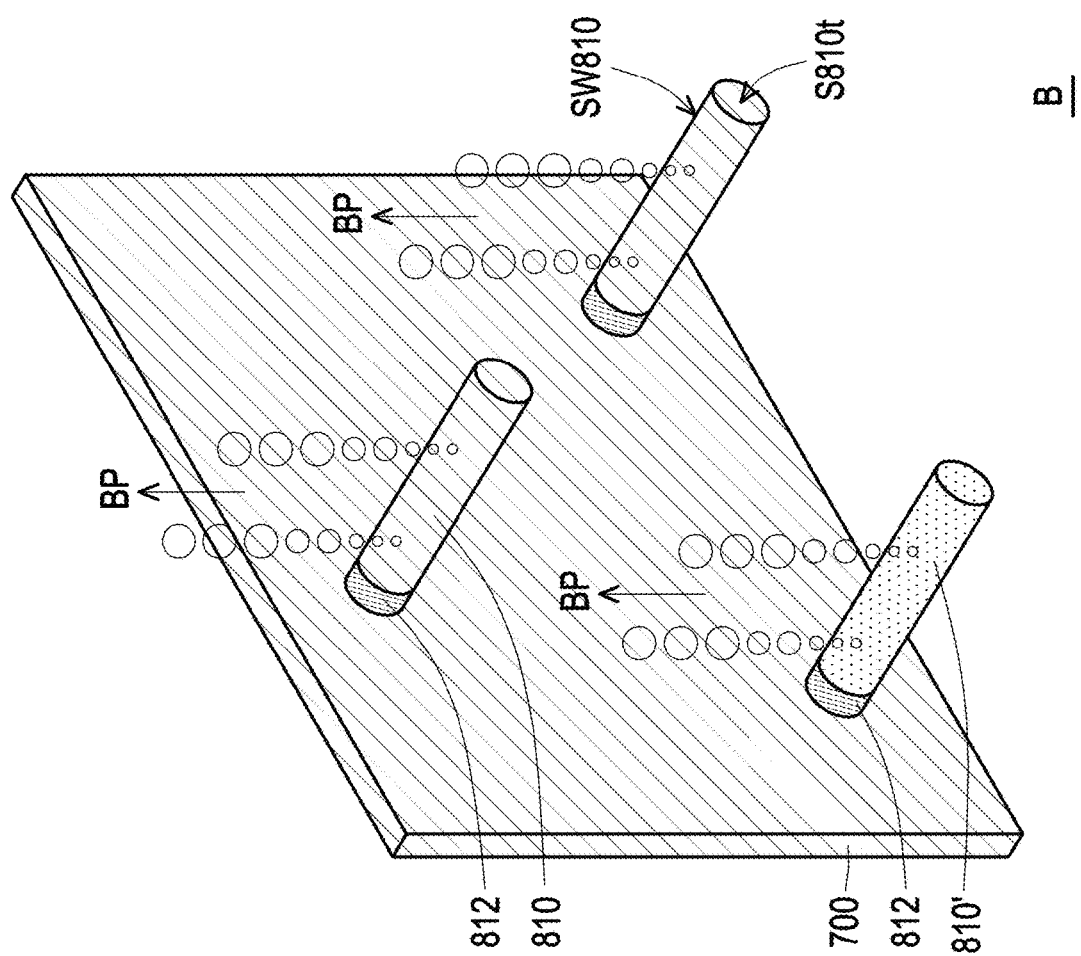
FIG. 24 through FIG. 28 are schematic three-dimensional side-views respectively illustrating various configurations of a thermal dissipating element with different materials in accordance with some embodiments of the disclosure.
Figure 25:
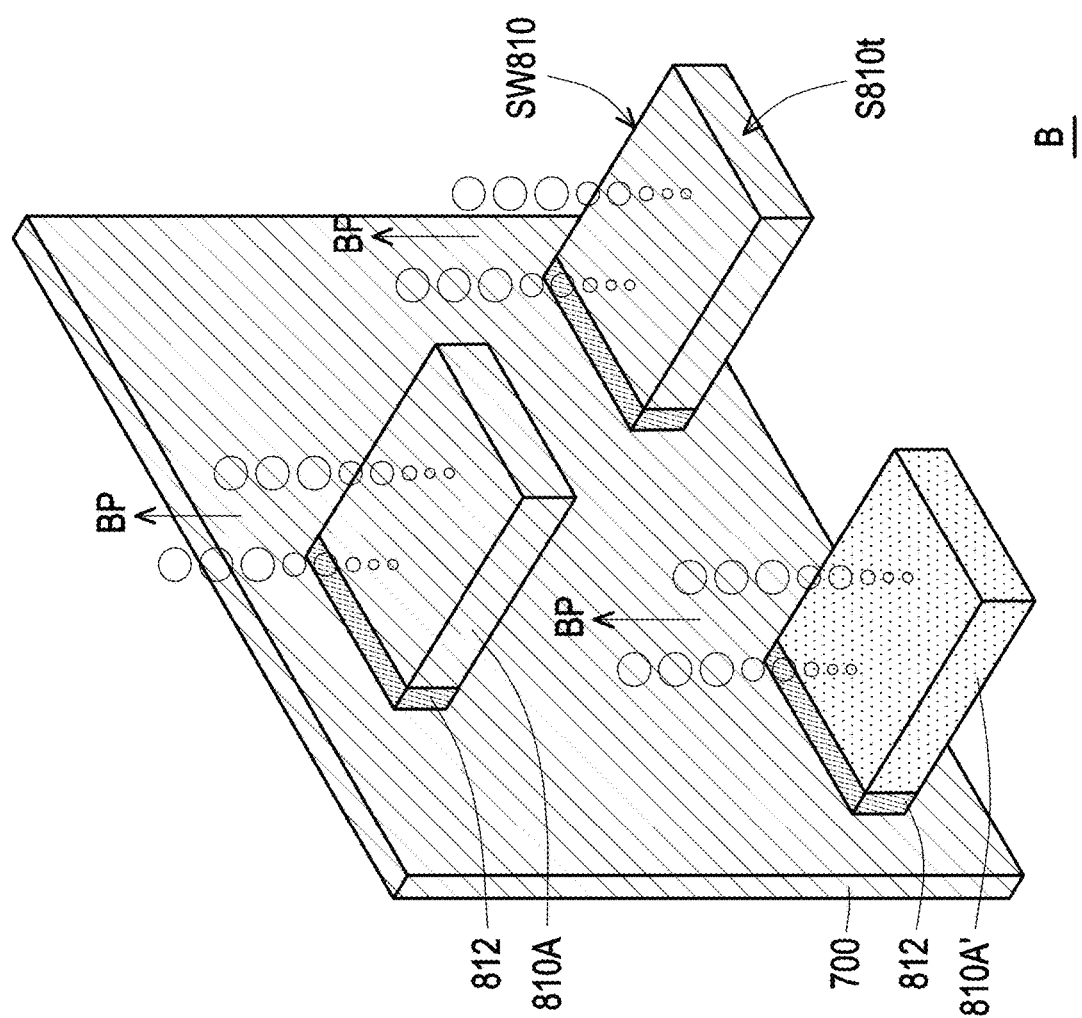
Figure 26:
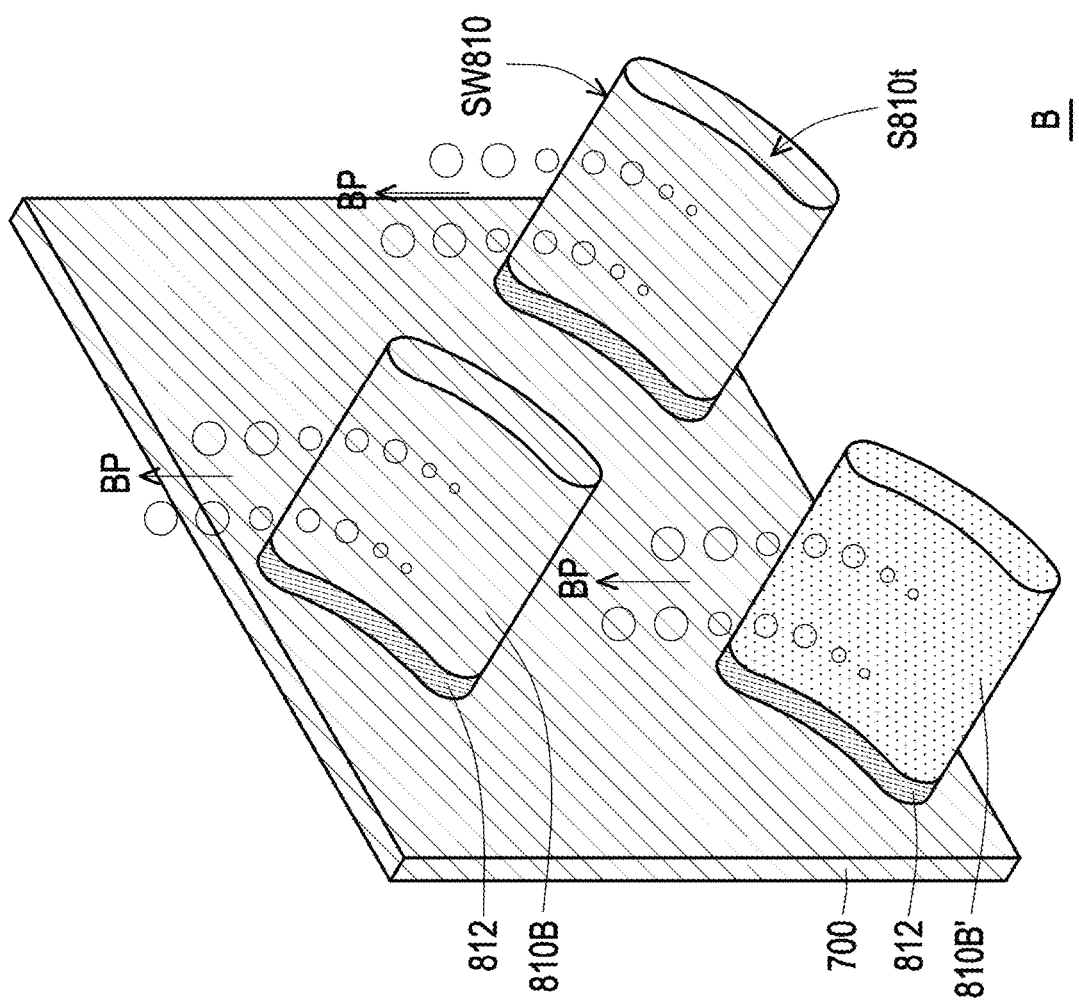
Figure 27:
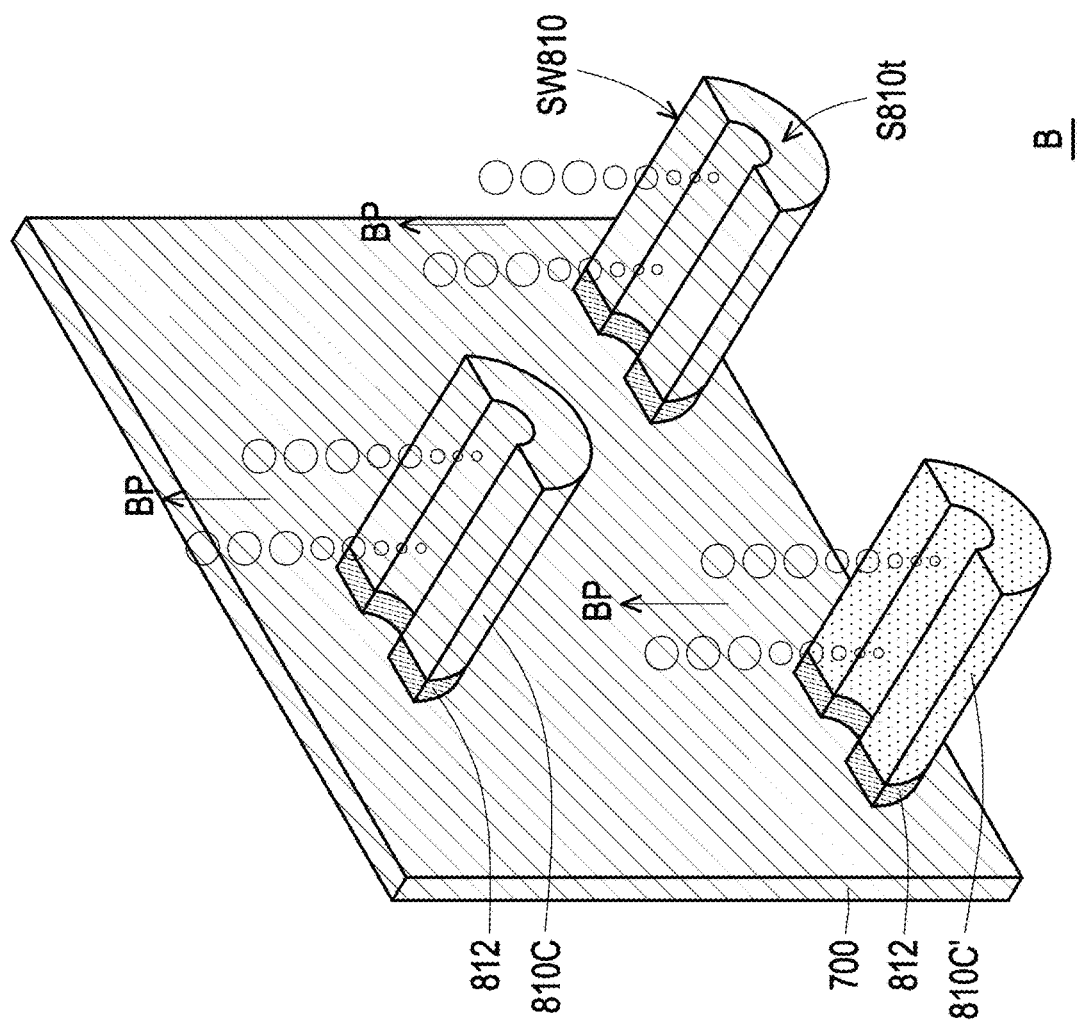
Figure 28:
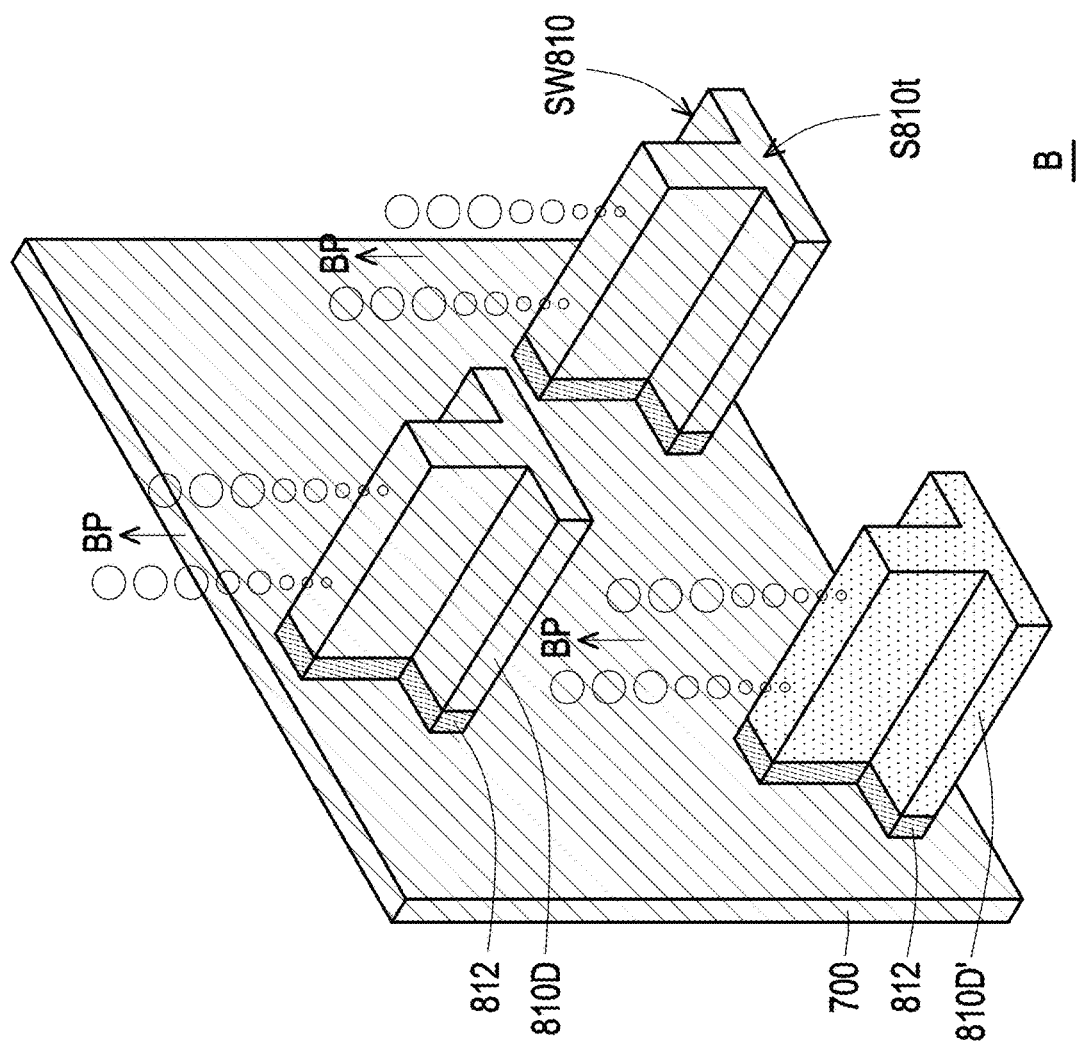

One or more than one heat dissipating element 810 may be substituted by a heat dissipating element 810', as shown in FIG. 24. For example, a material of the heat dissipating element 810' is different from a material of the heat dissipating elements 810. In the case of a thermal conductivity of the heat dissipating element 810' being higher than that of the heat dissipating elements 810, the heat dissipating element 810' is disposed over a heat source (e.g. a logic circuit or the like) generating more heat, as compared with other heat sources (e.g. a memory circuit, a SerDes circuit, an I/O circuit or the like) located at its periphery. Alternatively, if the thermal conductivity of the heat dissipating element 810' being less than that of the heat dissipating elements 810, the heat dissipating elements 810' are disposed over a heat source (e.g. a memory circuit, a SerDes circuit, an I/O circuit or the like) generating less heat, as compared with other heat sources located at its periphery (e.g. a logic circuit or the like). Similarly, one or more than one heat dissipating element 810A may be substituted by a heat dissipating element 810A' (FIG. 25), one or more than one heat dissipating element 810B may be substituted by a heat dissipating element 810B' (FIG. 26), one or more than one heat dissipating element 810C may be substituted by a heat dissipating element 810C' (FIG. 27), one or more than one heat dissipating element 810D may be substituted by a heat dissipating element 810D' (FIG. 28).

FIG. 29 through FIG. 33 are schematic three-dimensional side-views respectively illustrating various configurations of a thermal dissipating element with an additional coating in accordance with some embodiments of the disclosure. It is appreciated that, the thermal dissipation efficiency of the heat dissipating elements 810, 820 may be controlled by disposing an additional coating layer disposed on the heat dissipating elements 810 and/or 820. With the additional coating layer disposed on the heat dissipating elements 810 and/or 820, a heat removal with higher flux for a certain hot spot (e.g. a heat source generating more heat, such as a logic circuit or the like) can be achieved.

Figure 29:
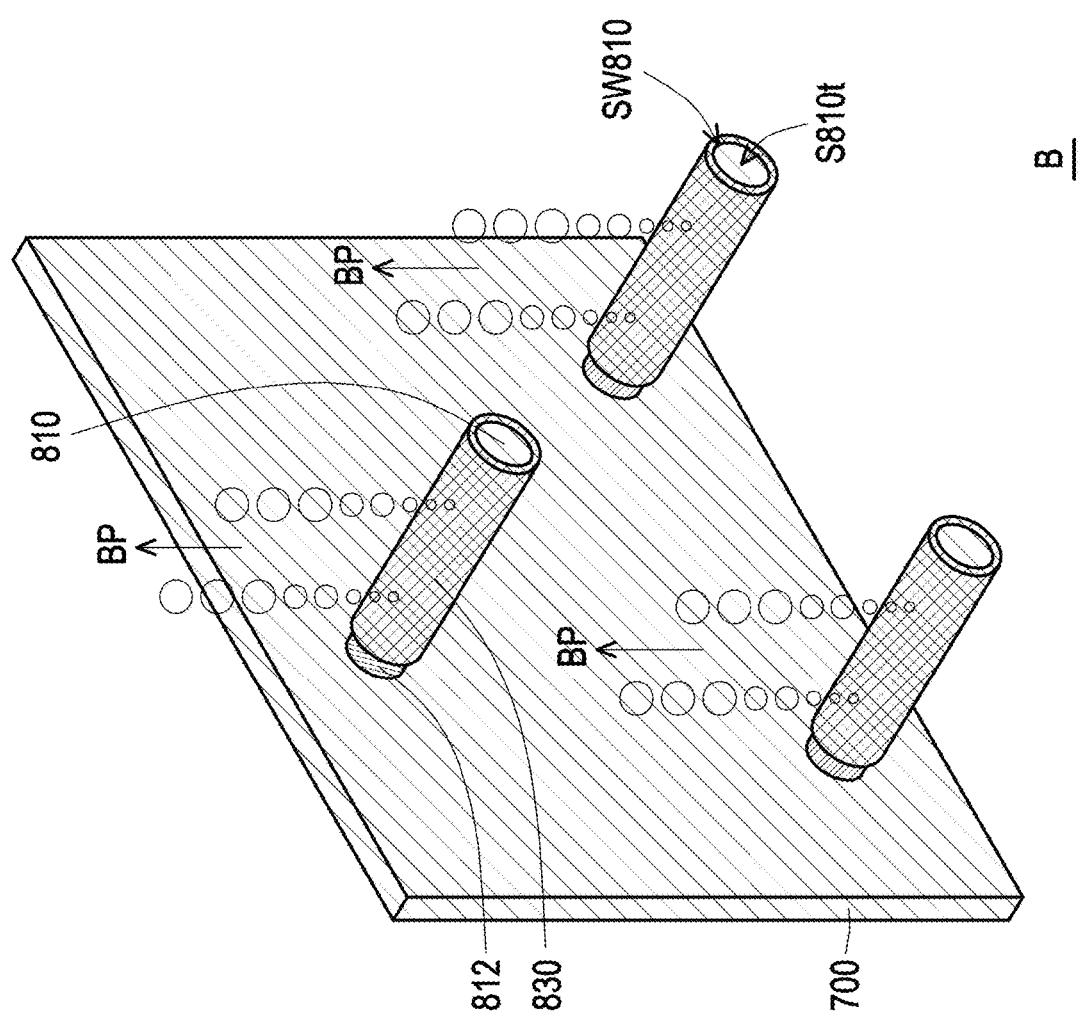
FIG. 29 through FIG. 33 are schematic three-dimensional side-views respectively illustrating various configurations of a thermal dissipating element with an additional coating in accordance with some embodiments of the disclosure.
Figure 30:
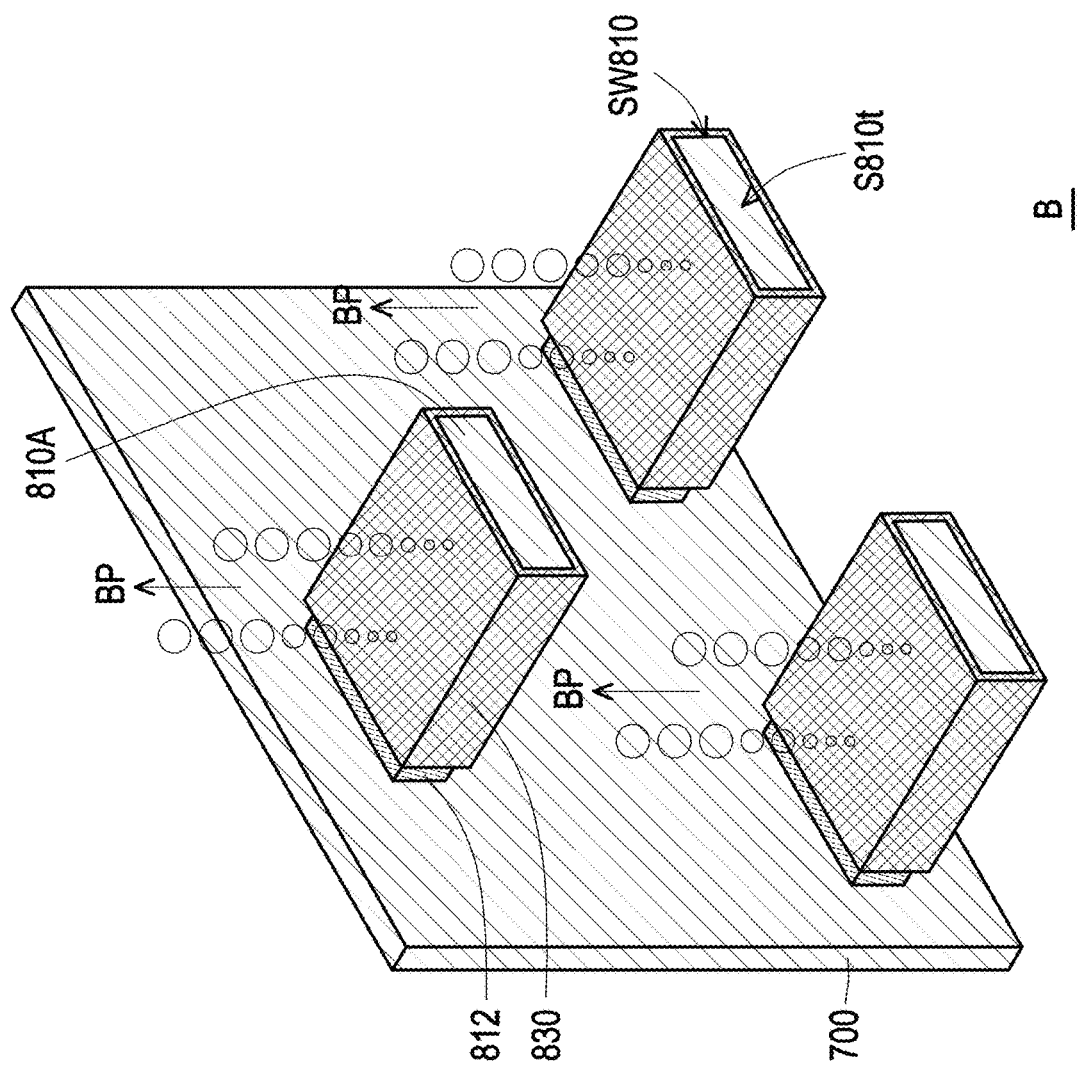
Figure 31:
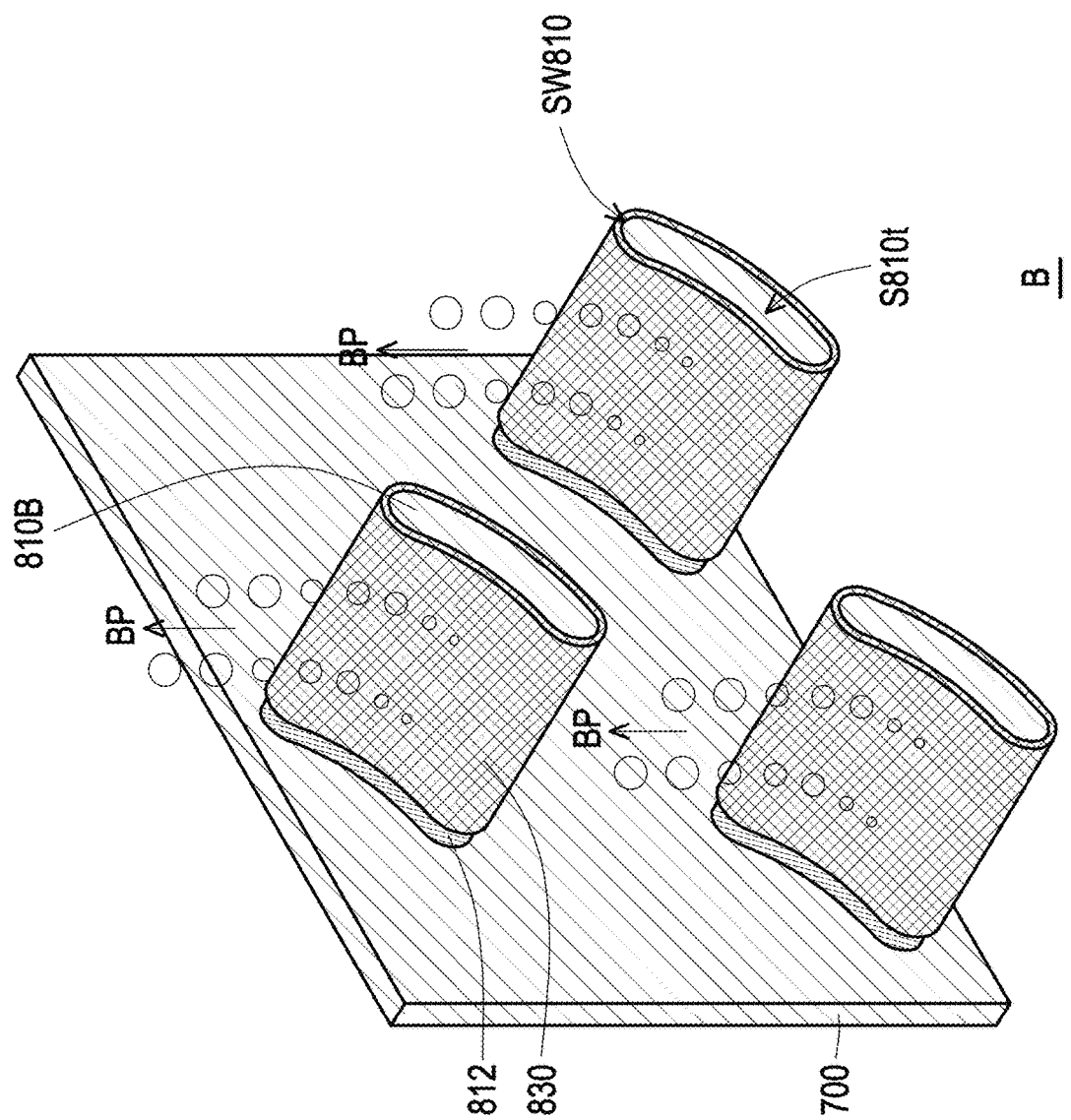
Figure 32:
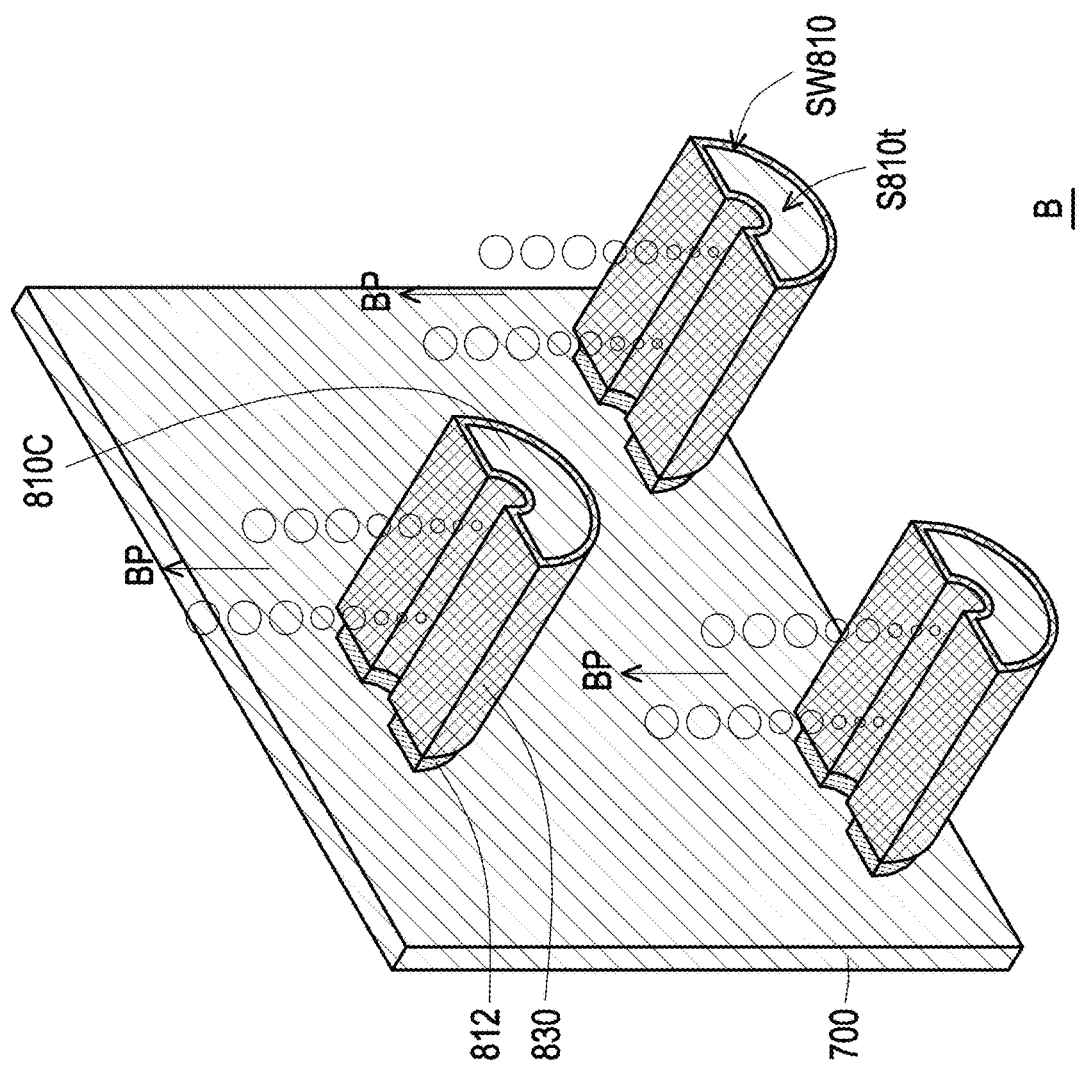

One or more than one heat dissipating element 810 can be coated with one or more than one coating layer 830. For example, each of the heat dissipating elements 810 is coated with the coating layer 830, as shown in FIG. 29. The coating layers 830 may improve capillary performance at a surface of the heat dissipating elements 810. Further, the coating layers 830 may independently include a porous layer or include microstructures (e.g., mesh, bumps etc.), thus may promote nucleate boiling by increasing nucleation site density. The coating layers 830 may also be independently referred as a boiling enhancement coating (BEC) layer, a wicking layer, or a wicking structure. In some embodiments, only the sidewalls SW810 of the heat dissipating elements 810 are coated with the coating layers 830. Although not shown, in other embodiments, the surfaces (such as the top surfaces S810t and the sidewalls SW810) of the heat dissipating elements 810, which are not in contact with the connecting portion 812 and are in contact with the dielectric coolant 54 (as shown in FIG. 2), are coated with the coating layers 830.

In some embodiments, the coating layers 830 may independently include a microporous sintered metal powder coating layer. In the case, a material of the coating layer 830 including metallic powders and an organic binder may be provided on the surface(s) of the heat dissipating elements 810 by, for example, a printing process, then the printed heat dissipating elements 810 may be transferred to a furnace for performing a sintering process. Sintered coating on one heat dissipating element 810 may form a respective one coating layer 830. For example, the coating layers 830 independently include a microporous sintered metal powder coating layer, such as a microporous copper powder coating layer. In some embodiments, the coating layers 830 are formed prior disposing the heat dissipating elements 810 over the flux portions 812m. In some embodiments, a thickness of the coating layer 830 is ranging from about 10 μm to about 1 mm.

Figure 33:
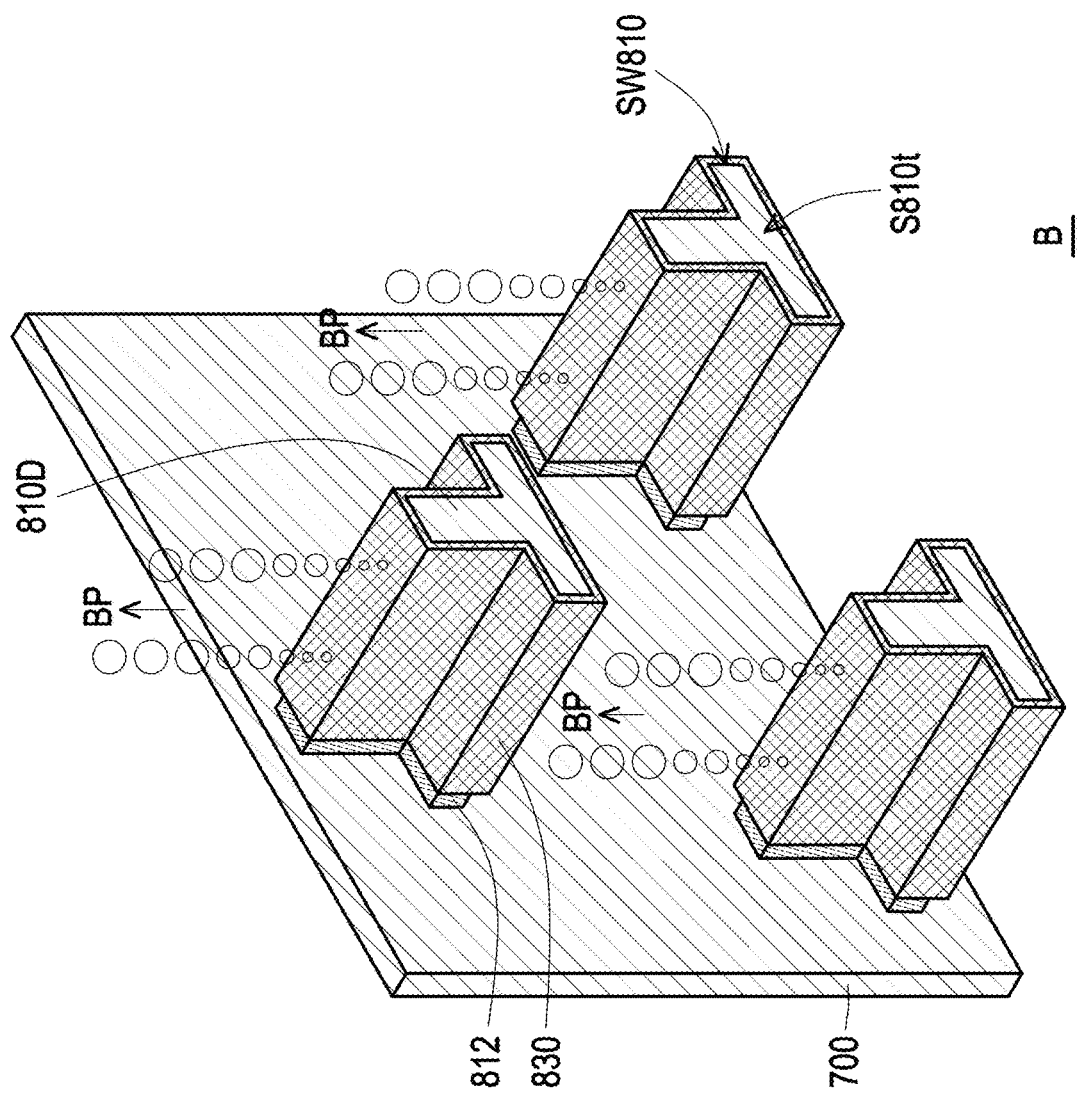

Similarly, one or more than one heat dissipating element 810A can be coated with one or more than one coating layer 830 (FIG. 30), one or more than one heat dissipating element 810B can be coated with one or more than one coating layer 830 (FIG. 31), one or more than one heat dissipating element 810C can be coated with one or more than one coating layer 830 (FIG. 32), one or more than one heat dissipating element 810D can be coated with one or more than one coating layer 830 (FIG. 33). Owing to the coating layer(s) 830, the localized heat transfer on extreme high-power density of logic circuits (such as CPU/GPI core or the like) can be improved.

The porosity densities of the coating layers 830 coated on the heat dissipating elements 810 and/or the heat dissipating elements 820 in different locations over the metallization layer 700 may be varied. In some embodiments, the porosity densities of the coating layers 830 coated on the heat dissipating elements 810 are substantially identical to each other (e.g. homogenous porosity densities in the region R1). In alternative embodiments, the porosity densities of the coating layers 830 coated on a portion of the heat dissipating elements 810 are greater than the porosity densities of the coating layers 830 coated on other portion of the heat dissipating elements 810. In some embodiments, the porosity densities of the coating layers 830 coated on the heat dissipating elements 820 are substantially identical to each other (e.g. homogenous porosity densities in the regions R2). In alternative embodiments, the porosity densities of the coating layers 830 coated on a portion of the heat dissipating elements 820 are greater than the porosity densities of the coating layers 830 coated on other portion of the heat dissipating elements 820. Or, in other embodiments, the porosity densities of the coating layers 830 coated on the heat dissipating elements 810 are substantially identical to the porosity densities of the coating layers 830 coated on the heat dissipating elements 820 (e.g. homogenous porosity densities in the region R1 and the regions R2). In alternative embodiments, the porosity densities of the coating layers 830 coated on the heat dissipating elements 810 are greater than the porosity densities of the coating layers 830 coated on the heat dissipating elements 820. In other words, the porosity control at the surfaces of the heat dissipating elements 810, 820 is achieved by the coating layer(s) 830.

However, the disclosure is not limited thereto; alternatively, the coating layer 830 may be substituted by a coating layer 840. FIG. 34 through FIG. 38 are schematic three-dimensional side-views respectively illustrating various configurations of a thermal dissipating element with an additional coating in accordance with some alternative embodiments of the disclosure.

Figure 34:
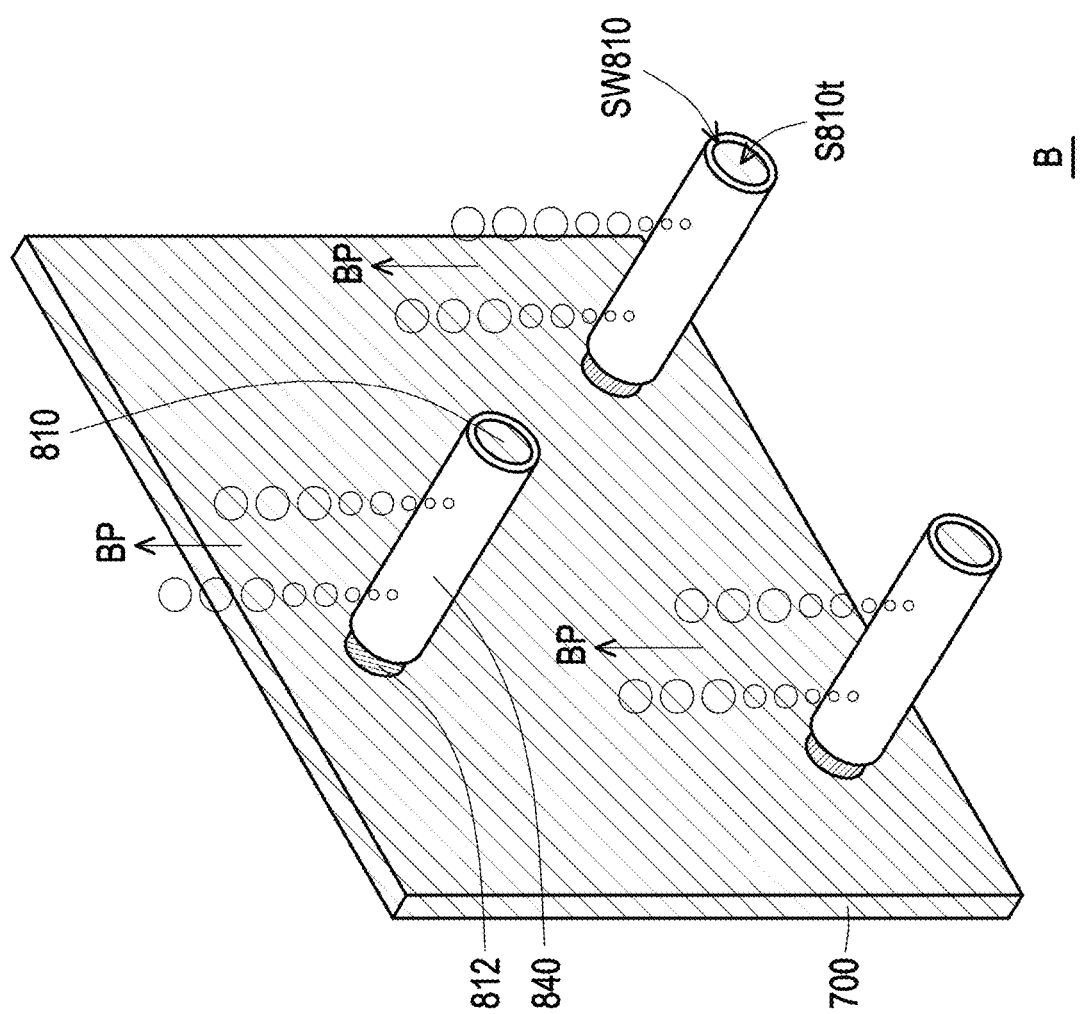
FIG. 34 through FIG. 38 are schematic three-dimensional side-views respectively illustrating various configurations of a thermal dissipating element with an additional coating in accordance with some alternative embodiments of the disclosure.
Figure 35:
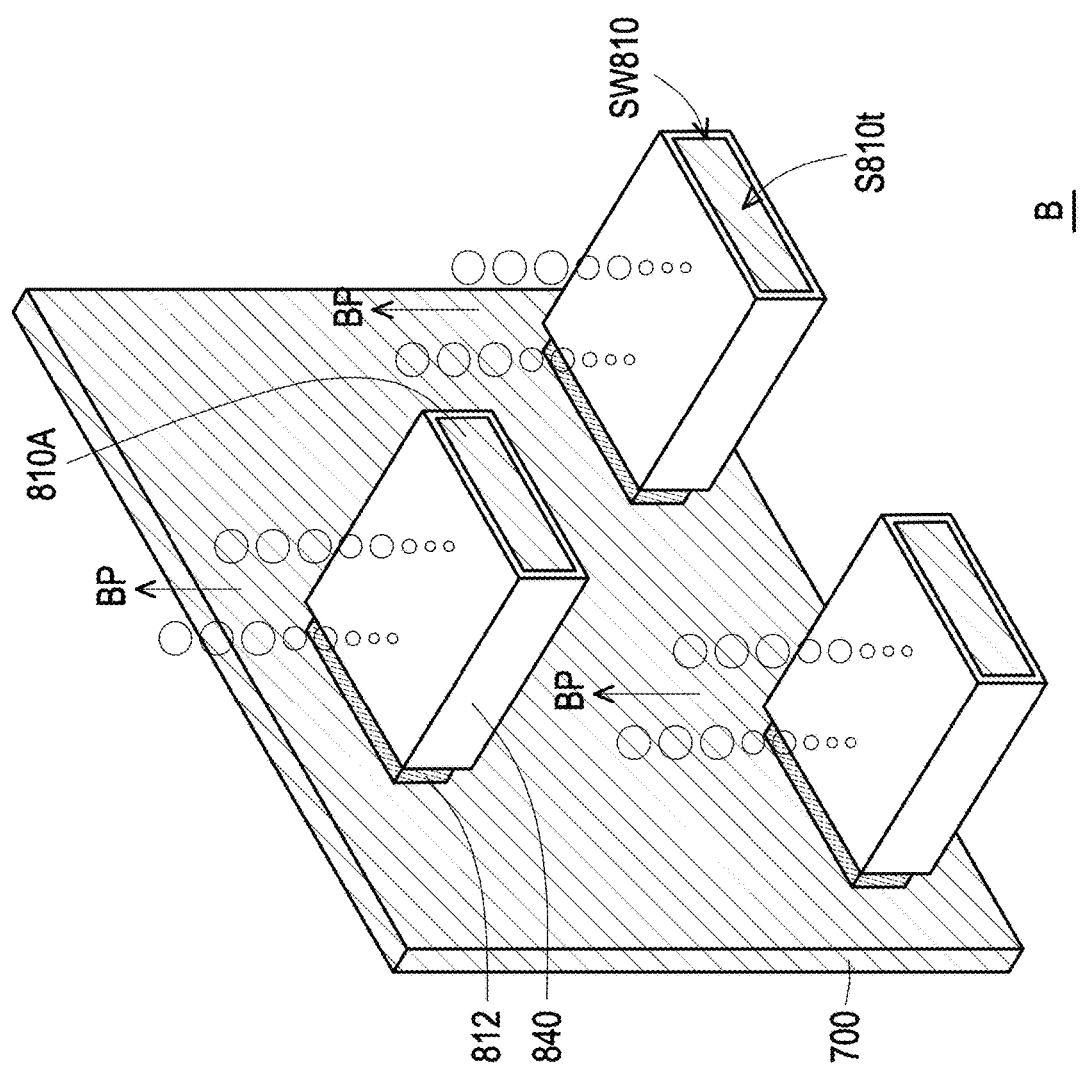
Figure 36:
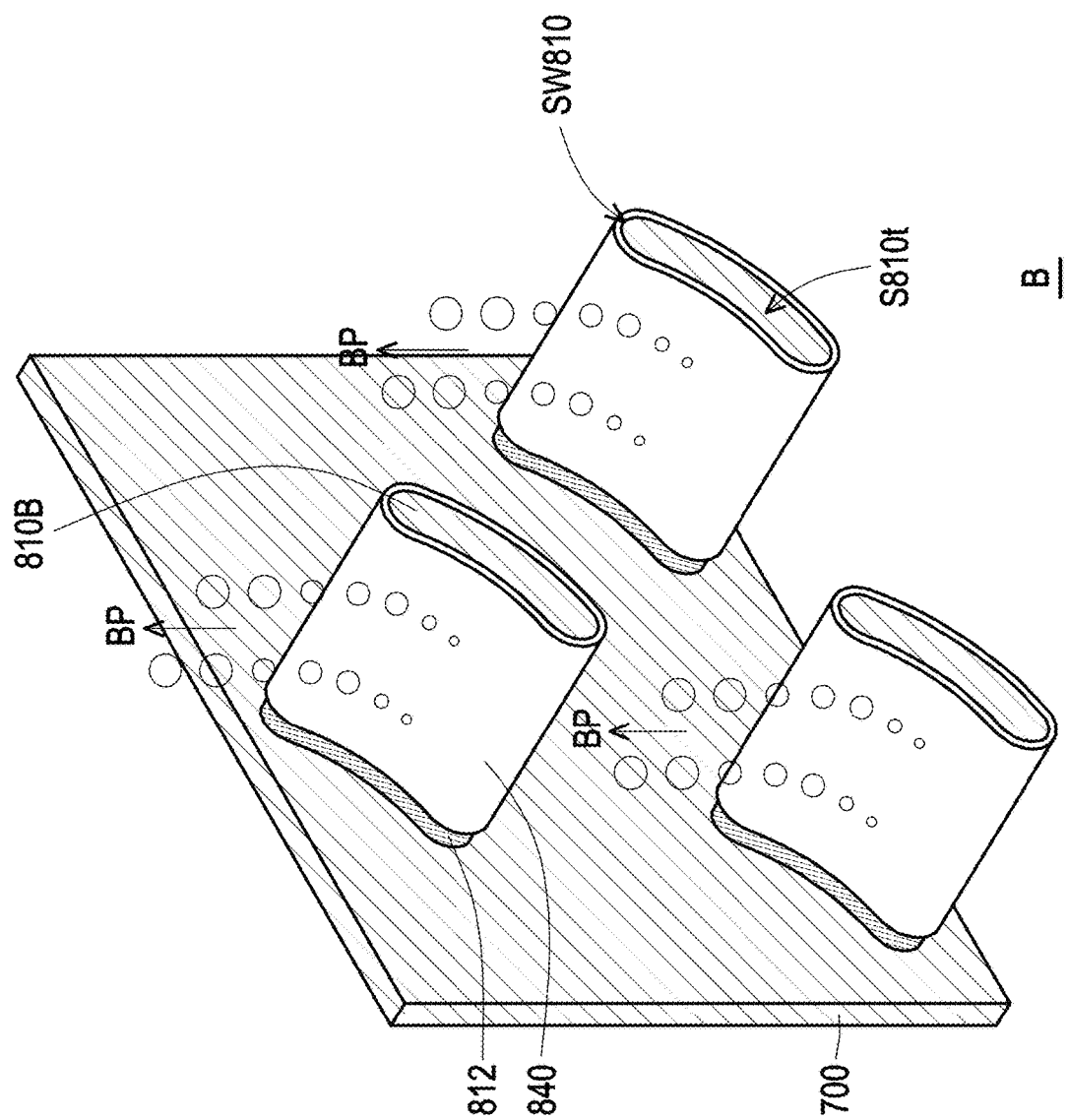
Figure 37:
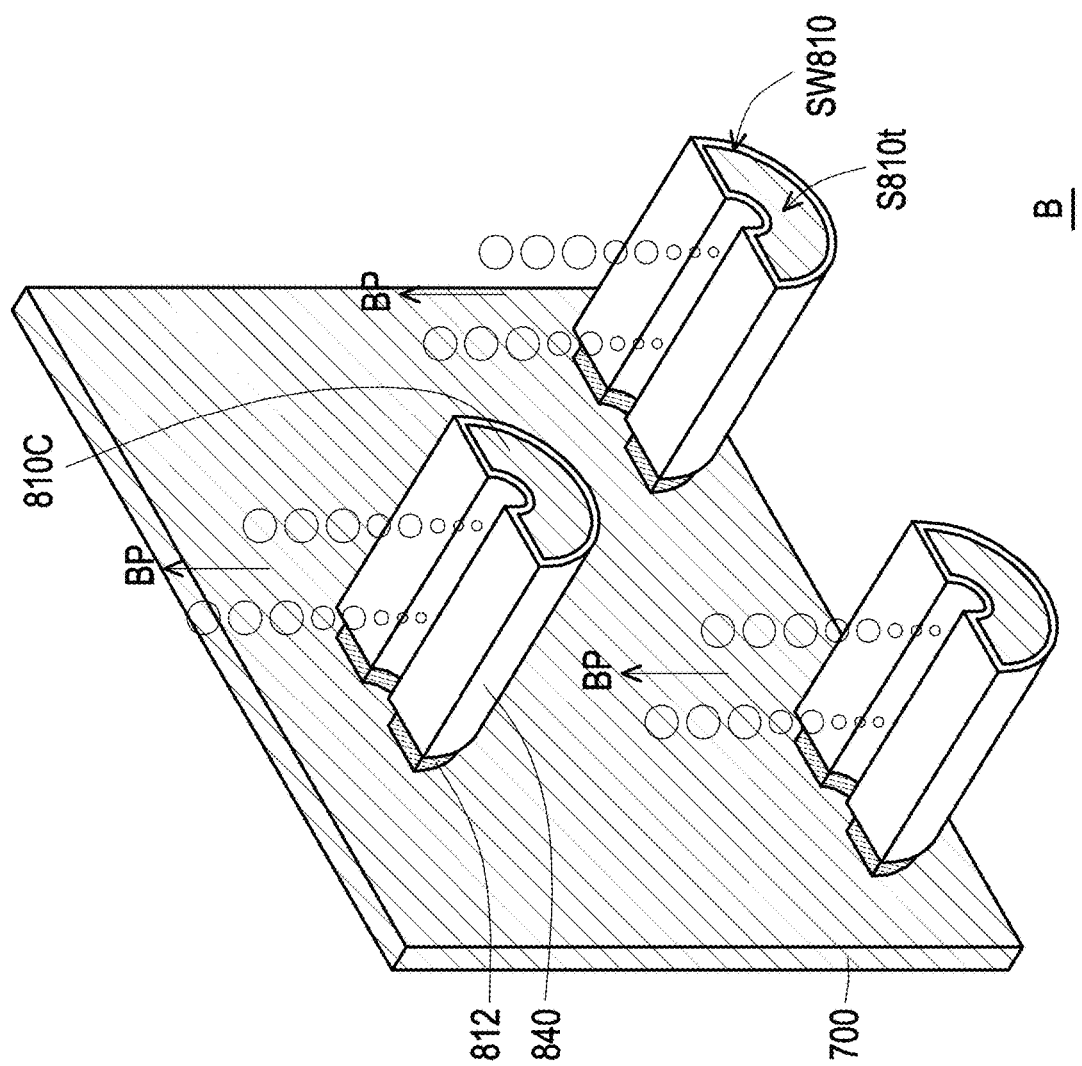

One or more than one heat dissipating element 810 can be coated with one or more than one coating layer 840. For example, each of the heat dissipating elements 810 is coated with the coating layer 840, as shown in FIG. 34. The coating layers 840 may improve re-wetting ability and wicking ability at a surface of the heat dissipating elements 810. The coating layers 840 may independently include a surface treatment layer, which facilitates the bubble detachment from the surfaces of the heat dissipating elements 810 so to increase nucleation site density. The coating layers 840 may also be independently referred as a surface treatment layer or a surface treatment structure. In some embodiments, only the sidewalls SW810 of the heat dissipating elements 810 are coated with the coating layers 840. Although not shown, in other embodiments, the surfaces (such as the top surfaces S810t and the sidewalls SW810) of the heat dissipating elements 810, which are not in contact with the connecting portion 812 and are in contact with the dielectric coolant 54 (as shown in FIG. 2), are coated with the coating layers 840.

In some embodiments, the coating layers 840 may independently include a low surface energy layer (e.g. a hydrophobic layer) or a high surface energy layer (e.g. a hydrophilic layer). In the case, a material of the coating layers 840 including $TiO_2$ super-hydrophilic surface, paraffin coating, spray Teflon, aluminum oxide, micro-porous layer of copper deposited using electrochemical process, copper with sand blasted surfaces, sintered porous copper, bronze, chrome, nickel, cadmium, tin, and/or zinc may be provided on the surface(s) of the heat dissipating elements 810 by, for example, performing a surface treatment process to form a coating over the surface(s) of the heat dissipating elements 810. Coating on one heat dissipating element 810 may form a respective one coating layer 840. In some embodiments, the coating layers 840 are formed prior disposing the heat dissipating elements 810 over the flux portions 812m. In some embodiments, a thickness of the coating layer 840 is ranging from about 10 μm to about 1 mm.

Figure 38:
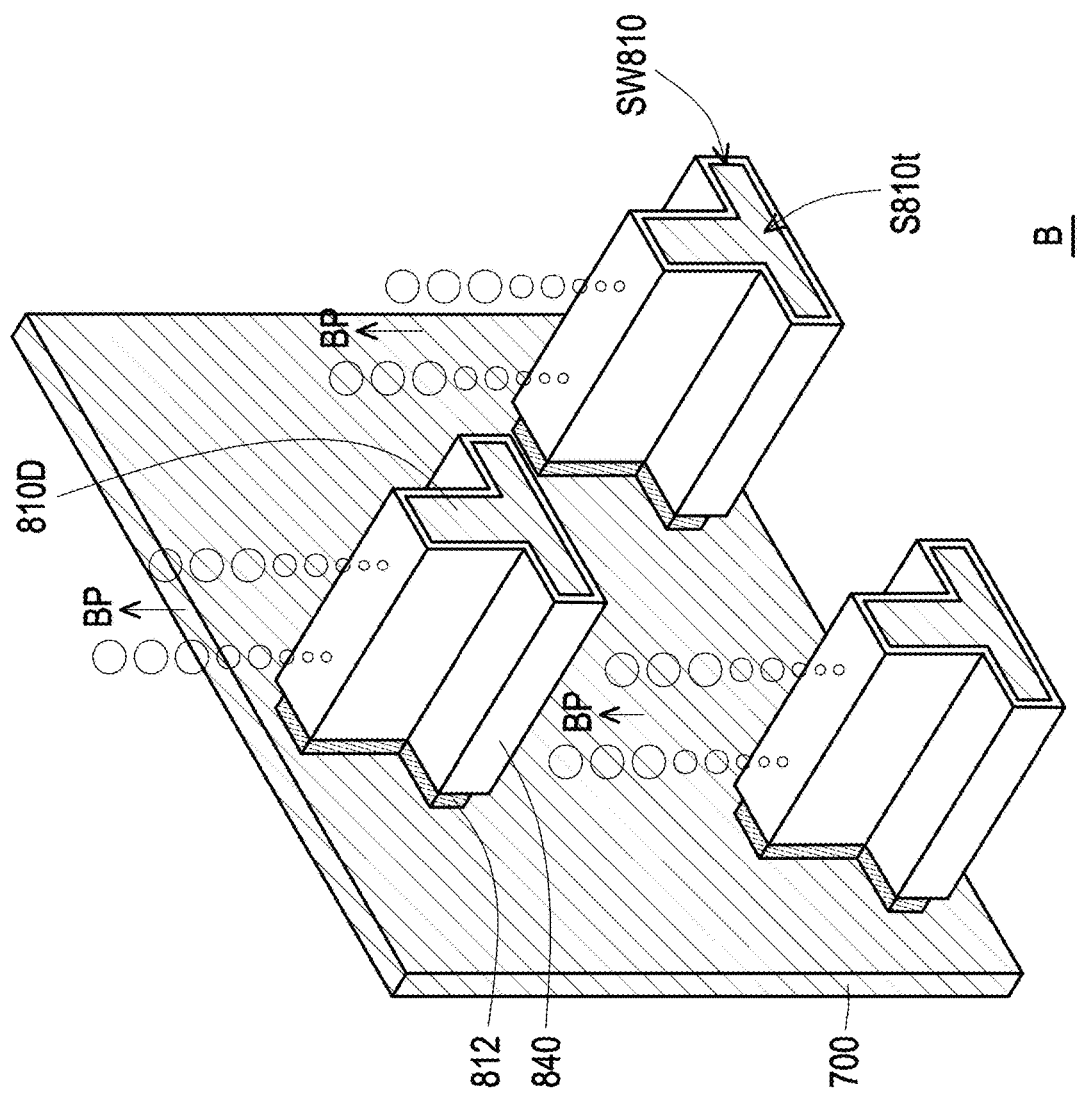

Similarly, one or more than one heat dissipating element 810A can be coated with one or more than one coating layer 840 (FIG. 35), one or more than one heat dissipating element 810B can be coated with one or more than one coating layer 840 (FIG. 36), one or more than one heat dissipating element 810C can be coated with one or more than one coating layer 840 (FIG. 37), one or more than one heat dissipating element 810D can be coated with one or more than one coating layer 840 (FIG. 38).

The coating layers 840 coated on the heat dissipating elements 810 and/or the heat dissipating elements 820 in different locations over the metallization layer 700 may be varied. In some embodiments, the coating layers 840 coated on the heat dissipating elements 810 are substantially identical to each other. In alternative embodiments, the coating layers 840 coated on a portion of the heat dissipating elements 810 are different from the coating layers 840 coated on other portion of the heat dissipating elements 810. In some embodiments, the coating layers 840 coated on the heat dissipating elements 820 are substantially identical to each other. In alternative embodiments, the coating layers 840 coated on a portion of the heat dissipating elements 820 are different from the coating layers 840 coated on other portion of the heat dissipating elements 820. Or, in other embodiments, the coating layers 840 coated on the heat dissipating elements 810 are substantially identical to the coating layers 840 coated on the heat dissipating elements 820. In alternative embodiments, the coating layers 840 coated on the heat dissipating elements 810 are different from the coating layers 840 coated on the heat dissipating elements 820. In other words, the wettability control at the surfaces of the heat dissipating elements 810, 820 is achieved by the coating layer(s) 840.

In addition, the heat dissipating elements 810 and/or 820, in part or all, may be independently coated with both of the coating layer 830 and the coating layer 840. For example, the coating layer 830 is firstly disposed on the sidewalls of the heat dissipating elements 810 and/or 820, and the coating layer 840 is then disposed on the coating layer 830. That is, the heat dissipating elements 810 and/or 820 may be wrapped by the coating layer 830, and the coating layer 830 may be wrapped by the coating layer 840. Or alternatively, the heat dissipating elements 810 and/or 820 may be wrapped by the coating layer 840, and the coating layer 840 may be wrapped by the coating layer 830. The disclosure is not limited thereto.

Figure 39:
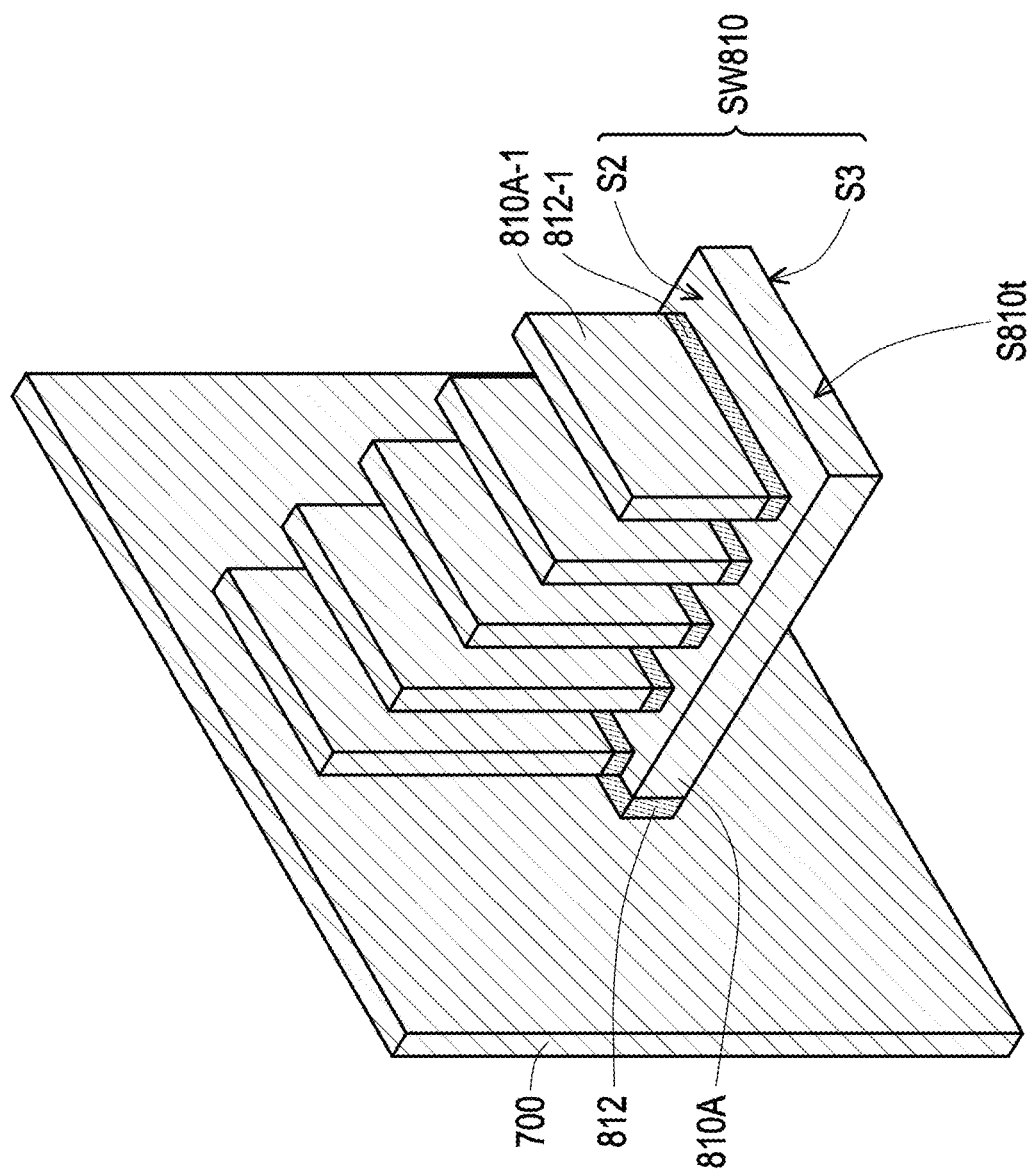
FIG. 39 through FIG. 40 are schematic three-dimensional side-views respectively illustrating various configurations of a thermal dissipating element with a stacking structure in accordance with some embodiments of the disclosure.
Figure 40:
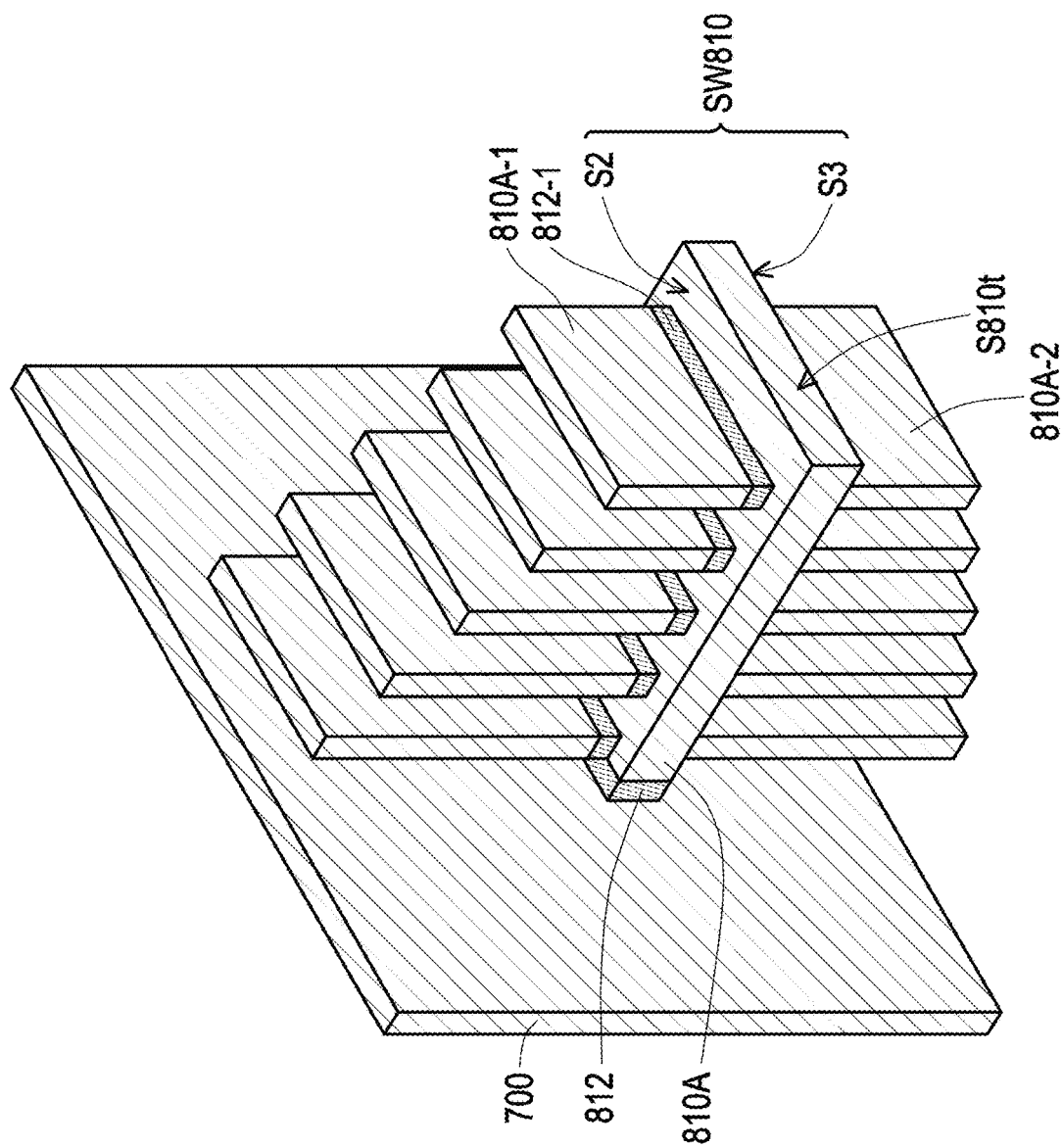

FIG. 39 through FIG. 40 are schematic three-dimensional side-views respectively illustrating various configurations of a thermal dissipating element with a stacking structure in accordance with some embodiments of the disclosure. It is appreciated that, the thermal dissipation efficiency of the heat dissipating elements 810, 820 may be controlled by adopting a stacking structure. With the heat dissipating elements 810 and/or 820 having the stacking structure, more heat dissipating area can be provided to a heat source generating more heat, thereby achieving a heat removal with higher flux for a certain hot spot (e.g. a heat source generating more heat, such as a logic circuit or the like).

One or more than one heat dissipating element 810A may have a stacking structure. For example, the sidewall SW810 of the heat dissipating element 810A includes two main sides S2 and S3 extending away from the metallization layer 700, where the main sides S2 and S3 are opposite to each other, as shown in FIG. 39. An extending plane of each of the main sides S2 and S3 may be substantially perpendicular to an extending plane of the metallization layer 700. In some embodiments, a plurality of heat dissipating elements 810A-1 are disposed on the main side S2 of the heat dissipating element 810A. For example, the heat dissipating elements 810A-1 are bonded to the main side S2 of the heat dissipating element 810A through first connecting portions 812-1, where the heat dissipating elements 810A-1 are thermally coupled to the heat dissipating element 810A, as shown in FIG. 39. The heat dissipating elements 810A-1 may further be electrically coupled to the heat dissipating element 810A through the first connecting portions 812-1.

Alternatively, a plurality of heat dissipating elements 810A-1 and a plurality of heat dissipating elements 810A-1 may be respectively disposed on the main side S2 and the main side S3 of the heat dissipating element 810A. For example, the heat dissipating elements 810A-1 are bonded to the main side S2 of the heat dissipating element 810A through first connecting portions 812-1, and the heat dissipating elements 810A-2 are bonded to the main side S3 of the heat dissipating element 810A through second connecting portions (not shown in the drawing), where the heat dissipating elements 810A-1 and 810A-2 are thermally coupled to the heat dissipating element 810A, as shown in FIG. 40. The heat dissipating elements 810A-1 may further be electrically coupled to the heat dissipating element 810A through the first connecting portions 812-1, and/or the heat dissipating elements 810A-2 may further be electrically coupled to the heat dissipating element 810A through the second connecting portions.

The details of the heat dissipating elements 810A-1, 810A-2 and the details of the first connecting portions 812-1 and the second connecting portions are similar to or substantially similar to the details of the heat dissipating elements 810A and the details of the connecting portions 812 as previously described, and thus are not repeated herein for simplicity. In addition, the heat dissipating elements 810A-1, 810A-2 may be independently substituted by one or more than one of the heat dissipating elements 810, 810B, 810C, 810D, or their modifications as described in FIG. 9 through FIG. 38, in part or all. The disclosure is not limited thereto. Owing to the stacking structure (stacking along the X-Y plane as shown in FIG. 39 and FIG. 40), more heat dissipating area can be greatly provided. Furthermore, the stacking structure in FIG. 39 and FIG. 40 may also be adopted by the heat dissipating elements 810, 810B, 810C, 810D, or their modifications as described in FIG. 9 through FIG. 38; the disclosure is not limited thereto.

In some embodiments, heights of the heat dissipating elements 810 and 820 are substantially the same, as shown in the semiconductor package module 1000 of FIG. 3. Alternatively, the heights of the heat dissipating elements 810 and/or 820 may be varied. FIG. 41 through FIG. 44 are schematic cross-sectional views respectively illustrating a semiconductor package module having a thermal dissipating element with different heights in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Figure 41:
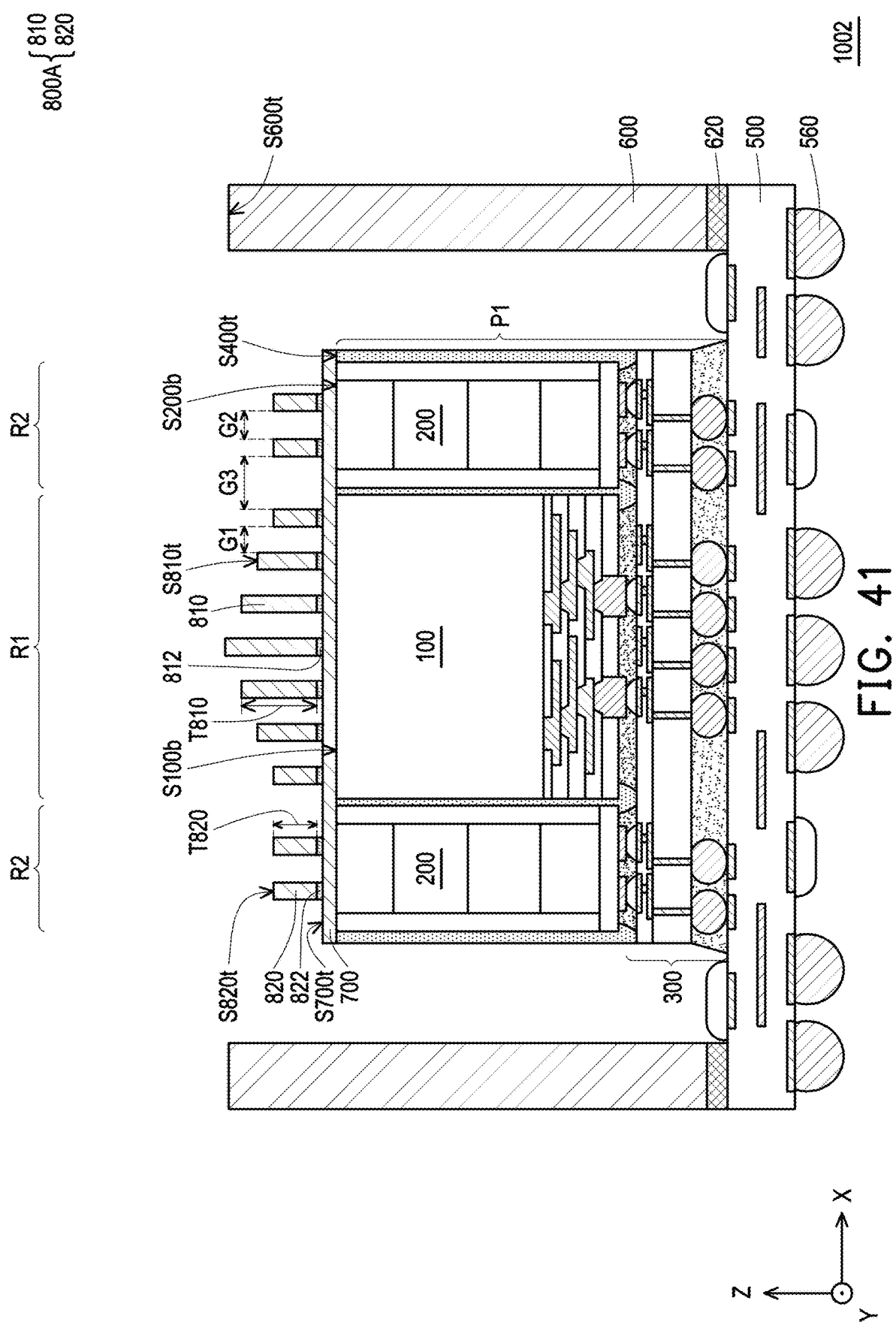
FIG. 41 through FIG. 46 are schematic cross-sectional views respectively illustrating a semiconductor package module having a thermal dissipating element with different heights and/or widths in accordance with some embodiments of the disclosure.
Figure 42:
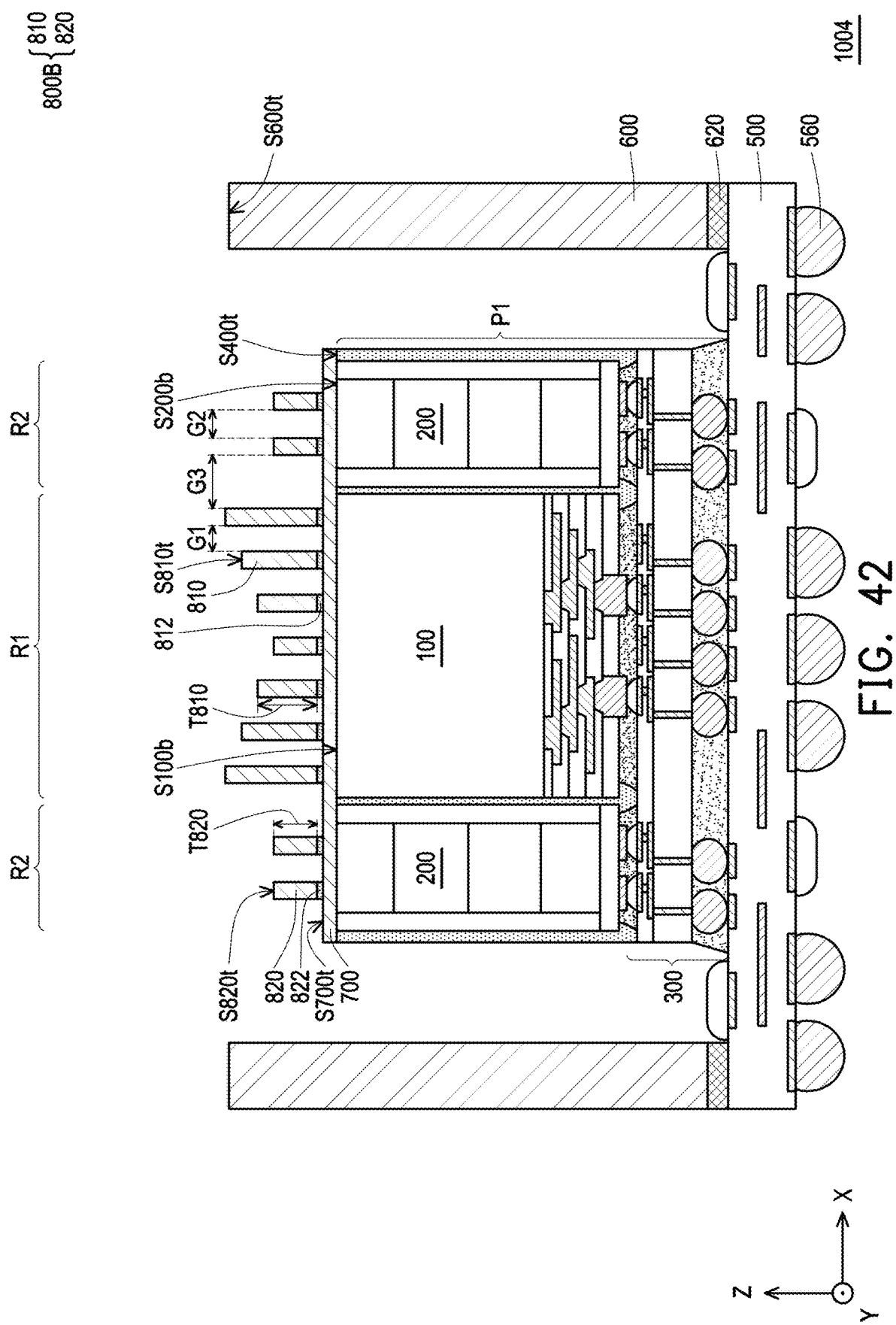
Figure 43:
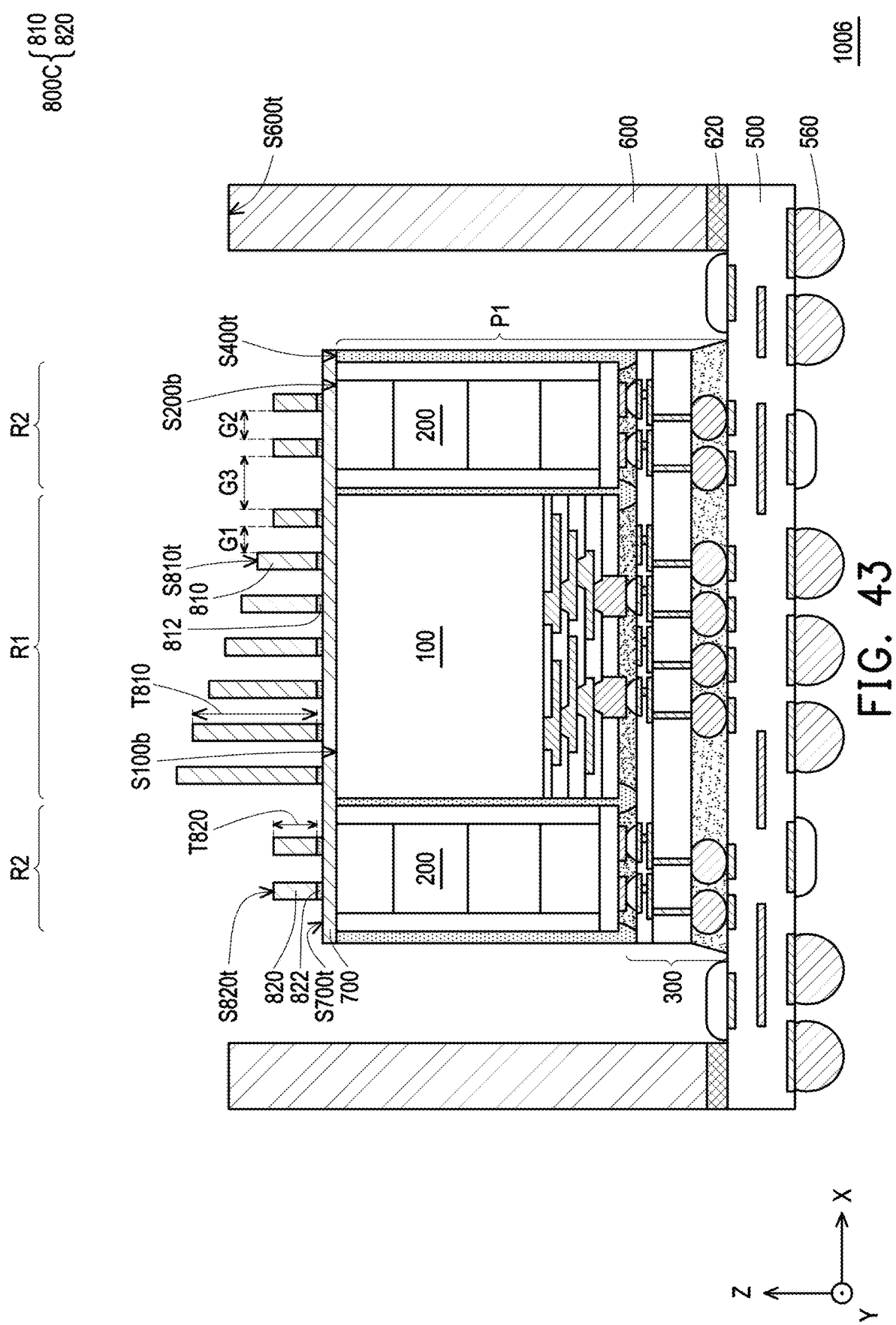
Figure 44:
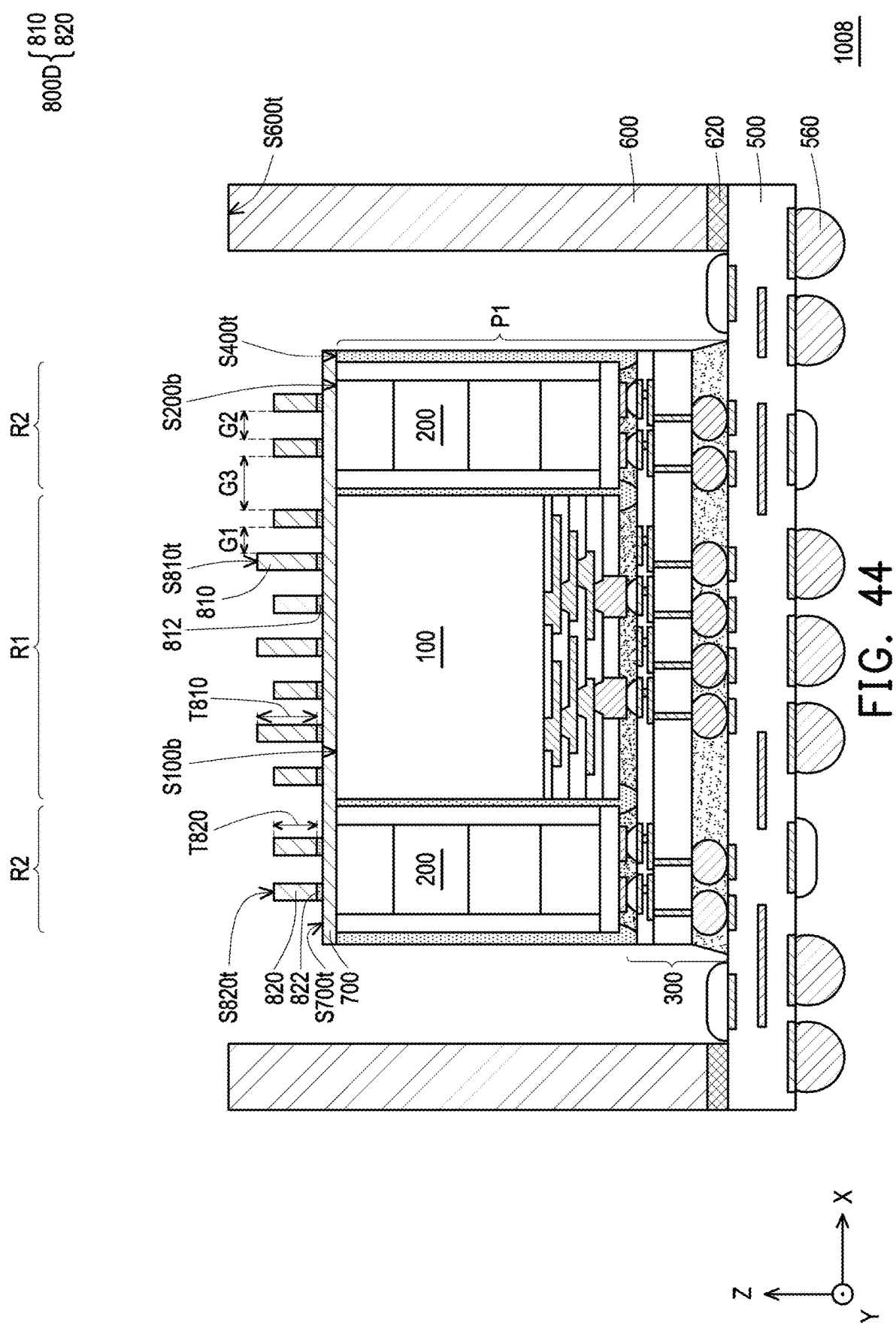

For example, in a heat dissipating element 800A of a semiconductor package module 1002 depicted in FIG. 41, the heights T810 of the heat dissipating elements 810 decrease from a center of the region R1 towards an edge of the region R1, and the heights T820 of the heat dissipating elements 820 maintain the same. For another example, in a heat dissipating element 800B of a semiconductor package module 1004 depicted in FIG. 42, the heights T810 of the heat dissipating elements 810 increase from a center of the region R1 towards an edge of the region R1, and the heights T820 of the heat dissipating elements 820 maintain the same. For another example, in a heat dissipating element 800C of a semiconductor package module 1006 depicted in FIG. 43, the heights T810 of the heat dissipating elements 810 increase from an edge of the region R1 towards an opposite edge of the region R1, and the heights T820 of the heat dissipating elements 820 maintain the same. For another example, in a heat dissipating element 800D of a semiconductor package module 1008 depicted in FIG. 44, a first portion of the heat dissipating elements 810 and a second portion of the heat dissipating elements 810 are alternately arranged along a direction from an edge of the region R1 to an opposite edge of the region R1, where the heights T810 of the first portion of the heat dissipating elements 810 is greater than the heights T810 of the second portion of the heat dissipating elements 810, and the heights T820 of the heat dissipating elements 820 maintain the same.

Although not shown, the heights T810 of the heat dissipating elements 810 may be substantially identical to each other and may be greater than the heights T820 of the heat dissipating elements 820. Or, the heights T810 of the heat dissipating elements 810 may be substantially identical to each other and may be less than the heights T820 of the heat dissipating elements 820. However, the disclosure is not limited thereto; alternatively, the above modifications may be further adopted by the heat dissipating elements 820. Or alternatively, the above modifications may be adopted by the heat dissipating elements 820, while the heights of the heat dissipating elements 810 maintain the same. With the greater heights, more heat dissipating area can be provided by the heat dissipating elements 810, 820, thereby achieving a heat removal with higher flux.

Figure 45:
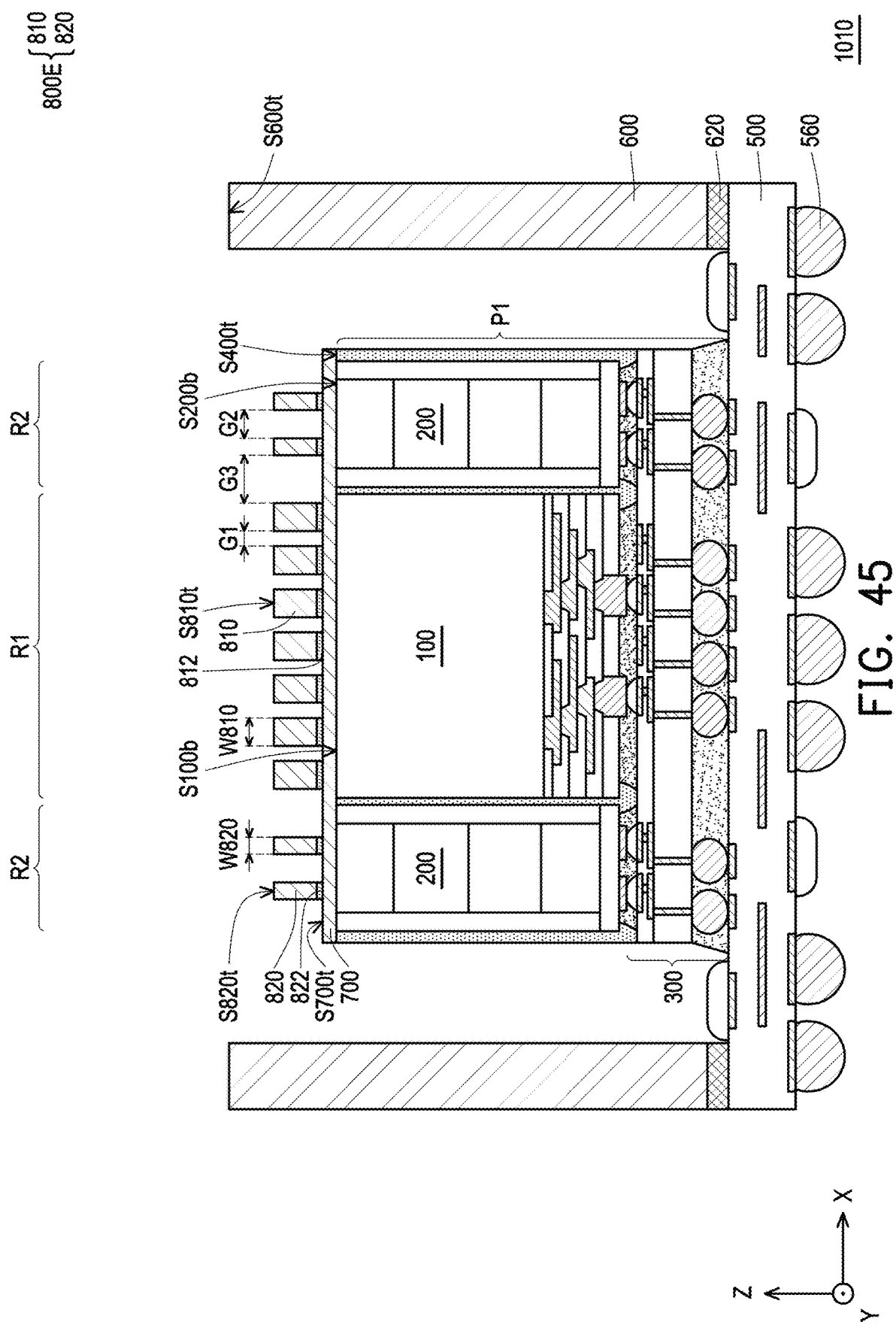
Figure 46:
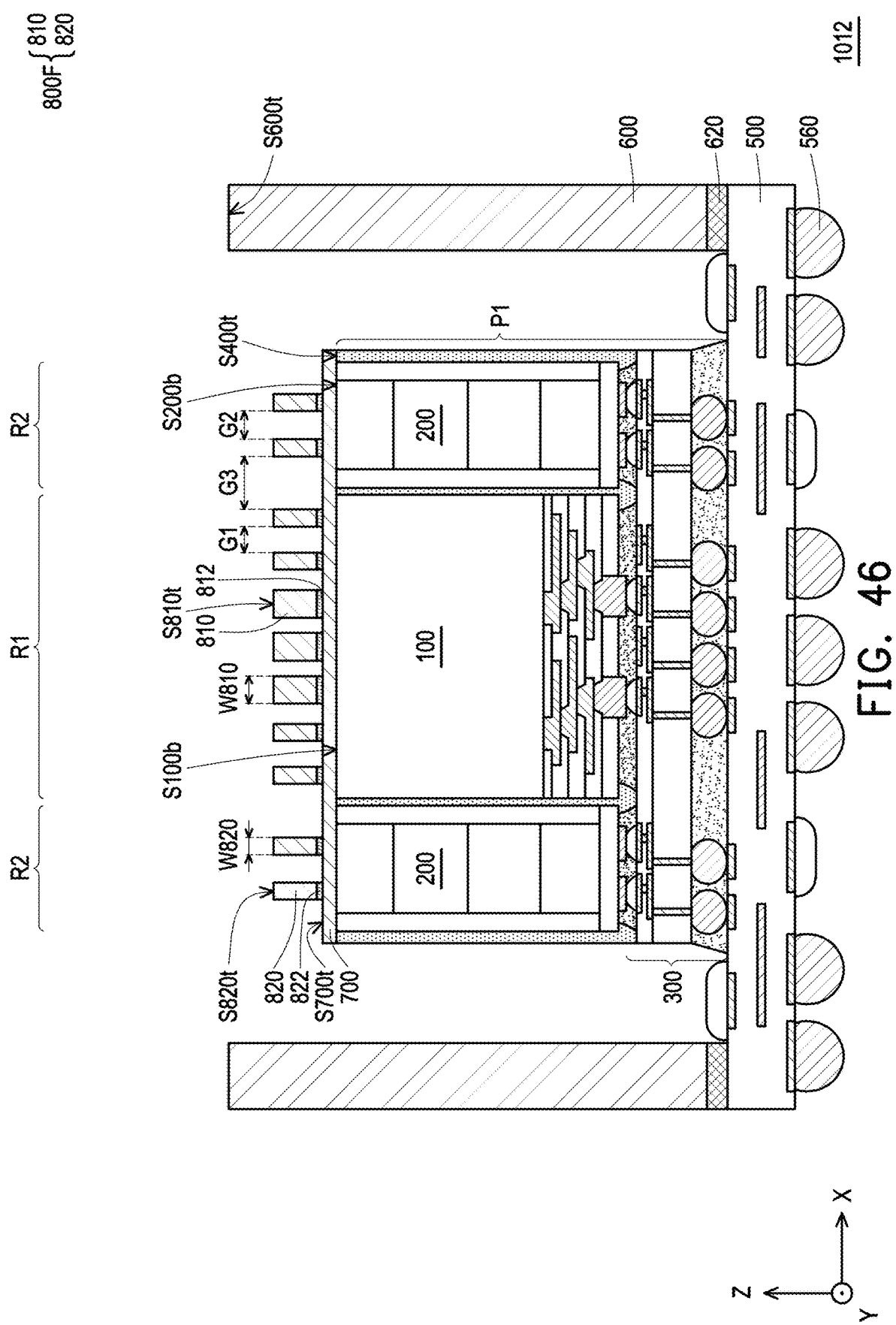

In some embodiments, the widths of the heat dissipating elements 810 and 820 are substantially the same, as shown in the semiconductor package module 1000 of FIG. 3. Alternatively, the widths of the heat dissipating elements 810 and/or 820 may be varied. FIG. 45 through FIG. 46 are schematic cross-sectional views respectively illustrating a semiconductor package module having a thermal dissipating element with different widths in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

For example, in a heat dissipating element 800E of a semiconductor package module 1010 depicted in FIG. 45, the widths W810 of the heat dissipating elements 810 are substantially identical to each other, the widths W820 of the heat dissipating elements 820 are substantially identical to each other, and the widths W810 of the heat dissipating elements 810 are greater than the widths W820 of the heat dissipating elements 820. Although not shown, the widths W810 of the heat dissipating elements 810 are substantially identical to each other, the widths W820 of the heat dissipating elements 820 are substantially identical to each other, and the widths W810 of the heat dissipating elements 810 are less than the widths W820 of the heat dissipating elements 820. For another example, in a heat dissipating element 800F of a semiconductor package module 1012 depicted in FIG. 46, the widths W810 of the heat dissipating elements 810 decrease from a center of the region R1 towards an edge of the region RE and the widths W820 of the heat dissipating elements 820 maintain the same.

Although not shown, the widths W810 of the heat dissipating elements 810 increase from a center of the region R1 towards an edge of the region RE and the widths W820 of the heat dissipating elements 820 maintain the same. Although not shown, a first portion of the heat dissipating elements 810 and a second portion of the heat dissipating elements 810 are alternately arranged along a direction from an edge of the region R1 to an opposite edge of the region RE where the widths W810 of the first portion of the heat dissipating elements 810 may be greater than the widths W810 of the second portion of the heat dissipating elements 810, and the widths of the heat dissipating elements 820 maintain the same. However, the disclosure is not limited thereto; alternatively, the above modifications may be further adopted by the heat dissipating elements 820. Or alternatively, the above modifications may be adopted by the heat dissipating elements 820, while the heights of the heat dissipating elements 810 maintain the same. With the greater widths, more heat dissipating area can be provided by the heat dissipating elements 810, 820, thereby achieving a heat removal with higher flux.

Owing to the features formed in or on the heat dissipating elements shown in the embodiments of FIG. 9 through FIG. 46, the effective heat transfer area with a higher thermal conductivity microstructure can be maximized, thereby improving the hot spot heat spreading effect. These modifications in FIG. 9 through FIG. 46 are compatible with the current manufacturing process and are designed to be compatible with a two-phase immersion cooling apparatus (e.g., the immersion cooling apparatus 50 as shown in FIG. 2) or a single-phase immersion cooling apparatus (not shown), and are capable of lowering a chip-package interaction (CPI) risk. In some embodiments, the heat dissipating elements with the features in the embodiments of FIG. 9 through FIG. 46 are referred to as high-thermal-conductive microstructures, or sometimes called microstructures of high thermal conductivity.

For example, a height-level of each of the top surfaces S810t of the heat dissipating elements 810, 810A, 810B, 810C, and/or 810D may be independently higher than, lower than, or substantially the same as a height-level of the illustrated top surface S600t of the supporting structure 600, the disclosure is not limited thereto. For example, a height-level of each of the top surfaces S820t of the heat dissipating elements 820 or its modifications may be independently higher than, lower than, or substantially the same as a height-level of the illustrated top surface S600t of the supporting structure 600, the disclosure is not limited thereto.

Figure 47:
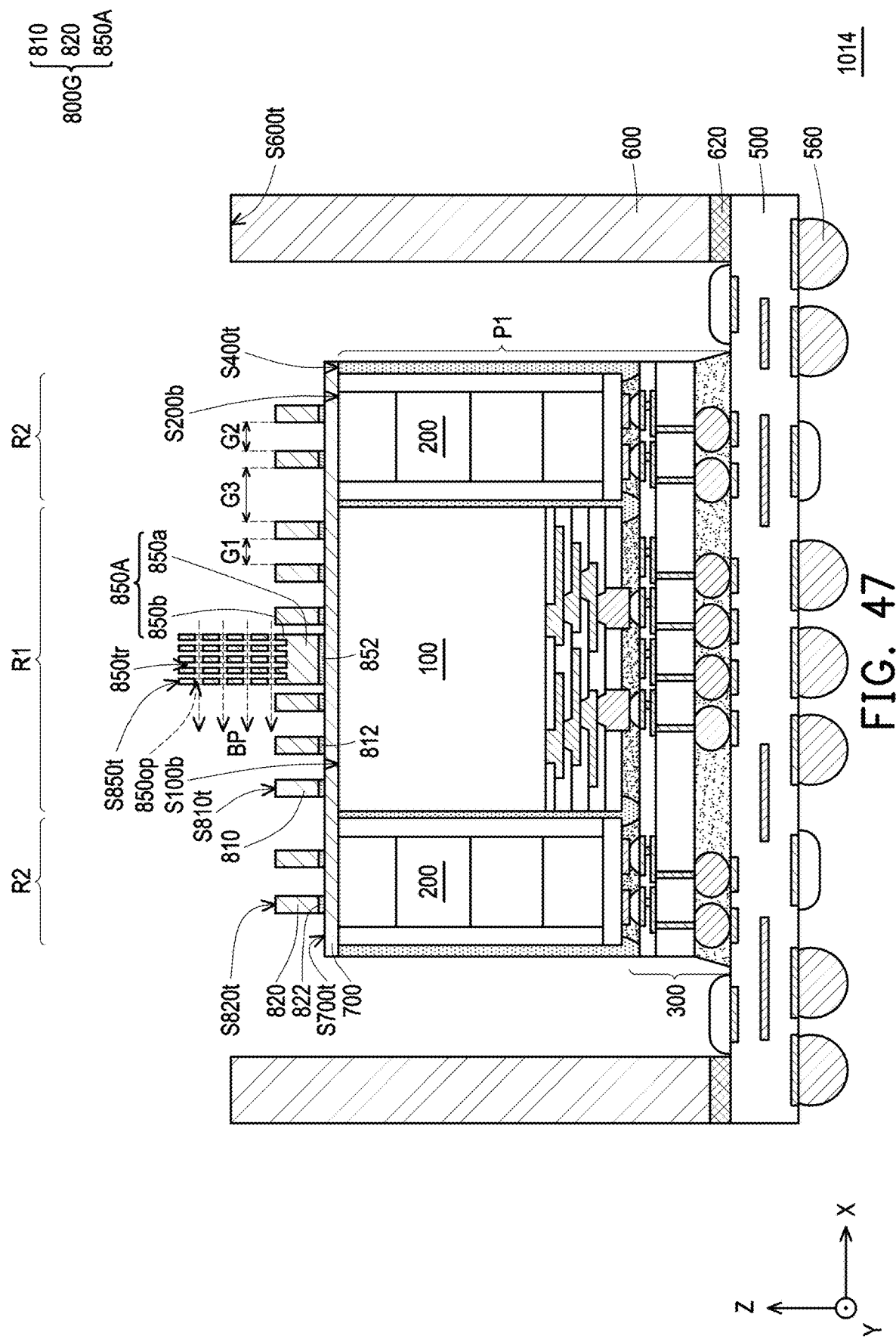
FIG. 47 through FIG. 49 are schematic cross-sectional views respectively illustrating a semiconductor package module having a thermal dissipating element with stacking structure in accordance with some embodiments of the disclosure.
Figure 48:
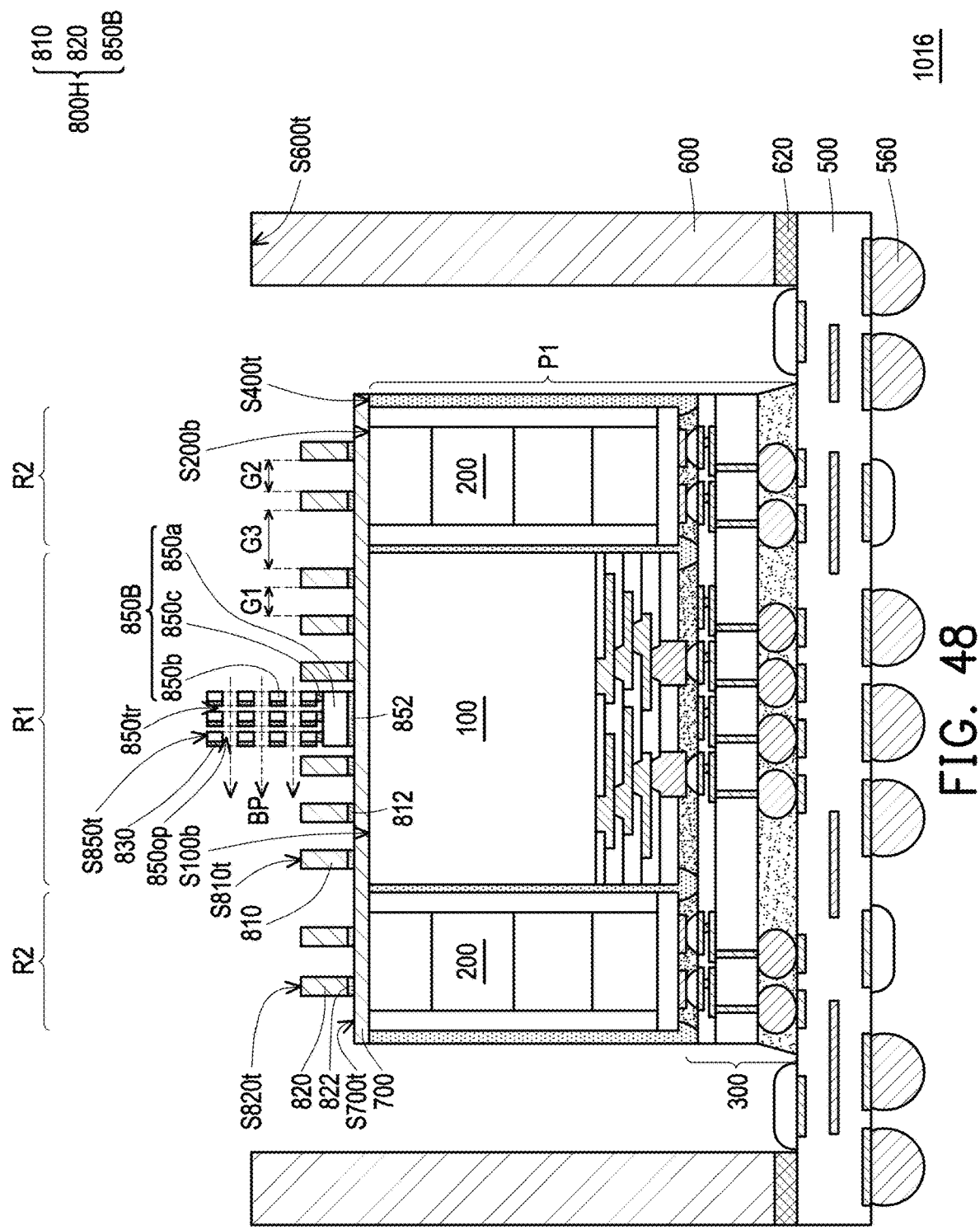
Figure 49:
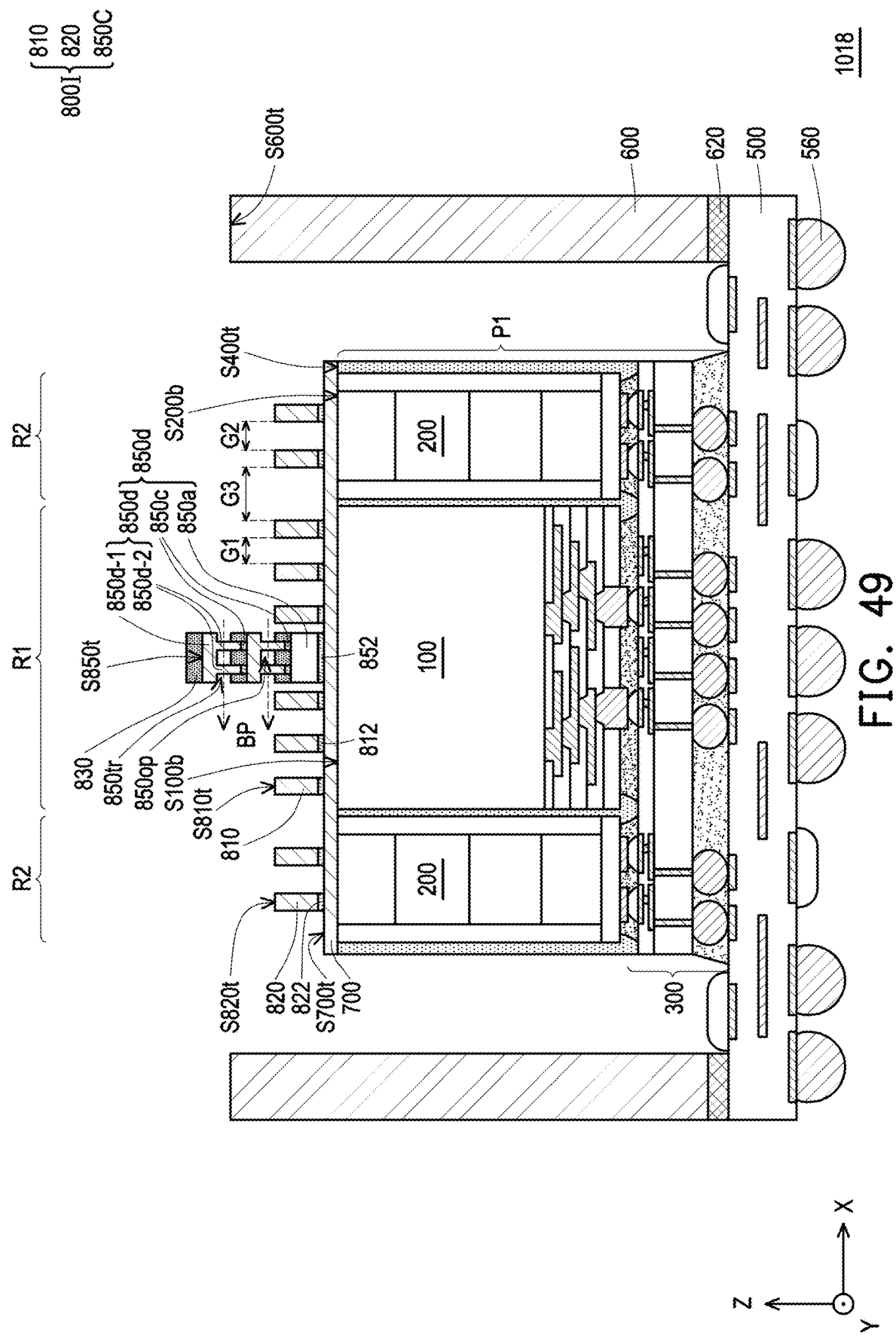

In some alternative embodiments, one or more than one heat dissipating element 810 may be substituted by a heat dissipating element having a stacking structure (stacking along a X-Z plane or a Y-Z plane). FIG. 47 through FIG. 49 are schematic cross-sectional views respectively illustrating a semiconductor package module having a thermal dissipating element with stacking structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

For example, a semiconductor package module 1014 of FIG. 47 is similar to the semiconductor package module 1000 of FIG. 3; the difference is that, the semiconductor package module 1014 includes a heat dissipating element 800G, instead of the heat dissipating element 800. For example, the heat dissipating element 800G includes a plurality of heat dissipating elements 810, a plurality of dissipating elements 820, and at least one heat dissipating element 850A. The details of the heat dissipating elements 810 and the heat dissipating elements 820 have been described in FIG. 3, and thus are not repeated herein.

As shown in FIG. 47, the at least one heat dissipating element 850A may include one heat dissipating element 850A for illustrative purposes and simplicity, the disclosure is not limited thereto. The heat dissipating element 850A may be bonded to the surface S700t of the metallization layer 700 through a connecting portion 852. For example, as shown in FIG. 47, the heat dissipating element 850A is disposed on and thermally coupled to the metallization layer 700. The formation and material of the connecting portion 852 may be similar to or substantially identical to the formation and material of the connection portions 812 and/or 822, and thus are not repeated herein for brevity. The heat dissipating element 850A may be further electrically coupled to the metallization layer 700.

In some embodiments, the heat dissipating element 850A includes a base 850*a* and a plurality of branches 850*b* stacked on the base 850*a*, where the branches 850*b* extend in the direction Z (e.g., along the X-Z plane or along the Y-Z plane) and are distributed over an illustrated top surface of the base 850*a* (e.g., on the X-Y plane). In the case, the branches 850*b* are separated from each other by trenches 850*tr*, where the trenches 850*tr* extend in the direction Z (e.g., along the X-Z plane or along the Y-Z plane) and stop at the illustrated top surface of the base 850*a*. On the other hand, the branches 850*b* may independently include a plurality of openings 850*op*, where the openings 850*op* may penetrate through the branches 850*b* and extend in the direction X, as shown in FIG. 47. Alternatively, the openings 850*op* may penetrate through the branches 850*b* and extend in the direction Y. Moreover, the opening 850*op* located at the same height-level may be aligned with one another. In some embodiments, the trenches 850*tr* and the openings 850*op* are spatially communicated with each other, and serve as part of the bubble path BP.

In some embodiments, as shown in FIG. 47, the base 850*a* and the branches 850*b* of the heat dissipating elements 850A are integrally formed. That is, a material of the base 850*a* of the heat dissipating elements 850A may be the same as materials of the branches 850*b* of the heat dissipating elements 850A. For example, the base 850*a* and the branches 850*b* are made of copper, copper alloy, graphite block, graphite sheet, copper-diamond, or Ag-diamond. In other embodiments, an additional coating layer (e.g., the coating layer 830, the coating layer 840, or both of the coating layers 830, 840) may be coated onto the heat dissipating elements 850A, partially or entirely.

For another example, a semiconductor package module 1016 of FIG. 48 is similar to the semiconductor package module 1014 of FIG. 47; the difference is that, the semiconductor package module 1016 includes a heat dissipating element 800H, instead of the heat dissipating element 800G. For example, the heat dissipating element 800H includes a plurality of heat dissipating elements 810, a plurality of dissipating elements 820, and at least one heat dissipating element 850B. As shown in FIG. 48, the at least one heat dissipating element 850B may include one heat dissipating element 850B for illustrative purposes and simplicity, the disclosure is not limited thereto. The heat dissipating element 850B may be bonded to the surface S700*t* of the metallization layer 700 through a connecting portion 852. For example, as shown in FIG. 48, the heat dissipating element 850B is disposed on and thermally coupled to the metallization layer 700. The heat dissipating element 850B may be further electrically coupled to the metallization layer 700.

In some embodiments, the heat dissipating element 850B includes a base 850*a*, a plurality of branches 850*b* and a plurality of connectors 850*c* connecting the base 850*a* and the branches 850*b*, where the branches 850*b* extend in the direction Z (e.g., along the X-Z plane or along the Y-Z plane) and are distributed over an illustrated top surface of the base 850*a* (e.g., on the X-Y plane). In the case, the branches 850*b* are separated from each other by trenches 850*tr*, where the trenches 850*tr* extend in the direction Z (e.g., along the X-Z plane or along the Y-Z plane) and stop at the illustrated top surface of the base 850*a*. On the other hand, the branches 850*b* may independently include a plurality of openings 850*op*, where the openings 850*op* may penetrate through the branches 850*b* and extend in the direction X, as shown in FIG. 48. Alternatively, the openings 850*op* may penetrate through the branches 850*b* and extend in the direction Y. Moreover, the opening 850*op* located at the same height-level may be aligned with one another. In some embodiments, the trenches 850*tr* and the openings 850*op* are spatially communicated with each other, and serve as part of the bubble path BP.

In some embodiments, as shown in FIG. 48, the base 850*a* and the branches 850*b* of the heat dissipating elements 850B are separately formed and mechanically connected through the connectors 850*c*. That is, the material of the base 850*a* of the heat dissipating elements 850B may be the different from the materials of the branches 850*b* of the heat dissipating elements 850B. For example, the base 850*a* is made of copper, copper alloy, or Ag-diamond, and the branches 850*b* are made of graphite block, graphite pin, copper, copper alloy, copper-diamond, or Ag-diamond. In some embodiments, the connectors 850*c* includes solder joints. In other embodiments, an additional coating layer (e.g., the coating layer 830, the coating layer 840, or both of the coating layers 830, 840) may be coated onto the heat dissipating elements 850B, partially or entirely. For example, as shown in FIG. 48, the additional coating layer (e.g., the coating layer 830) is formed on a main side of each of the branches 850*b*. The connectors 850*c* may be free of the additional coating layer, such as the coating layer 830, the coating layer 840, or both of the coating layers 830, 840.

For another example, a semiconductor package module 1018 of FIG. 49 is similar to the semiconductor package module 1014 of FIG. 47; the difference is that, the semiconductor package module 1018 includes a heat dissipating element 800I, instead of the heat dissipating element 800G. For example, the heat dissipating element 800I includes a plurality of heat dissipating elements 810, a plurality of dissipating elements 820, and at least one heat dissipating element 850C. As shown in FIG. 49, the at least one heat dissipating element 850C may include one heat dissipating element 850C for illustrative purposes and simplicity, the disclosure is not limited thereto. The heat dissipating element 850C may be bonded to the surface S700*t* of the metallization layer 700 through a connecting portion 852. For example, as shown in FIG. 49, the heat dissipating element 850C is disposed on and thermally coupled to the metallization layer 700. The heat dissipating element 850C may be further electrically coupled to the metallization layer 700.

In some embodiments, the heat dissipating element 850C includes a base 850*a*, a plurality of branches 850*b* and a plurality of connectors 850*c*, where the branches 850*b* each include a body 850*b*-1 and at least one pin 850*b*-2 connecting to a main side of the body 850*b*-1. The at least one pin 850*b*-2 may include a plurality of pins 850*b*-2, as shown in FIG. 49. The branches 850*b* may be sequentially stacked on the base 850*a* one-by-one through the connectors 850*c*. For example, one branch 850*b* of a first tier is stacked on the base 850*a* through some of the connectors 850*c* and the respective pins 850*b*-2, the pins 850*b*-2 of another one branch 850*b* of a second tier are stacked on the body 850*b*-1 of the one branch 850*b* of the first tier through some other of the connectors 850*c*, and so forth. Along the direction Z, the first tier of the branches 850*b* is stacked on the base 850*a*, and the second tier of the branches 850*b* is stacked on the first tier, as shown in FIG. 49, for example. In the case, the body 850*b*-1 and the pins 850*b*-2 of each branch 850*b* of the heat dissipating element 850C are integrally formed. The first tier of the branches 850*b* and the second tier of the branches 850*b* may together constitute a branch stack which is disposed on the base 850*a*.

The body 850*b*-1 of each of the branches 850*b* may extend along the illustrated top surface of the base 850*a* (e.g., on the X-Y plane), and the pins 850*b*-2 of each of the branches 850*b* may extend in the direction Z (e.g., along the X-Z plane or along the Y-Z plane). In the case, the bodies 850*b*-1 of two adjacent branches 850*b* are separated from each other by trenches 850*tr*, where the trenches 850*tr* extend in the direction X and/or Y and pass through the branches 850*b* (e.g. the branch stack). On the other hand, the pins 850*b*-2 of each of the branches 850*b* may be separated from each other by openings 850*op*, where the openings 850*op* may extend in the direction Z (e.g., along the X-Z plane or along the Y-Z plane) and stop at two opposite surfaces of the bodies 850*b*-1 of respective two adjacent branches 850*b*. In some embodiments, the trenches 850*tr* and the openings 850*op* are spatially communicated with each other, and serve as part of the bubble path BP.

In some embodiments, as shown in FIG. 49, the base 850*a* and the branches 850*b* of the heat dissipating elements 850C are separately formed and mechanically connected through the connectors 850*c*. That is, the material of the base 850*a* of the heat dissipating elements 850C may be the different from the materials of the branches 850*b* of the heat dissipating elements 850C. For example, the base 850*a* is made of copper, copper alloy, or Ag-diamond, and the branches 850*b* are made of graphite block, graphite pin, copper, copper alloy, copper-diamond, or Ag-diamond. In some embodiments, the connectors 850*c* includes solder joints. In other embodiments, an additional coating layer (e.g., the coating layer 830, the coating layer 840, or both of the coating layers 830, 840) may be coated onto the heat dissipating elements 850C, partially or entirely. For example, as shown in FIG. 49, the additional coating layer (e.g., the coating layer 830) is formed on a main surface of each of the branches 850*b*. The connectors 850*c* may be free of the additional coating layer, such as the coating layer 830, the coating layer 840, or both of the coating layers 830, 840.

Although not shown, a heat dissipating element may include the heat dissipating elements 810, 820, 850A and 850B, the heat dissipating elements 810, 820, 850A and 850C, the heat dissipating elements 810, 820, 850B and 850C, the heat dissipating elements 810, 820, 850A, 850B and 850C, where the heat dissipating elements 850A, 850B and/or 850C may be placed in the region R1 with the heat dissipating elements 810 and/or in the regions R2 with the heat dissipating elements 820, with or without the modifications in FIG. 9 through FIG. 46; the disclosure is not limited thereto. In further alternative embodiments, a heat dissipating element may include the heat dissipating elements 810 or 820 in addition to the heat dissipating elements 850A and 850B, the heat dissipating elements 810 or 820 in addition to the heat dissipating elements 850A and 850C, the heat dissipating elements 810 or 820 in addition to the heat dissipating elements 850B and 850C, the heat dissipating elements 810 or 820 in addition to the heat dissipating elements 850A, 850B and 850C, where the heat dissipating elements 850A, 850B and/or 850C may be placed in the region R1 with or without the heat dissipating elements 810 and/or in the regions R2 with or without the heat dissipating elements 820, with or without the modifications in FIG. 9 through FIG. 46. For example, a height-level of each of the top surfaces S850*t* of the heat dissipating elements 850A, 850B, and/or 850C may be independently higher than, lower than, or substantially the same as a height-level of the illustrated top surface S600*t* of the supporting structure 600, the disclosure is not limited thereto. In some embodiments, the connecting portions 852 are considered as part of each of the heat dissipating elements 800G, 800H, and 800I.

The heat dissipating elements 850A, 850B, and 850C independently provides multiple through holes (e.g., the trenches 850*tr* and/or the openings 850*op*) formed therein, which facilitates the bubble flow, thereby improving the localized heat transfer on extreme high-power density of logic circuits (such as CPU/GPI core or the like), in some embodiments. The heat dissipating elements 850A, 850B, and 850C may be independently referred to as a microstructure or a boiling enhancement microstructure (BEM) for hot spot spreading. For an example, the heat dissipating elements 850A, 850B, and/or 850C are used for 6 W/mm$^2$ hot spot dissipation. These heat dissipating elements 850A, 850B, and 850C are compatible with the current manufacturing process and are designed to be compatible with a two-phase immersion cooling apparatus (e.g., the immersion cooling apparatus 50 as shown in FIG. 2) or a single-phase immersion cooling apparatus (not shown).

With such, the rising vapors described in FIG. 2 moves along the bubble path BP which passing through the spaces of the heat dissipating elements 810, 820, 850A, 850B, and/or 850C and the openings 850*op* and/or the trenches 850*tr* formed in the heat dissipating elements 850A, 850B, and/or 850C, where the heat generated from the semiconductor package P1 is then removed through the heat dissipating elements 810, 820, 850A, 850B, and/or 850C (in a vertical direction) and the metallization layer 700 (in a horizontal direction), for example. Owing to the stacking structure (extending along a X-Z plane or a Y-Z plane; e.g., 850A, 850B, 850C), more heat dissipating area can be greatly provided.

Figure 50:
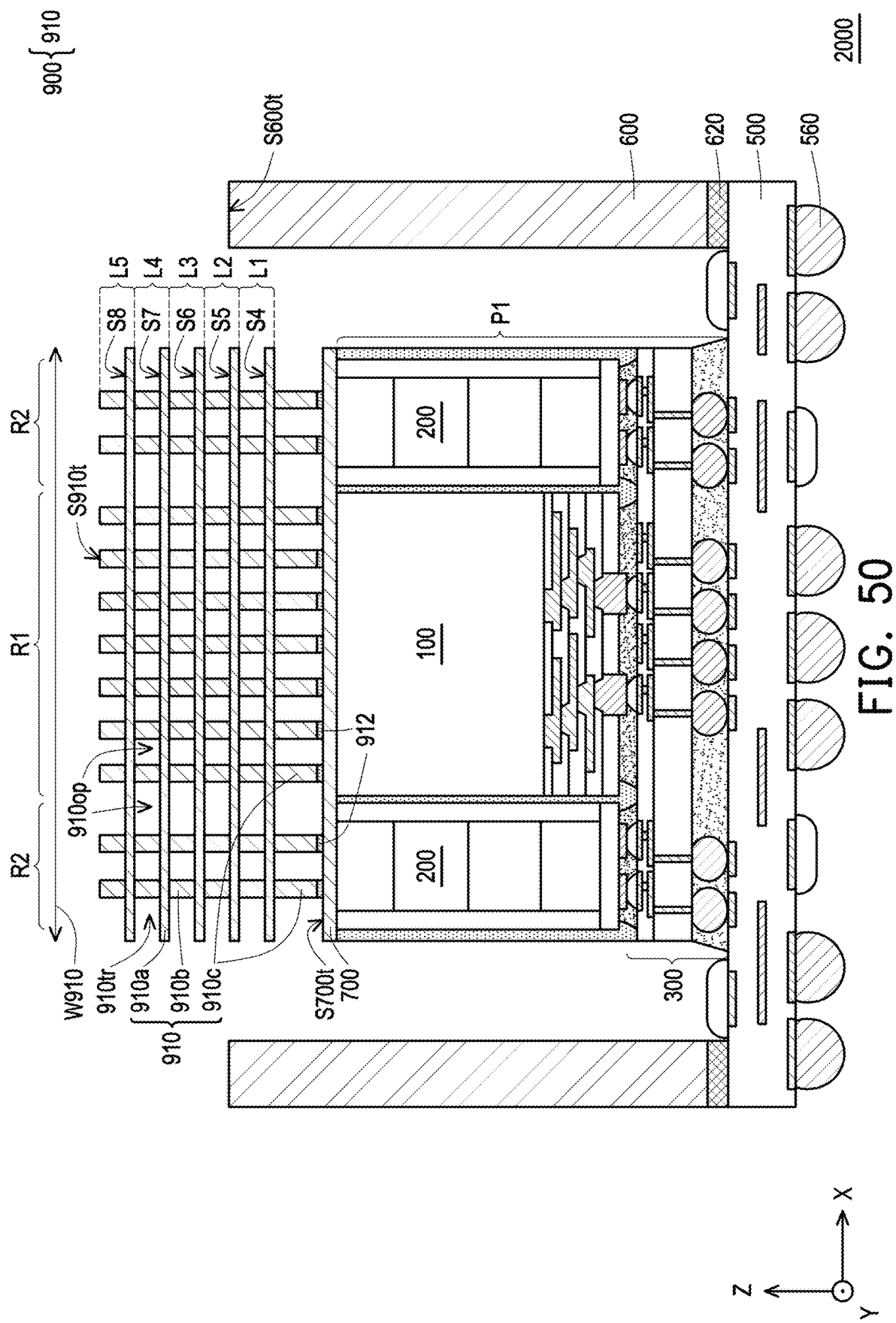
FIG. 50 is a schematic cross-sectional view illustrating a semiconductor package module in accordance with some embodiments of the disclosure.
Figure 51:
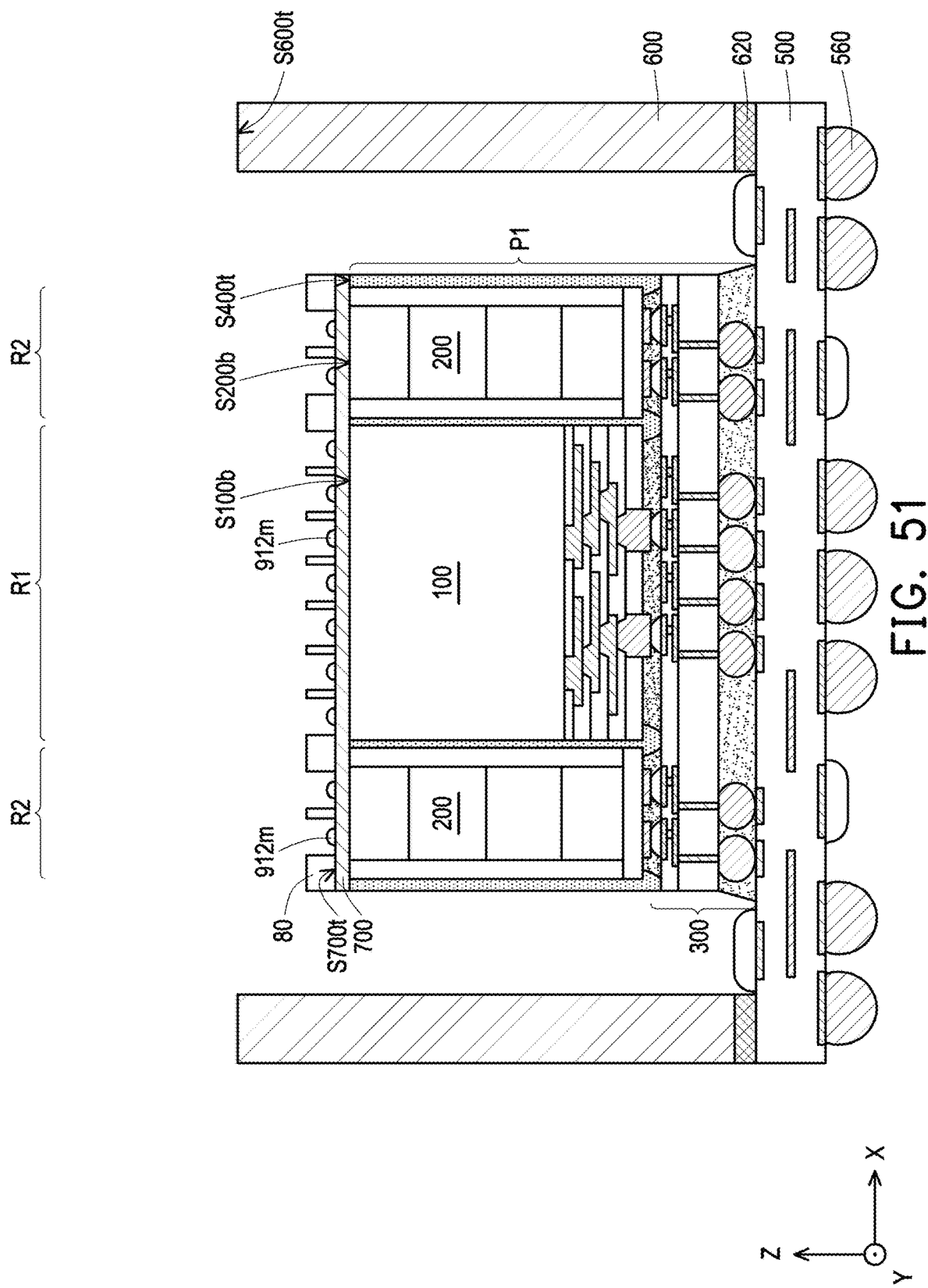
Figure 58:
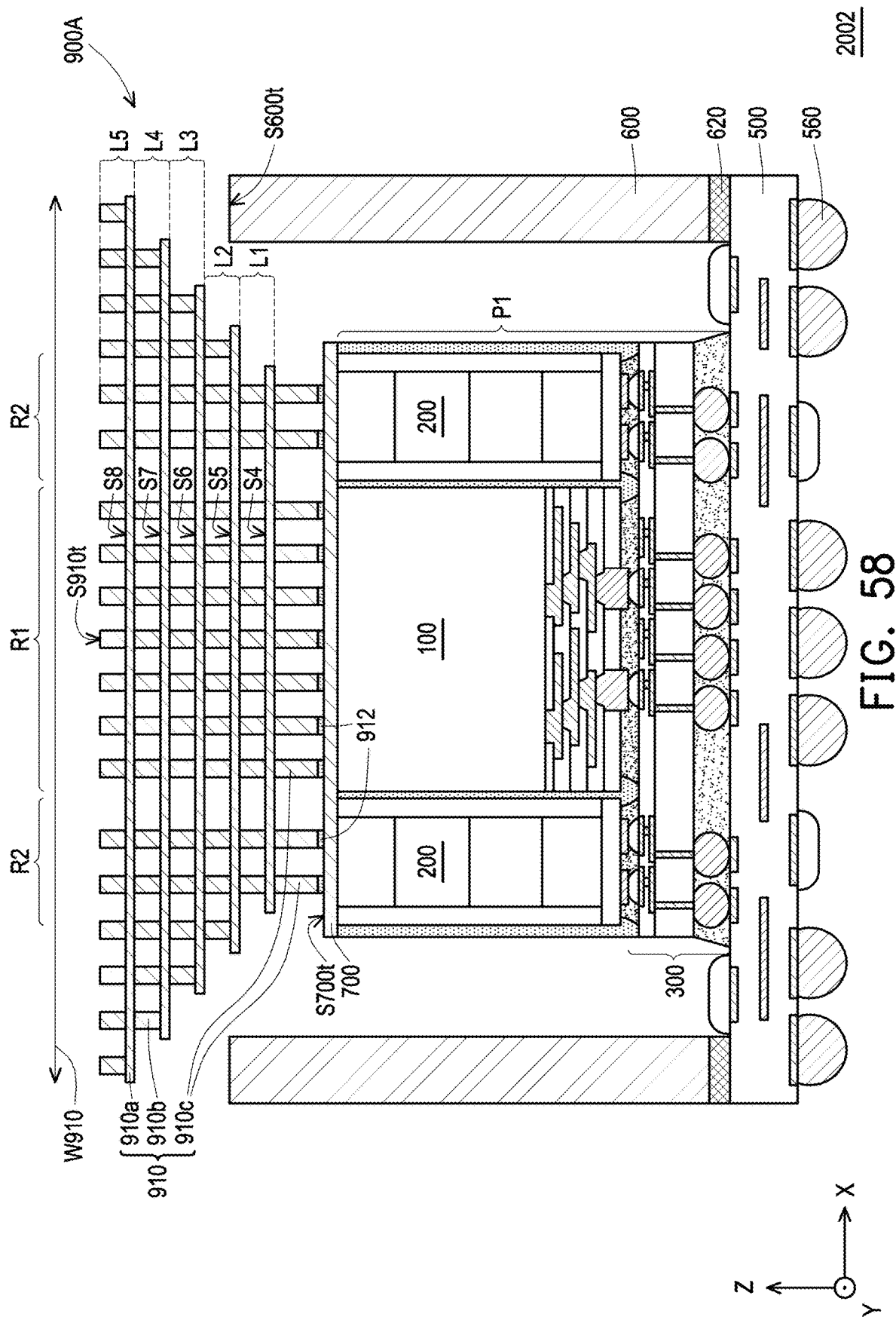
FIG. 58 through FIG. 60 are schematic cross-sectional views respectively illustrating a semiconductor package module in accordance with some alternative embodiments of the disclosure.
Figure 59:
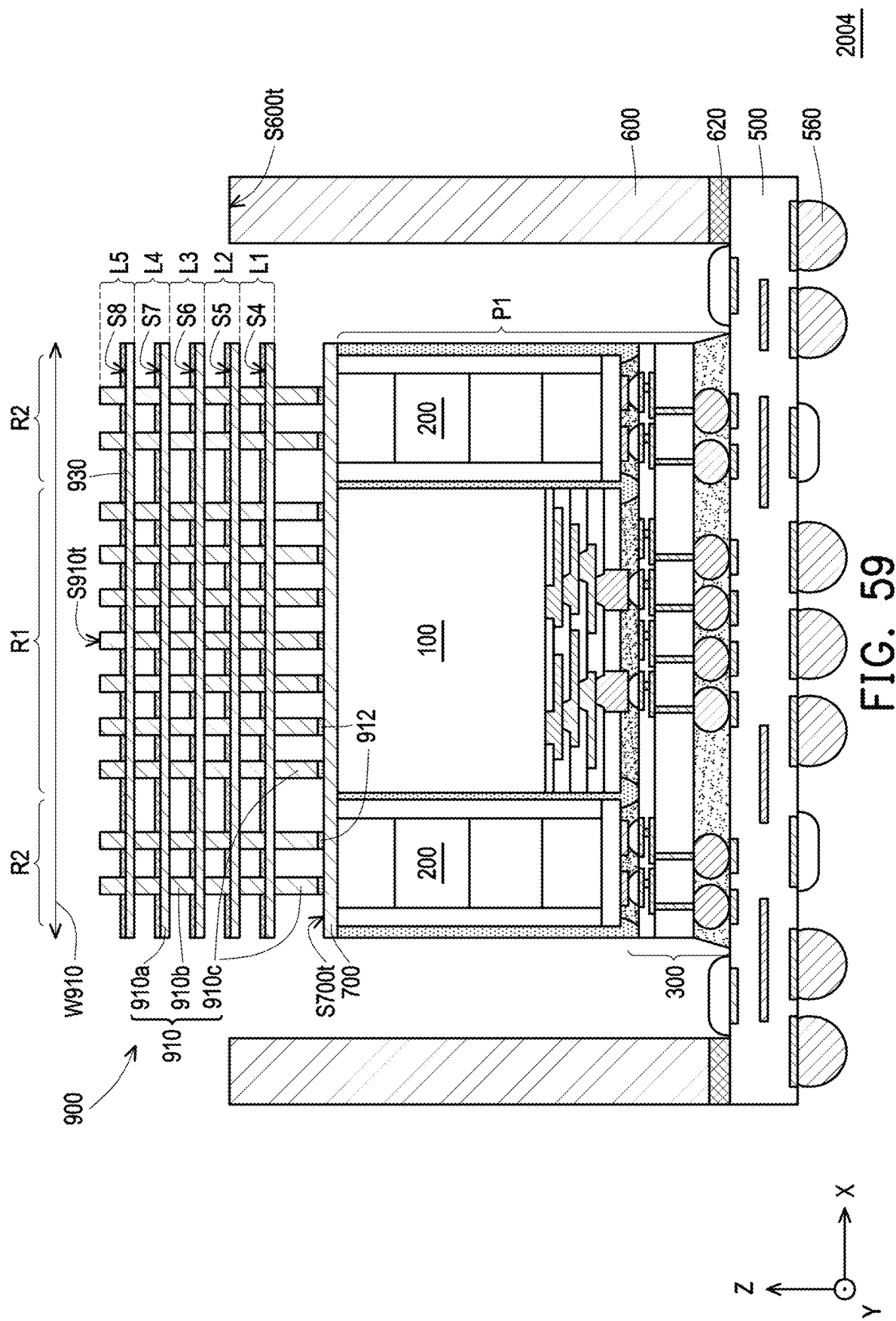
Figure 60:
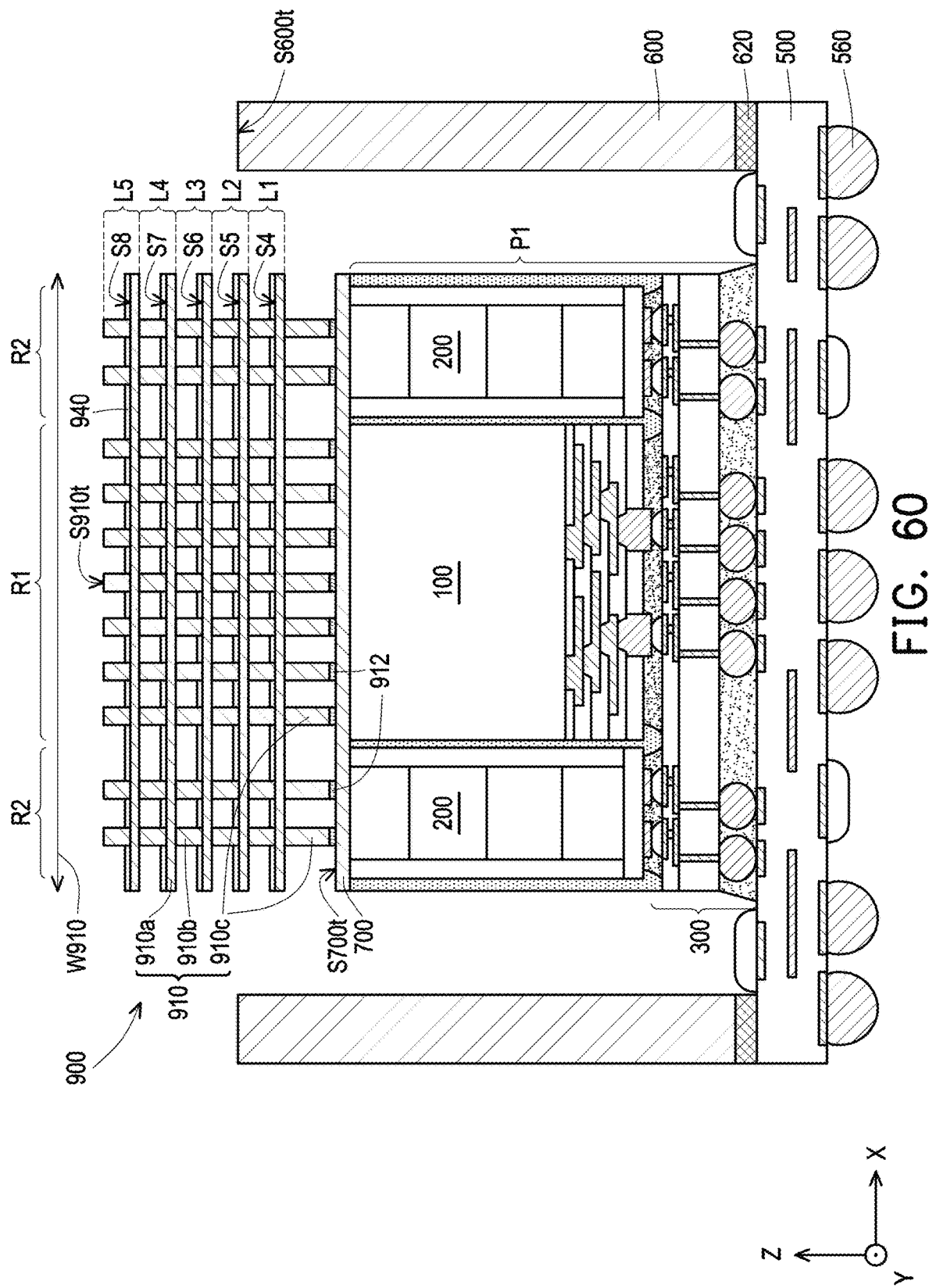

FIG. 50 is a schematic cross-sectional view illustrating a semiconductor package module 2000 in accordance with some embodiments of the disclosure. FIG. 51 through FIG. 52 are schematic cross-sectional views showing a method of manufacturing a semiconductor package module 2000 depicted in FIG. 3. FIG. 53 through FIG. 57 are schematic top views respectively illustrating a portion of a thermal dissipating element in a semiconductor package module in accordance with some embodiments of the disclosure. FIG. 58 through FIG. 60 are schematic cross-sectional views respectively illustrating a semiconductor package module in accordance with some alternative embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 50, in some embodiments, the semiconductor package modules 2000 includes a semiconductor package P1, a circuit substrate 500, a supporting structure 600, a metallization layer 700, and a heat dissipating element 900. For example, the semiconductor package P1 is bonded to and electrically connected to the circuit substrate 500, and the supporting structure 600 is bonded to and connected to the circuit substrate 500 through the adhesive 620. The semiconductor package P1 may be further thermally coupled to the circuit substrate 500. The supporting structure 600 may be thermally coupled to, electrically coupled to, or thermally and electrically coupled to the circuit substrate 500. In the case, the semiconductor package P1 is further electrically isolated from the supporting structure 600. Owing to the supporting structure 600, the warpage control of the semiconductor package module 2000 is enhanced. In addition, the heat may further be transferred from the circuit substrate 500 to the supporting structure 600 for dissipating. In some embodiments, the metallization layer 700 is disposed on (e.g. in physical contact with) and thermally coupled to the semiconductor package P1. For example, the semiconductor package P1 is electrically isolated from the metallization layer 700. The details of the semiconductor package P1, the circuit substrate 500, the supporting structure 600, and the metallization layer 700 have been discussed in FIG. 3 through FIG. 7, and thus are not repeated herein for brevity. In the case, the circuit substrate 500 is mounted to and electrically coupled to the printed circuit board MB (as depicted in FIG. 1).

In some embodiments, the heat dissipating element 900 is mounted to the metallization layer 700, where the metallization layer 700 is disposed between the heat dissipating element 900 and the semiconductor package P1. In some embodiments, the heat dissipating element 900 is thermally coupled to and electrically isolated from the semiconductor package P1 through the metallization layer 700. As shown in FIG. 50, the heat dissipating element 900 may include a heat dissipating element 910 having a 3D structure with a plurality of build-up layers L1 to L5, where widths of the build-up layers L1 to L5 of the heat dissipating element 910 may be substantially the same to each other. That is, for example, a width W910 of the heat dissipating element 900 is constant. Although only five build-up layers are shown in FIG. 50, however the number of the build-up layers included in the heat dissipating element 910 is not limited to the drawings of the disclosure. The number of the build-up layers included in the heat dissipating element 910 may be selected and designated based on the demand and the design requirement, and can be less than five layers or more than five layers. Owing to the heat dissipating element 900 (including the heat dissipating element 910), more heat dissipating area can be greatly provided, thus the heat dissipation of the semiconductor package module 2000 in the immersion cooling apparatus 50 is enhanced (without shorting). That is, owing to the heat dissipating element 900, a better thermal control for each semiconductor package module 2000 is achieved, such that the performance of the semiconductor package P1 included in each semiconductor package module 2000 is improved, thereby ensuring the reliability of the semiconductor package module 2000.

In a vertical projection along the direction Z, the heat dissipating element 910 may be disposed in an area surrounding by the supporting structure 600. In other words, the heat dissipating element 900 is not overlapped with the supporting structure 600, for example. An illustrated top surface S910t of the heat dissipating element 910 may be higher than the illustrated top surface S600t of the supporting structure 600, as shown in FIG. 50. Although not shown, the illustrated top surface S910t of the heat dissipating element 910 may be lower than the illustrated top surface S600t of the supporting structure 600. Or, the illustrated top surface S910t of the heat dissipating element 910 may be at a height-level where the illustrated top surface S600t of the supporting structure 600 located at. As shown in FIG. 50, for example, the heat dissipating element 910 is disposed in the region R1 and the regions R2. In other words, the heat dissipating element 900 extends from the semiconductor die 100 to the semiconductor 200.

In some embodiments, the heat dissipating element 910 includes a plurality of bases 910a, a plurality of branches 910b and a plurality of pins 910c, where each layer of the build-up layers L1-L5 includes one base 910a and multiple branches 910b stacked thereon. The number of the branches 910b included in each build-up layer and the number of the pins 910c are shown for illustrative purposes, and may be selected and designated based on the demand and design requirement; the disclosure is not limited thereto. As shown in FIG. 50, along the direction Z, the base 910a of the build-up layer L2 is stacked on and connected to the base 910a of the build-up layer L1 through the branches 910b of the build-up layer L1, the base 910a of the build-up layer L3 is stacked on and connected to the base 910a of the build-up layer L2 through the branches 910b of the build-up layer L2, the base 910a of the build-up layer L4 is stacked on and connected to the base 910a of the build-up layer L3 through the branches 910b of the build-up layer L3, and the base 910a of the build-up layer L5 is stacked on and connected to the base 910a of the build-up layer L4 through the branches 910b of the build-up layer L4, for example. In the case, the pins 910c are connected to a side of the build-up layer L1 opposite to the build-up layers L2-L5, and are connected to and thermally coupled to the metallization layer 700 through connecting portions 912. The pins 910c are separated from each other by a non-zero distance, in some embodiment. For example, the connecting portions 912 includes solder joints or like, the disclosure is not limited thereto. The heat dissipating element 910 may be electrically coupled to the metallization layer 700. In some embodiments, the connecting portions 912 are considered as part of the heat dissipating element 900.

The bases 910a included in the build-up layers L1-L5 may extends in along the X-Y plane. In the case, the bases 910a are separated from each other through trenches 910tr, where the trenches 910tr extend along the X-Y plane and pass through the heat dissipating element 910. On the other hand, the branches 910b included in the build-up layers L1-L5 may extends in the direction Z (e.g., along the X-Z plane or along the Y-Z plane). The branches 910b included in the build-up layer L1 may be disposed on and distributed over a main side S4 of the base 910a in the build-up layer L1, the branches 910b included in the build-up layer L2 may be disposed on and distributed over a main side S5 of the base 910a in the build-up layer L2, the branches 910b included in the build-up layer L3 may be disposed on and distributed over a main side S6 of the base 910a in the build-up layer L3, the branches 910b included in the build-up layer L4 may be disposed on and distributed over a main side S7 of the base 910a in the build-up layer L4, and the branches 910b included in the build-up layer L5 may be disposed on and distributed over a main side S8 of the base 910a in the build-up layer L5. In the case, the branches 910b included in the build-up layers L1-L5 are separated from each other by openings 910op, where the openings 910op for the build-up layers L1-L5 extend in the direction Z (e.g., along the X-Z plane or along the Y-Z plane). In some embodiments, the trenches 910tr and the openings 910op are spatially communicated with each other, and serve as part of the bubble path BP.

Figure 53:
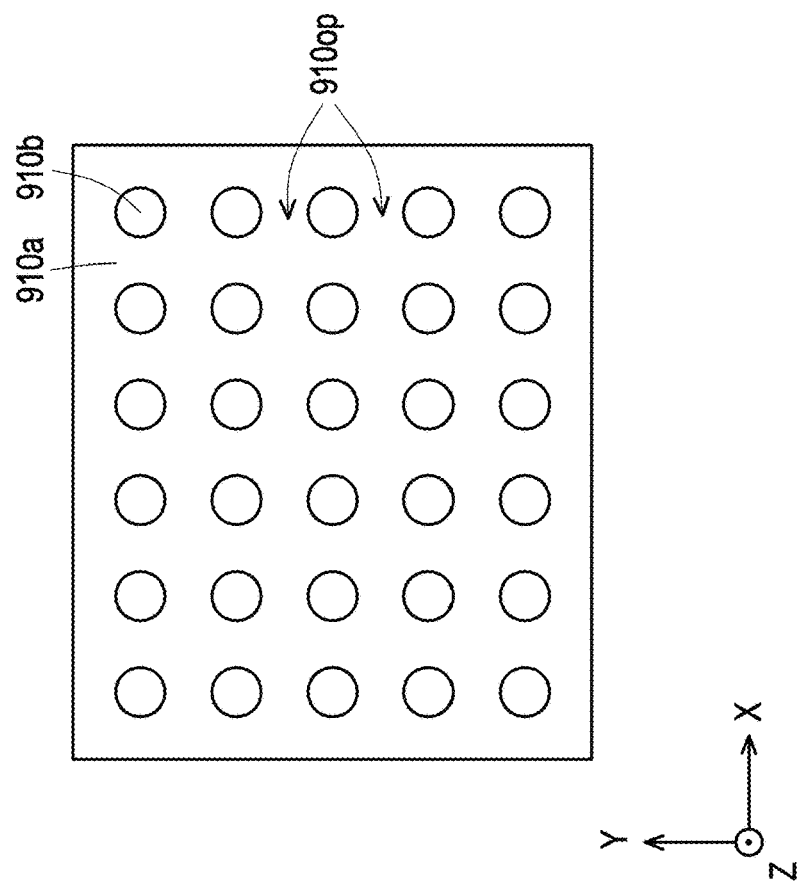
Figure 56:
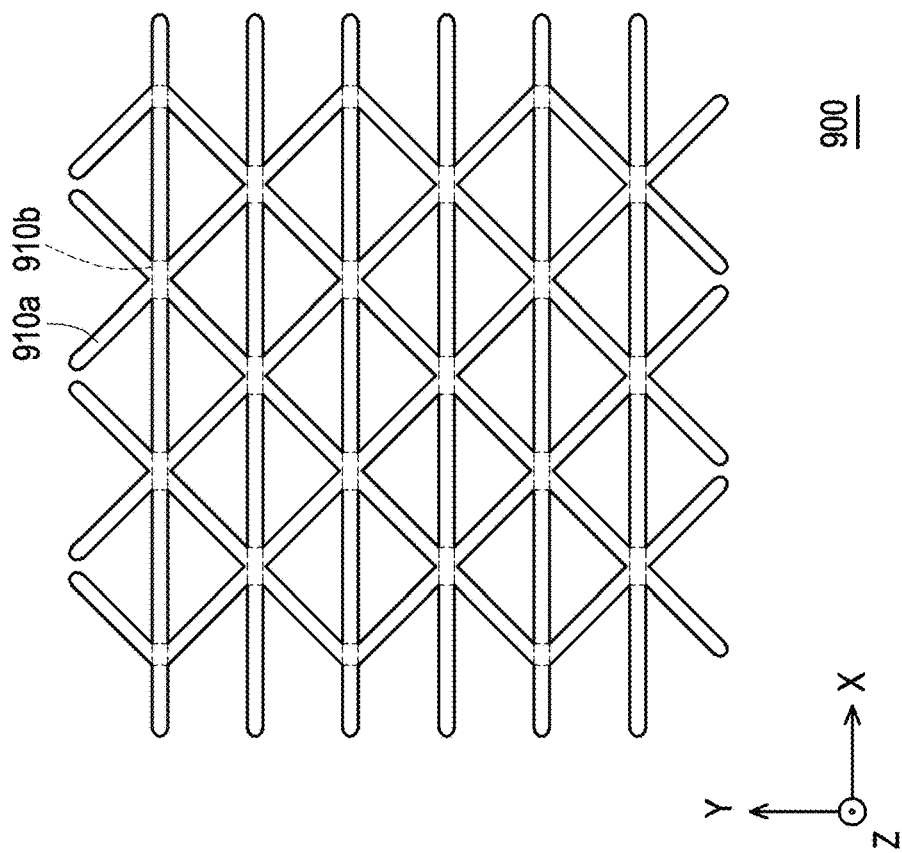

In addition, with respect to the X-Y plane, the bases 910a independently be a planar plate or a convex-and-concave plate, with or without openings/slits. The bases 910a of the heat dissipating element 910 may be a block solid plate without openings, as shown in FIG. 53. In the case, the openings 910*op* do not penetrate through (e.g. the bases 910*a* of) the heat dissipating element 910 in the direction Z. For example, the openings 910*op* for the build-up layers L1-L4 stop at two adjacent bases 910*a* (e.g. of L1-L2, L2-L3, L3-L4, and L4-L5), and the opening 910*op* for the build-up layer L5 stop at the base 910*a* of the build-up layer L5.

Figure 54:
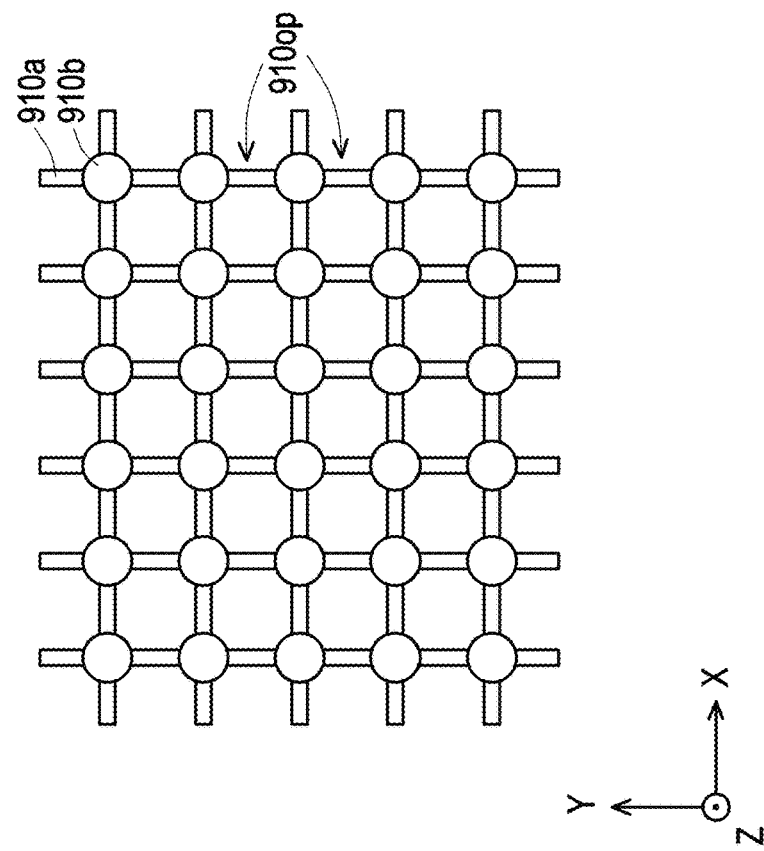
FIG. 53 through FIG. 57 are schematic top views respectively illustrating a portion of a thermal dissipating element in a semiconductor package module in accordance with some embodiments of the disclosure.
Figure 55:
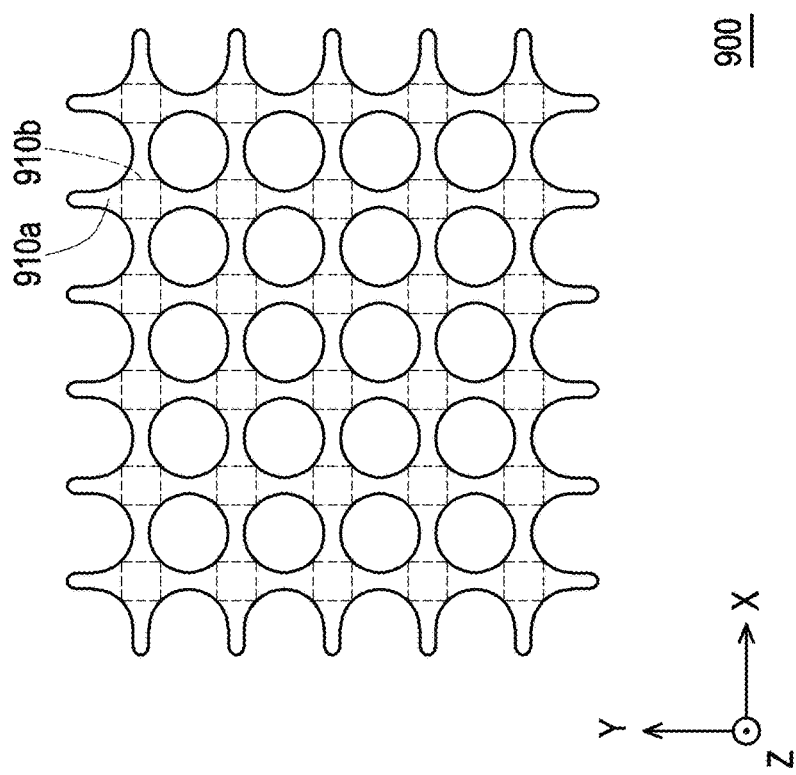
Figure 57:
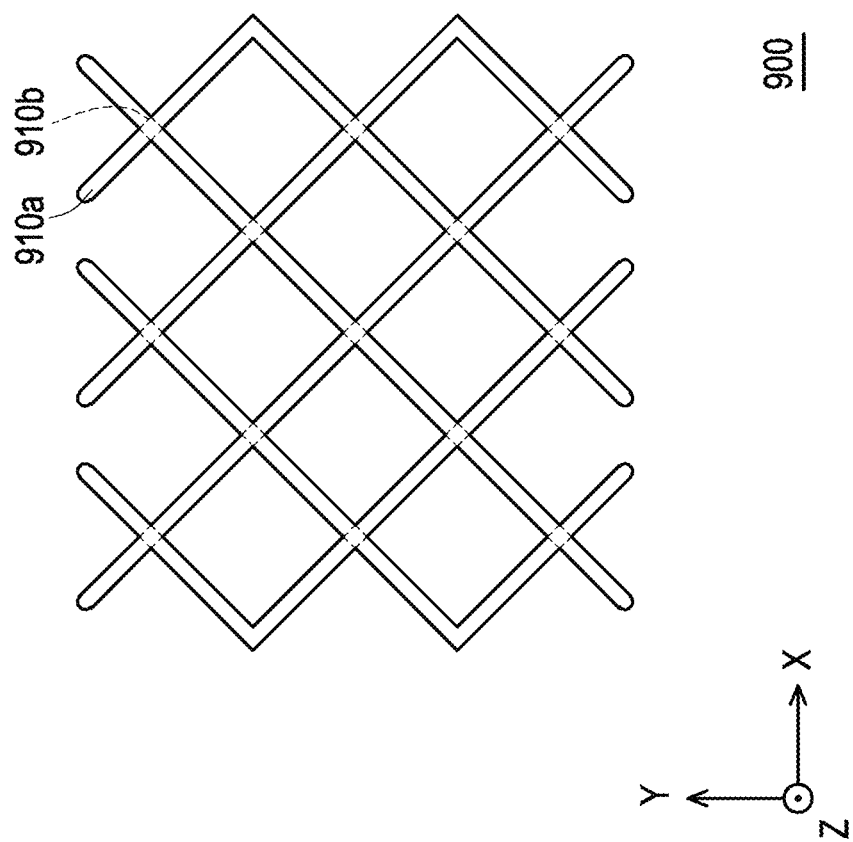

Alternatively, the bases 910*a* of the heat dissipating element 910 may be a mesh or gird form with openings, as shown in FIG. 54. In the case, the openings 910*op* penetrate through (e.g. the bases 910*a* of) the heat dissipating element 910 in the direction Z. For example, each of the openings 910*op* simultaneously pass through the bases 910*a* of the build-up layers L1-L5. In one embodiment, on a top view as shown in FIG. 55, a cross-section of each of the openings 910*op* penetrating through the heat dissipating element 910 includes a circular shape. However, the disclosure is not limited thereto, on the top view, the cross-section of each of the openings 910*op* penetrating through the heat dissipating element 910 may include an elliptical shape, an oval shape, a triangular shape (FIG. 56), a rectangular shape (FIG. 57), or other suitable polygonal shapes.

The semiconductor package module 2000 may be formed by, but not limited to, providing and disposing the semiconductor package P1 on the circuit substrate 500 (similar to the step previously described in FIG. 4); disposing the supporting structure 600 on the circuit substrate 500 and forming the metallization layer 700 on the circuit substrate 500 (similar to the step previously described in FIG. 5); placing a stencil 80 having apertures (not labeled) over the metallization layer 700 and forming a flux layer including a plurality of flux portions 910*m* in the apertures (FIG. 51, which is similar to the step previously described in FIG. 6); removing the stencil 80 (FIG. 52); and placing the heat dissipating element 910 on the flux portions 912*m* and performing a reflow process to form the connecting portions 912 to bond the heat dissipating element 910 and the metallization layer 700 (similar to the step previously described in FIG. 7). The formation and material of the flux portions 912*m* and the formation and material of the connecting portions 912 are similar to or substantially identical to the formation and material of the flux portions 812*m*, 822*m* and the formation and material of the connecting portions 812, 822, and thus are not repeated herein for brevity.

In some embodiments, as shown in FIG. 50, the bases 910*a*, the branches 910*b* and the pins 910*c* of the heat dissipating element 910 are integrally formed. That is, a material of each of the bases 910*a*, the branches 910*b* and the pins 910*c* of the heat dissipating element 910 may be the same. For example, in the heat dissipating element 910, the bases 910*a*, the branches 910*b* and the pins 910*c* are made of graphite block, graphite pin, copper, copper alloy, aluminum, copper-diamond, or Ag-diamond. In some embodiments, the heat dissipating element 910 is formed by 3D-printing or a suitable forming method.

In alternative embodiments, the width of the heat dissipating element may be non-constant along the direction Z. For example, as shown in FIG. 58, the semiconductor package module 2002 includes a heat dissipating element 900A, instead of the heat dissipating element 900. In the case, the heat dissipating element 900A of FIG. 58 is similar to the heat dissipating element 900 of FIG. 50; the difference is that, a width W910 of the heat dissipating element 900A is increased in direction Z, from the build-up layer L1 towards to the build-up layer L5. For example, as shown in FIG. 58, the heat dissipating element 900A extends from the semiconductor die 100 to the semiconductor 200, and overlaps with the supporting structure 600. With such non-constant width in vertical direction, the heat dissipating element 900A can provide more heat dissipating area to the semiconductor package P1, thereby further enhancing the efficiency of heat dissipating for the semiconductor package module 2010.

In alternative embodiments, an additional coating layer (e.g., a coating layer 930, a coating layer 940, or both of the coating layers 930, 940) may be coated onto the heat dissipating element, partially or entirely. For example, a semiconductor package module 2004 of FIG. 59 is similar to the semiconductor package module 2000 of FIG. 50; the difference is that, the semiconductor package module 2004 further includes one or more coating layer(s) 930 disposed on surface(s) of the heat dissipating element 910. In some embodiments, as shown in FIG. 59, only the main sides (e.g. S4-S8) of the bases 910*a* of the heat dissipating element 910 are coated with the coating layers 930. Although not shown, in other embodiments, the surfaces (such as main sides (e.g. S4-S8), opposite sides to the main sides (e.g. S4-S8) of the bases 910*a* and/or their sidewalls connecting the main sides and the respective opposite sides) of the heat dissipating element 910, which are not in contact with the connecting portions 912 and are in contact with the dielectric coolant 54 (as shown in FIG. 2), are coated with the coating layers 930. The details of the coating layers 930 are similar to or substantially identical to the details of the coating layers 830 previously described, and thus are not repeated herein for brevity. The coating layers 930 may also be independently referred as a boiling enhancement coating (BEC) layer, a wicking layer, or a wicking structure. The porosity control at the surfaces of the heat dissipating element 910 is achieved by the coating layer(s) 930. In some embodiments, a thickness of the coating layer 930 is ranging from about 10 μm to about 1 mm. Owing to the coating layer(s) 930, the localized heat transfer on extreme high-power density of logic circuits (such as CPU/GPI core or the like) can be improved. With such coating layer 930, a heat removal with higher flux for a certain hot spot (e.g. a heat source generating more heat, such as a logic circuit or the like) can be achieved.

For another example, a semiconductor package module 2006 of FIG. 60 is similar to the semiconductor package module 2000 of FIG. 50; the difference is that, the semiconductor package module 2006 further includes one or more coating layer(s) 940 disposed on surface(s) of the heat dissipating element 910. In some embodiments, as shown in FIG. 60, only the main sides (e.g. S4-S8) of the bases 910*a* of the heat dissipating element 910 are coated with the coating layers 940. Although not shown, in other embodiments, the surfaces (such as main sides (e.g. S4-S8), opposite sides to the main sides (e.g. S4-S8) of the bases 910*a* and/or their sidewalls connecting the main sides and the respective opposite sides) of the heat dissipating element 910, which are not in contact with the connecting portions 912 and are in contact with the dielectric coolant 54 (as shown in FIG. 2), are coated with the coating layers 940. The details of the coating layers 940 are similar to or substantially identical to the details of the coating layers 840 previously described, and thus are not repeated herein for brevity. The coating layers 940 may also be independently referred as a surface treatment layer or a surface treatment structure. The wettability control at the surfaces of the heat dissipating element 910 is achieved by the coating layer(s) 940. In some embodiments, a thickness of the coating layer 940 is ranging from about 10 μm to about 1 mm. Owing to the coating layer(s) 940, the bubble detachment from the surfaces of the heat dissipating elements 910 can be promoted. With such coating layer 940, a heat removal with higher flux for a certain hot spot (e.g. a heat source generating more heat, such as a logic circuit or the like) can be achieved.

Although not shown, the heat dissipating element 910, in part or all, may be independently coated with both of the coating layer 930 and the coating layer 940. For example, the coating layer 930 is firstly disposed on the heat dissipating element 910, and the coating layer 940 is then disposed on the coating layer 930. That is, the heat dissipating element 910 may be wrapped by the coating layer 930, and the coating layer 930 may be wrapped by the coating layer 940.

FIG. 61 through FIG. 64 are schematic cross-sectional views respectively illustrating a semiconductor package module in accordance with some alternative embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Figure 61:
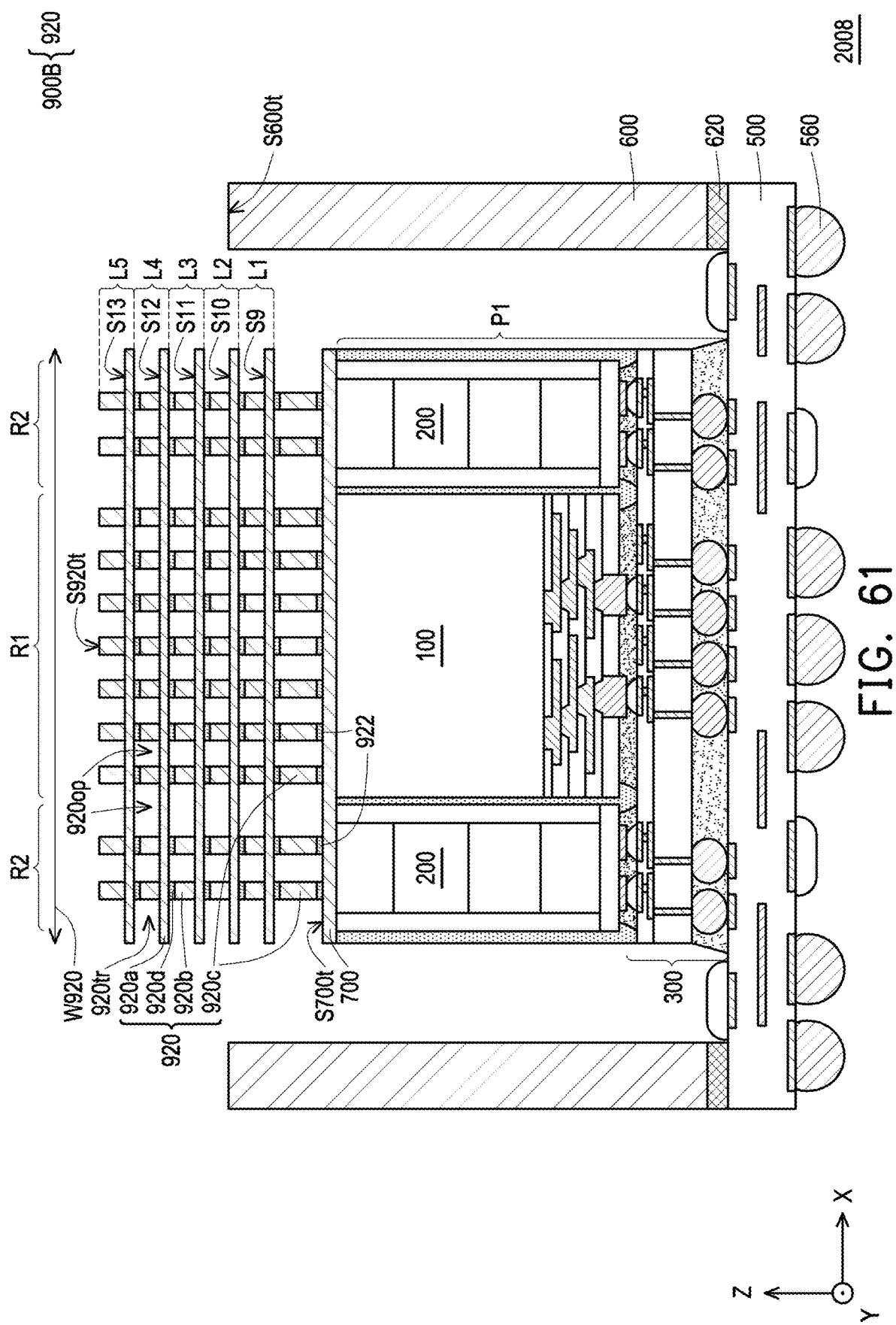
FIG. 61 through FIG. 64 are schematic cross-sectional views respectively illustrating a semiconductor package module in accordance with some alternative embodiments of the disclosure.

In some embodiments, a semiconductor package module 2008 of FIG. 61 is similar to the semiconductor package module 2000 of FIG. 50; the difference is that, the semiconductor package module 2008 includes a heat dissipating element 900B, instead of the heat dissipating element 900. For example, the heat dissipating element 900B includes a heat dissipating element 920, where the heat dissipating element 920 of the heat dissipating element 900B is similar to the heat dissipating element 910 of the heat dissipating element 900, except two adjacent build-up layer of build-up layers L1-L5 (each including a base 920a and branches 920b) are connected to one another by connectors 920d. In the case, the build-up layer L1 is also connected to pins 920c by the connectors 920d. In some embodiments, the heat dissipating element 920 has a 3D structure. The bases 920a, the branches 920b, the pins 920c and the connectors 920d of the heat dissipating element 920 are thermally connected to each other, in some embodiments. The bases 920a, the branches 920b, the pins 920c and the connectors 920d of the heat dissipating element 920 may be further electrically connected to each other.

In some embodiments, through connecting portions 922, the heat dissipating element 920 is electrically and thermally coupled to the metallization layer 700 that is thermally coupled with and electrically isolated from the semiconductor package P1. In the case, the heat dissipating element 920 is thermally coupled to and electrically isolated from the semiconductor package P1. Owing to the heat dissipating element 900B (including the heat dissipating element 920), more heat dissipating area can be greatly provided, thus the heat dissipation of the semiconductor package module 2008 in the immersion cooling apparatus 50 is enhanced (without shorting). That is, owing to the heat dissipating element 900B, a better thermal control for each semiconductor package module 2008 is achieved, such that the performance of the semiconductor package P1 included in each semiconductor package module 2008 is improved, thereby ensuring the reliability of the semiconductor package module 2008.

The number of the build-up layers included in the heat dissipating element 920 may be selected and designated based on the demand and the design requirement, and can be less than five layers or more than five layers. The number of the branches 920b included in each build-up layer and the number of the pins 920c are shown for illustrative purposes, and may be selected and designated based on the demand and design requirement; the disclosure is not limited thereto. The formation and material of the connectors 920d are similar to or substantially identical to the formation and material of the connectors 850c, the details of the build-up layers L1-L5, the bases 920a, the branches 920b and the pins 920c included in the heat dissipating element 920 are similar to or substantially identical to the details of the build-up layers L1-L5, the bases 910a, the branches 910b and the pins 910c included in the heat dissipating element 910, the details of the connecting portions 922 are similar to or substantially identical to the details of the connecting portions 912/812/822, and thus are not repeated herein. In some embodiments, the connecting portions 922 are considered as part of the heat dissipating element 900B.

The bases 920a, the branches 920b, the pins 920c and the connectors 920d of the heat dissipating element 920 are not integrally formed, for example. In the case, the heat dissipating element 920 may be formed, but not limited to, by integrally forming the bases 920a and the branches 920b of each build-up layer (e.g. L1-L5); and then, through the connectors 920d, connecting the build-up layers (e.g. one of L1-L5) to each other and connecting the pins 920c to the build-up layer L1. For example, the bases 920a, the branches 920b and the pins 920c are made of copper, copper alloy, or Ag-diamond, and the connectors 920d are solder joints. However, the disclosure is not limited thereto.

For example, as shown in FIG. 61, the heat dissipating element 900B extends from the semiconductor die 100 to the semiconductor 200, and does not overlap with the supporting structure 600. An illustrated top surface S920t of the heat dissipating element 920 may be higher than the illustrated top surface S600t of the supporting structure 600, as shown in FIG. 61. Alternatively, the illustrated top surface S920t of the heat dissipating element 920 may be lower than the illustrated top surface S600t of the supporting structure 600, or may be at a height-level where the illustrated top surface S600t of the supporting structure 600 located at.

Figure 62:
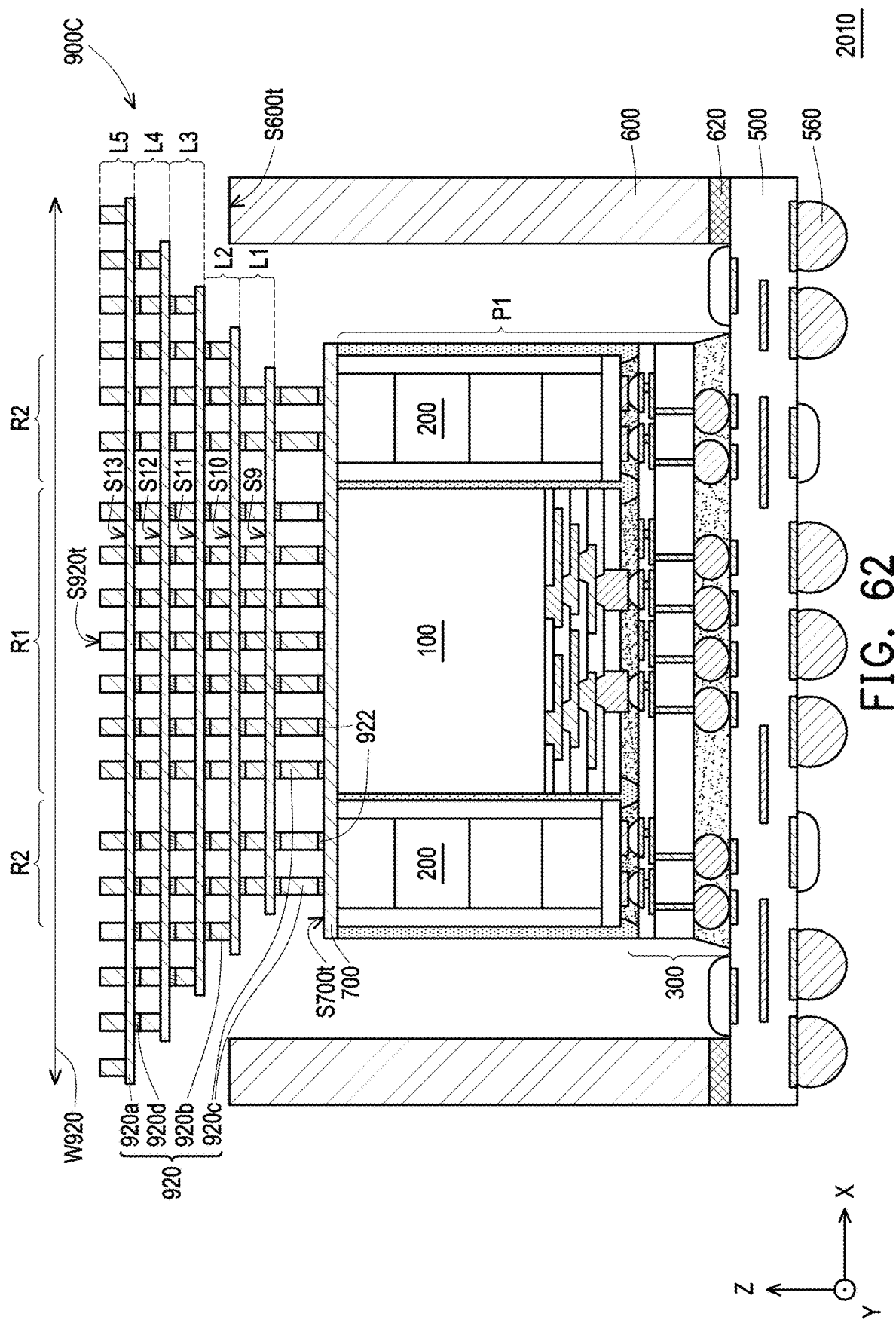

In some embodiments, a width W920 of the heat dissipating element 900B is constant along the direction Z, as shown in FIG. 61. However, the disclosure is not limited thereto. For example, as shown in FIG. 62, a semiconductor package module 2010 includes a heat dissipating element 900C, instead of the heat dissipating element 900B. In the case, the heat dissipating element 900C of FIG. 62 is similar to the heat dissipating element 900B of FIG. 61; the difference is that, a width W920 of the heat dissipating element 900C is increased in direction Z, from the build-up layer L1 towards to the build-up layer L5. For example, as shown in FIG. 62, the heat dissipating element 900C extends from the semiconductor die 100 to the semiconductor 200, and overlaps with the supporting structure 600.

Figure 63:
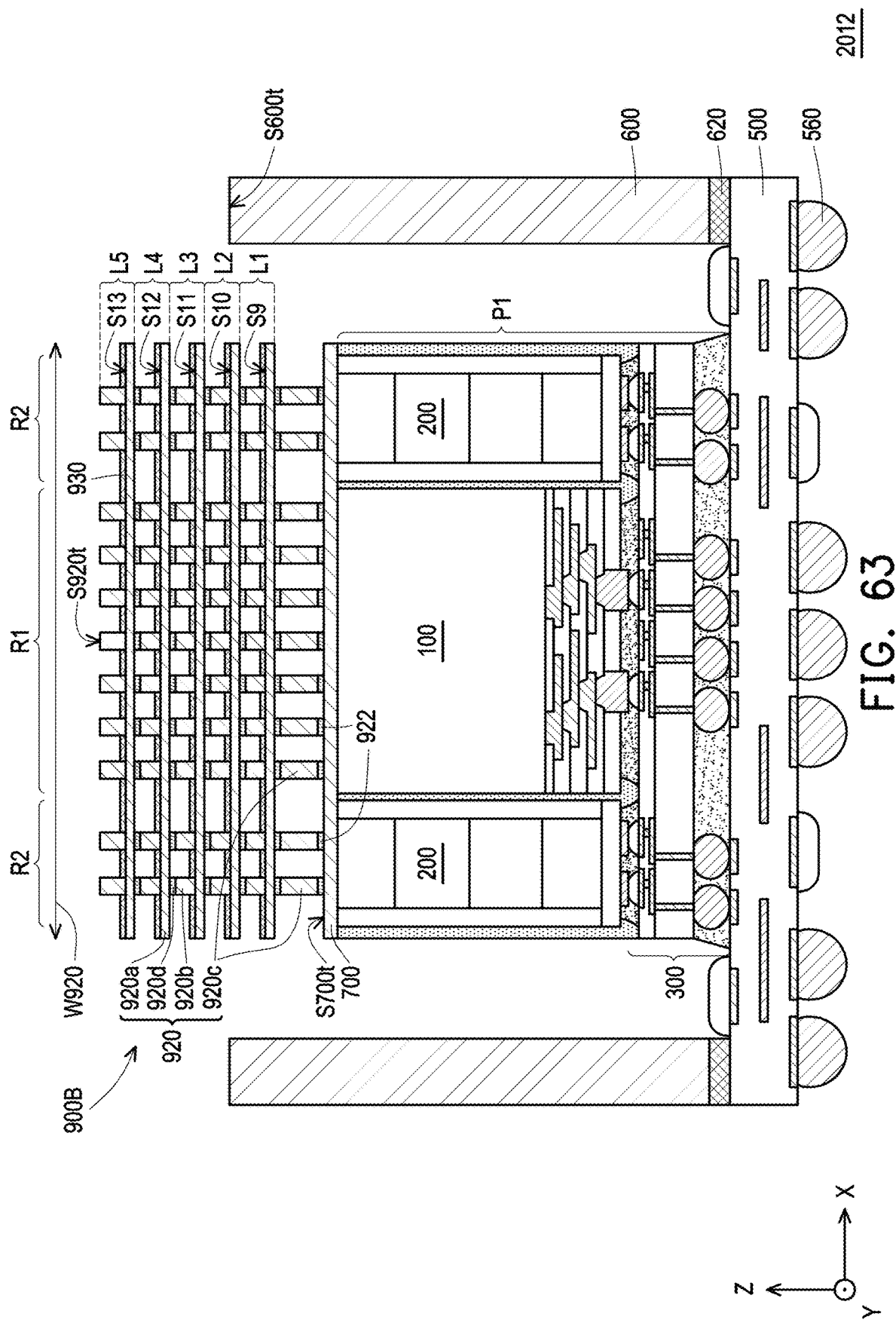

Alternatively, an additional coating layer (e.g., the coating layer 930, the coating layer 940, or both of the coating layers 930, 940) may be coated onto the heat dissipating element, partially or entirely. For example, a semiconductor package module 2012 of FIG. 63 is similar to the semiconductor package module 2008 of FIG. 61; the difference is that, the semiconductor package module 2012 further includes one or more coating layer(s) 930 disposed on surface(s) of the heat dissipating element 920. In some embodiments, as shown in FIG. 63, only the main sides (e.g. S9-S13) of the bases 920a of the heat dissipating element 920 are coated with the coating layers 930. Although not shown, in other embodiments, the surfaces (such as main sides (e.g. S9-S13), opposite sides to the main sides (e.g. S9-S13) of the bases 920a and/or their sidewalls connecting the main sides and the respective opposite sides) of the heat dissipating element 920, which are not in contact with the connecting portions 922 and are in contact with the dielectric coolant 54 (as shown in FIG. 2), are coated with the coating layers 930.

Figure 64:
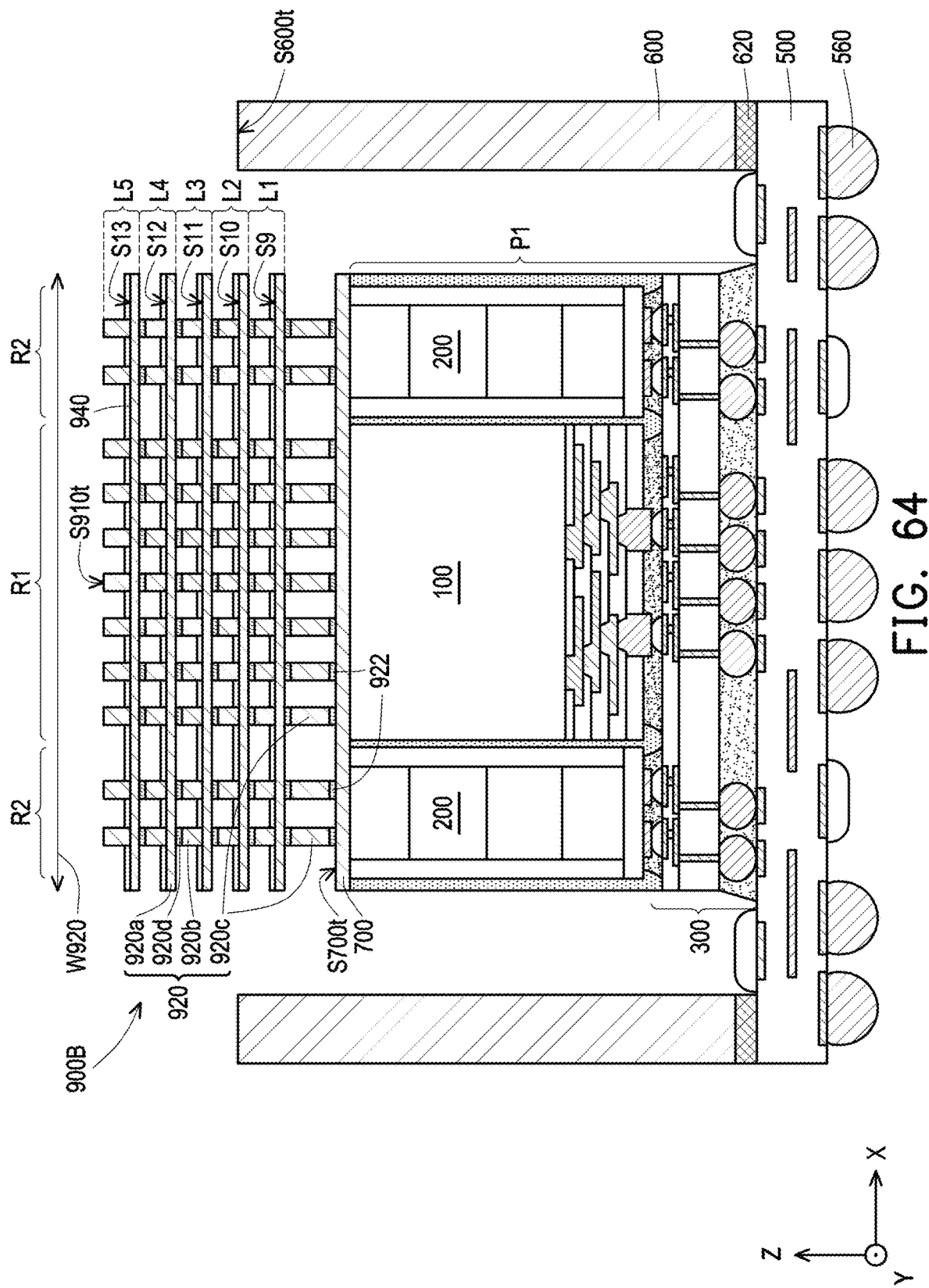

For another example, a semiconductor package module 2014 of FIG. 64 is similar to the semiconductor package module 2008 of FIG. 61; the difference is that, the semiconductor package module 2014 further includes one or more coating layer(s) 940 disposed on surface(s) of the heat dissipating element 920. In some embodiments, as shown in FIG. 64, only the main sides (e.g. S9-S13) of the bases 920a of the heat dissipating element 920 are coated with the coating layers 940. Although not shown, in other embodiments, the surfaces (such as main sides (e.g. S9-S13), opposite sides to the main sides (e.g. S9-S13) of the bases 920a and/or their sidewalls connecting the main sides and the respective opposite sides) of the heat dissipating element 920, which are not in contact with the connecting portions 922 and are in contact with the dielectric coolant 54 (as shown in FIG. 2), are coated with the coating layers 940.

Although not shown, the heat dissipating element 920, in part or all, may be independently coated with both of the coating layer 930 and the coating layer 940. In the case, the heat dissipating element 920 may be wrapped by the coating layer 930, and the coating layer 930 may be wrapped by the coating layer 940. In the above embodiments, the regions R1 and R2 share one heat dissipating element having the 3D structure. However, the disclosure is not limited thereto; alternatively, the regions R1 and R2 may adopted different heat dissipating elements each having the 3D structure, where these different heat dissipating elements may not be in direct contact with one another.

In the case, the semiconductor package modules 2000, 200, 2004, 2006, 2008, 2010, 2012, and 2014 are compatible with the current manufacturing process and are designed to be compatible with a two-phase immersion cooling apparatus (e.g., the immersion cooling apparatus 50 as shown in FIG. 2) or a single-phase immersion cooling apparatus (not shown). With such, the rising vapors described in FIG. 2 moves along the bubble path BP which passing through the spaces of the heat dissipating elements 910 and/or 920, where the heat generated from the semiconductor package P1 is then removed through the heat dissipating elements 910 and/or 920 (in a vertical direction) and the metallization layer 700 (in a horizontal direction), for example. Owing to the 3D structure, more heat dissipating area can be greatly provided. In addition, the bases 910a and 920a may be independently referred to as a horizontal portion of a heat dissipation element (e.g. 910, 920), and the branches 910b and 920b and the pins 910c and 920c may be independently referred to as a vertical portion of the heat dissipation element (e.g. 910, 920).

Figure 65:
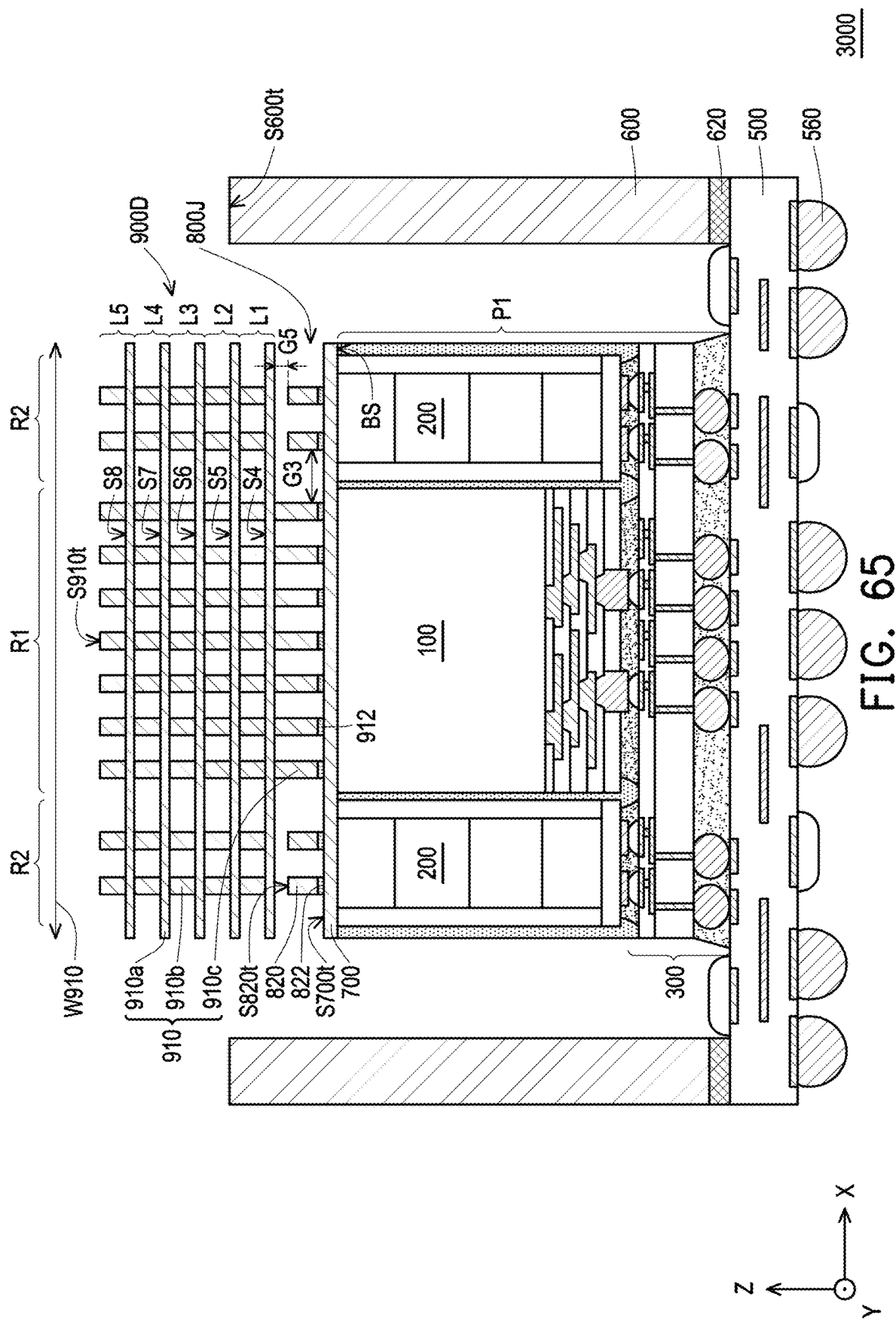
FIG. 65 is a schematic cross-sectional view illustrating a semiconductor package module in accordance with some embodiments of the disclosure.
Figure 66:
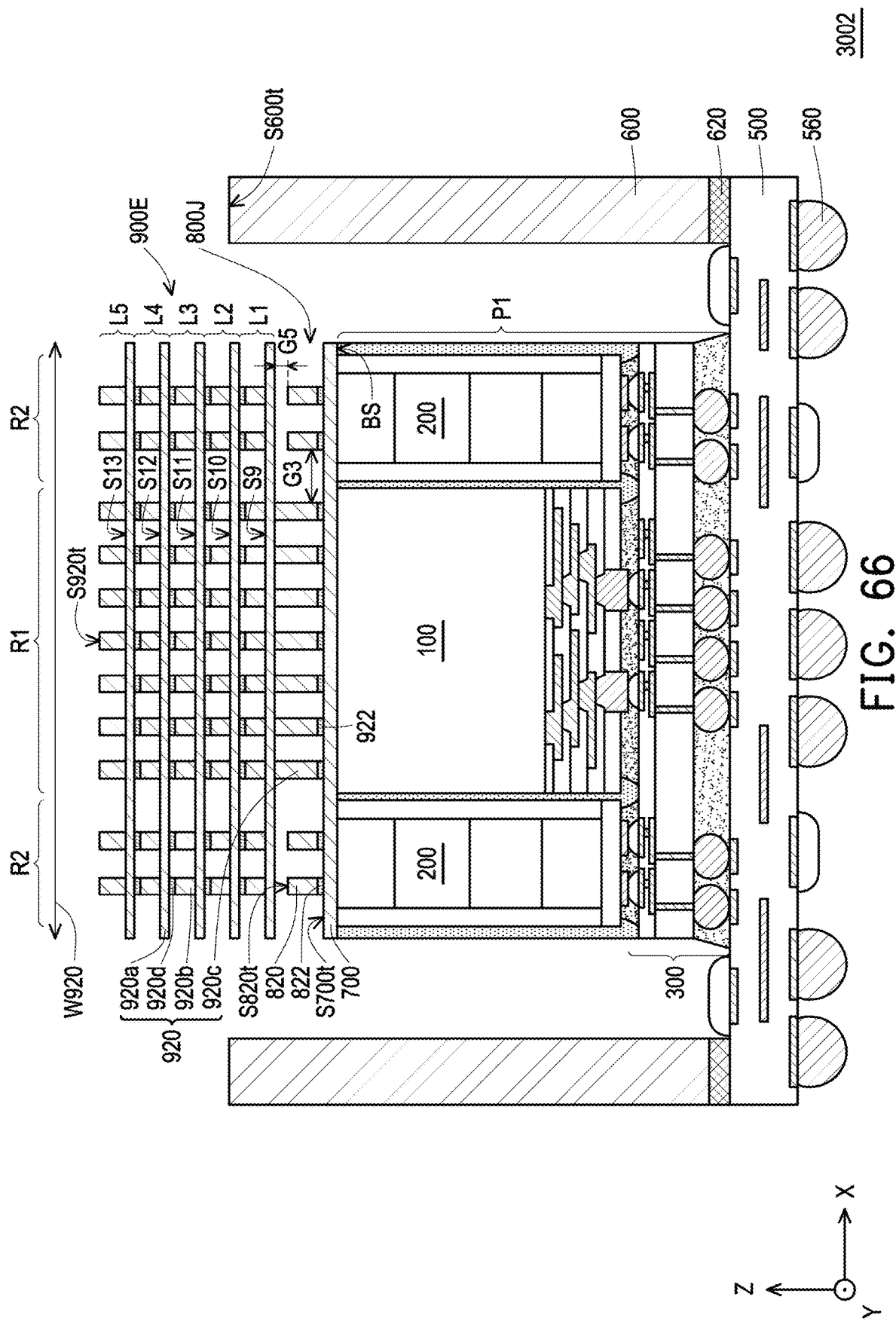
FIG. 66 is a schematic cross-sectional view illustrating a semiconductor package module in accordance with some alternative embodiments of the disclosure.

In alternative embodiments, a combination of one or more heat dissipating element(s) having the microstructure (e.g. 810, 820, 850A-850C, and/or their modifications) and one or more heat dissipating elements(s) having the 3D structure (e.g. 910, 920 and/or their modifications) may be adopted in one semiconductor package module, in the disclosure. FIG. 65 is a schematic cross-sectional view illustrating a semiconductor package module 3000 in accordance with some embodiments of the disclosure. FIG. 66 is a schematic cross-sectional view illustrating a semiconductor package module 3002 in accordance with some alternative embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 65, in some embodiments, the semiconductor package modules 3000 includes a semiconductor package P1, a circuit substrate 500, a supporting structure 600, a metallization layer 700, and heat dissipating elements 800J and 900D. For example, the semiconductor package P1 is bonded to and electrically connected to the circuit substrate 500, and the supporting structure 600 is bonded to and connected to the circuit substrate 500 through the adhesive 620. The semiconductor package P1 may be further thermally coupled to the circuit substrate 500. The supporting structure 600 may be thermally coupled to, electrically coupled to or thermally and electrically coupled to the circuit substrate 500. In the case, the semiconductor package P1 is further electrically isolated from the supporting structure 600. Owing to the supporting structure 600, the warpage control of the semiconductor package module 3000 is enhanced. In addition, the heat may further be transferred from the circuit substrate 500 to the supporting structure 600 for dissipating. In some embodiments, the metallization layer 700 is disposed on (e.g. in physical contact with) and thermally coupled to the semiconductor package P1. For example, the semiconductor package P1 is electrically isolated from the metallization layer 700. The details of the semiconductor package P1, the circuit substrate 500, the supporting structure 600, and the metallization layer 700 have been discussed in FIG. 3 through FIG. 7, and thus are not repeated herein for brevity. In the case, the circuit substrate 500 is mounted to and electrically coupled to the printed circuit board MB (as depicted in FIG. 1).

In some embodiments, the heat dissipating elements 800J and 900D are mounted to the metallization layer 700, where the metallization layer 700 is disposed between the heat dissipating element 800J and the semiconductor package P1 and between the heat dissipating element 900D and the semiconductor package P1. In some embodiments, the heat dissipating elements 800J and 900D are thermally coupled to and electrically isolated from the semiconductor package P1 through the metallization layer 700. Owing to the heat dissipating elements 800J and 900D, more heat dissipating area can be greatly provided, thus the heat dissipation of the semiconductor package module 3000 in the immersion cooling apparatus 50 is enhanced (without shorting). That is, owing to the heat dissipating elements 800J and 900D, a better thermal control for each semiconductor package module 3000 is achieved, such that the performance of the semiconductor package P1 included in each semiconductor package module 3000 is improved, thereby ensuring the reliability of the semiconductor package module 3000.

As shown in FIG. 65, the heat dissipating element 800J includes a plurality of heat dissipating elements 820, where the heat dissipating elements 820 are bonded to and thermally coupled to the metallization layer 700 over the regions R2 through connecting portions 822, for example. In the case, the heat dissipating element 900D includes a heat dissipating element 910, where the heat dissipating elements 910 are bonded to and thermally coupled to the metallization layer 700 over the region 1 R1 through connecting portions 912. The details of the heat dissipating elements 820 and the connecting portions 822 have been previously described in FIG. 3 through FIG. 49, and the details of the heat dissipating elements 910 and the connecting portions 912 have been previously described in FIG. 50 through FIG. 60, and thus are not repeated herein for brevity. In some embodiments, the connecting portions 822 are considered as part of the heat dissipating element 800J, and the connecting portions 912 are considered as part of the heat dissipating element 900D.

In some embodiments, in a vertical projection on the base side BS of the semiconductor package P1 along the direction Z, a spacing G3 between two adjacent heat dissipating elements 820 and 910 is ranging from about 50 µm to about 5 mm. As shown in FIG. 65, the heat dissipating element 910 may be laterally extended over the heat dissipating elements 820. For example, in the vertical projection along the direction Z the heat dissipating element 910 is overlapped with the heat dissipating elements 820. In the case, in the direction Z, the heat dissipating element 910 is spacing apart from the heat dissipating elements 820 with a distance G5 ranging from about 0.5 mm to about 10 mm. Alternatively, one or more coating layer(s), such as the coating layers 830 and/or 840, may be disposed on the heat dissipating elements 820. Alternatively, one or more coating layer(s), such as the coating layers 930 and/or 940, may be disposed on the heat dissipating elements 910.

However, the disclosure is not limited thereto. For the heat dissipating element 800J, the heat dissipating elements 820 may adopt the modifications described in FIG. 9 through FIG. 49 with or without in conjunction with FIG. 8A through FIG. 8D. The heat dissipating element 900D (including the heat dissipating element 910) may be substituted by a heat dissipating element 900E (including a heat dissipating element 920), see a semiconductor package module 3002 depicted in FIG. 66. The details of the heat dissipating element 920 have been described in FIG. 61, and thus are not repeated herein. In the case, the semiconductor package modules 3000 and 3002 are compatible with the current manufacturing process and are designed to be compatible with a two-phase immersion cooling apparatus (e.g., the immersion cooling apparatus 50 as shown in FIG. 2) or a single-phase immersion cooling apparatus (not shown). Although not shown, the region R1 may adopt a heat dissipating element having the microstructure (e.g., 810, 850A-850C, and/or its modifications) while the regions R2 may independently adopt a heat dissipating element having the 3D structures (e.g. 910, 920, and/or their modification).

The heat dissipating elements 800, 800A, 800B, 800C, 800D, 800E, 800F, 800G, 800H, 800I, 800J, 900, 900A, 900B, 900C, 900D, and 900E may independently referred to a heat dissipating module, in the disclosure. In the case, the heat dissipating elements 810, 820, 850A-850C and their modifications (e.g. 810A-810D, 810'-810D', 820A-820D, 820'-820D', etc.) are referred to as heat dissipating elements each having a microstructure. On the other hand, the heat dissipating elements 910, 920 and their modifications are referred to as heat dissipating elements each having a 3D structure. In some embodiments, the connecting portions 812, 822, and/or 852 are considered as part of one of the heat dissipating elements 800, 800A, 800B, 800C, 800D, 800E, 800F, 800G, 800H, 800I, 800J, and the connecting portions 912 and/or 922 are considered as part of one of the heat dissipating element 900, 900A, 900B, 900C, 900D, and 900E.

In accordance with some embodiments, a semiconductor package module includes a package, a conductive layer, and a heat dissipating module. The package includes a semiconductor die. The conductive layer is disposed over the package. The heat dissipating module is disposed over the conductive layer, and the package and the heat dissipating module prop against two opposite sides of the conductive layer, where the heat dissipating module is thermally coupled to and electrically isolated from the package through the conductive layer.

In accordance with some embodiments, a semiconductor package module includes a circuit substrate, a package, a supporting structure, a metallization layer, a heat dissipating module, and a plurality of conductive terminals. The circuit substrate has a first side and a second side opposing to the first side. The package is disposed over the first side and electrically coupled to the circuit substrate, where the package includes a first region disposed with a first semiconductor die and a second region disposed with a second semiconductor die and next to the first region. The supporting structure is disposed over the first side and surrounds the package. The metallization layer is disposed over the package and covers the first region and the second region, and the package is disposed between the circuit substrate and the metallization layer. The heat dissipating module is disposed over the metallization layer, and the package and the heat dissipating module prop against two opposite sides of the metallization layer, where the heat dissipating module is thermally coupled to and electrically isolated from the package through the metallization layer. The plurality of conductive terminals are disposed over the second side and electrically coupled to the circuit substrate.

In accordance with some embodiments, a method of manufacturing a semiconductor package module includes the following steps: providing a package comprising a semiconductor die; disposing a conductive layer over the package; and disposing a heat dissipating module over the conductive layer, the package and the heat dissipating module propping against two opposite sides of the conductive layer, wherein the heat dissipating module is thermally coupled to and electrically isolated from the package through the conductive layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor package module, comprising:
   a package, comprising a semiconductor die;
   a conductive layer, disposed over the package; and
   a heat dissipating module, disposed over the conductive layer, the package and the heat dissipating module propping against two opposite sides of the conductive layer, wherein the heat dissipating module is thermally coupled to and electrically isolated from the package through the conductive layer.

2. The semiconductor package module of claim 1, wherein a sidewall of the conductive layer is aligned with a sidewall of the package, a first side of the conductive layer is in contact with the package, and a second side of the conductive layer is in contact with the heat dissipating module, wherein the sidewall connects the first side and the second side along a stacking direction of the package and the conductive layer,
   wherein the conductive layer is in direct contact with the semiconductor die.

3. The semiconductor package module of claim 1, wherein the heat dissipating module comprises:
a heat dissipating element; and
a connecting portion, wherein the connecting portion connects and thermally couples the heat dissipating element and the conductive layer.

4. The semiconductor package module of claim 3, wherein the heat dissipating element comprises a microstructure of a column form extending in a stacking direction of the package and the conductive layer,
wherein in a plane perpendicular to the stacking direction, a shape of a cross-section of the microstructure includes a circle or ellipse-like shape, a planar or curved wall-like shape, a semi-annulus-like shape, a fin-like shape, or combinations thereof.

5. The semiconductor package module of claim 3, wherein the heat dissipating element comprises:
a base, extending along a plane perpendicular to a stacking direction of the package and the conductive layer; and
a plurality of branches, extending in the stacking direction and disposed over a side of the base facing away from the package,
wherein the connecting portion connects the base and the conductive layer.

6. The semiconductor package module of claim 5, wherein the plurality of branches are spacing apart from one another and independently comprise a plurality of separated openings penetrating therethrough, and the plurality of separated openings extend along the plane.

7. The semiconductor package module of claim 3, wherein the heat dissipating element comprises:
at least one horizontal portion, extending along a plane perpendicular to a stacking direction of the package and the conductive layer;
a plurality of first vertical portions, extending in the stacking direction and disposed over a third side of the at least one horizontal portion facing away from the package; and
a plurality of second vertical portions, extending in the stacking direction and disposed over fourth side of the at least one horizontal portion facing to the package, wherein the third side is opposite to the fourth side along the stacking direction,
wherein the connecting portion connects the second vertical portions and the conductive layer.

8. The semiconductor package module of claim 7, wherein the at least one horizontal portion comprises a solid plate or a plate with openings penetrating therethrough.

9. The semiconductor package module of claim 1, further comprising:
a circuit substrate, bonded to and electrically coupled to the package;
a supporting structure, bonded to the circuit substrate and surrounding the package and the conductive layer; and
a plurality of conductive connectors, disposed over and electrically coupled to the circuit substrate, the circuit substrate being disposed between the package and the plurality of conductive connectors,
wherein the conductive layer is electrically isolated with the semiconductor die.

10. The semiconductor package module of claim 1, further comprising:
a coating layer, disposed over the heat dissipating module, wherein the coating layer comprise a wicking structure or a surface treatment layer.

11. An electronic apparatus, comprising:
an electronic system, comprising:
a printed circuit board; and
a plurality of a semiconductor package module of claim 1, attached to and electrically coupled to the printed circuit board; and
a tank, accommodating the electronic system and filled with a dielectric coolant, wherein the electronic system is submerged in a bath of the dielectric coolant.

12. The electronic apparatus of claim 11, further comprising a condenser lying over the bath of the dielectric coolant.

13. A semiconductor package module, comprising:
a circuit substrate, having a first side and a second side opposing to the first side;
a package, disposed over the first side and electrically coupled to the circuit substrate, wherein the package comprises a first region disposed with a first semiconductor die and a second region disposed with a second semiconductor die and next to the first region;
a supporting structure, disposed over the first side and surrounding the package;
a metallization layer, disposed over the package and covering the first region and the second region, the package being disposed between the circuit substrate and the metallization layer;
a heat dissipating module, disposed over the metallization layer, the package and the heat dissipating module propping against two opposite sides of the metallization layer, wherein the heat dissipating module is thermally coupled to and electrically isolated from the package through the metallization layer; and
a plurality of conductive terminals, disposed over the second side and electrically coupled to the circuit substrate.

14. The semiconductor package module of claim 13, wherein the heat dissipating module comprises a first plurality of microstructures arranged into a first array over the first region and a second plurality of microstructures arranged into a second array over the second region,
wherein the metallization layer is a single layer or a composite layer having a plurality of sub-layers formed of different materials made of metal or metal alloy.

15. The semiconductor package module of claim 14, wherein:
a thermal conductivity of an entire of the first plurality of microstructures is different from a thermal conductivity of an entire of the second plurality of microstructures.

16. The semiconductor package module of claim 14, wherein:
a thermal conductivity of at least one microstructure of the first plurality of microstructures is different from that of other microstructure of the first plurality of microstructures, and/or
a thermal conductivity of at least one microstructure of the second plurality of microstructures is different from that of other microstructure of the second plurality of microstructures.

17. The semiconductor package module of claim 13, wherein the heat dissipating module comprises a 3D structure having pores formed therein, the 3D structure spanning across the first region and the second region.

18. The semiconductor package module of claim 13, further comprising:
a coating layer, disposed over the heat dissipating module, wherein the coating layer comprise a wicking structure or a surface treatment layer.

19. An electronic apparatus, comprising:
   an electronic system, comprising:
      a printed circuit board; and
      a plurality of a semiconductor package module of claim 13, attached to and electrically coupled to the printed circuit board; and
   a tank, accommodating the electronic system and filled with a dielectric coolant, wherein the electronic system is submerged in a bath of the dielectric coolant.

20. The electronic apparatus of claim 19, further comprising a condenser lying over the bath of the dielectric coolant.

* * * * *